(12) United States Patent
Kobayashi

(10) Patent No.: US 8,553,511 B2
(45) Date of Patent: Oct. 8, 2013

(54) DISK RECORDING MEDIUM, DISK PRODUCTION METHOD, DISK DRIVE APPARATUS

(75) Inventor: Shoei Kobayashi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 12/652,525

(22) Filed: Jan. 5, 2010

(65) Prior Publication Data

US 2010/0103790 A1 Apr. 29, 2010

Related U.S. Application Data

(63) Continuation of application No. 11/627,184, filed on Jan. 25, 2007, now Pat. No. 7,668,062, which is a continuation of application No. 10/486,283, filed as application No. PCT/JP03/07410 on Jun. 11, 2003, now Pat. No. 7,190,655.

(30) Foreign Application Priority Data

Jun. 11, 2002 (JP) ................................. 2002-170265

(51) Int. Cl.
*G11B 20/18* (2006.01)
(52) U.S. Cl.
USPC ...................................................... 369/53.35
(58) Field of Classification Search
None
See application file for complete search history.

(56) References Cited

U.S. PATENT DOCUMENTS

| | | | |
|---|---|---|---|
| 5,400,186 A | 3/1995 | Inoue | |
| 5,881,070 A | 3/1999 | Hoshi | |
| 6,097,695 A | 8/2000 | Kobayashi | |
| 6,243,330 B1 | 6/2001 | Oshima | |
| 6,434,091 B1 | 8/2002 | Kuribayashi | |
| 6,493,302 B2 * | 12/2002 | Takahashi | 369/53.15 |
| 6,519,732 B1 * | 2/2003 | Li | 714/755 |
| 6,594,215 B2 * | 7/2003 | Moriwaki | 369/53.35 |
| 6,603,729 B1 | 8/2003 | Van Den Enden | |
| 6,898,171 B1 | 5/2005 | Sugaya et al. | |

(Continued)

FOREIGN PATENT DOCUMENTS

| EP | 1 156 481 A2 | 11/2001 |
|---|---|---|
| EP | 1 156 481 A3 | 11/2001 |

(Continued)

OTHER PUBLICATIONS

Kees Schep, et al., "Format Description and Evaluation of the 22.5 GB Digital-Video-Recording Disc", Japanese Journal of Applied Physics, Society of Applied Physics, vol. 40, No. 3B, Part 1, XP 001038396, Sep. 5, 2000. pp. 1813-1816.

*Primary Examiner* — Joseph Feild
*Assistant Examiner* — Parul Gupta
(74) *Attorney, Agent, or Firm* — Oblon, Spivak, McClelland, Maier & Neustadt, L.L.P.

(57) ABSTRACT

A disk recording medium which can implement a recording method having a high degree of reliability for additional information is disclosed. The disk recording medium has a recording and reproduction region into and from which first data can be recorded and reproduced in accordance with a rewritable or write-once-read-many recording method and from which second data recorded in the form of wobbling of a groove can be reproduced. The second data includes address information and additional information. The additional information of the second data is coded in accordance with a first error correction method, and the coded additional information and the address information are recorded in a state coded in accordance with a second error correction method.

6 Claims, 38 Drawing Sheets

(56) References Cited

U.S. PATENT DOCUMENTS

| | | |
|---|---|---|
| 6,980,498 B2 | 12/2005 | Sako |
| 6,999,391 B2 | 2/2006 | Heemskerk et al. |
| 7,123,557 B2 | 10/2006 | Heemskerk et al. |
| 7,151,727 B2 | 12/2006 | Iimura et al. |
| 7,190,655 B2 | 3/2007 | Kobayashi |
| 7,274,635 B2 | 9/2007 | Kobayashi et al. |
| 7,403,461 B2 | 7/2008 | Kobayashi |
| 2001/0033658 A1 | 10/2001 | Yoshida et al. |
| 2003/0103429 A1 | 6/2003 | Senshu |

FOREIGN PATENT DOCUMENTS

| | | |
|---|---|---|
| EP | 1 304 698 A2 | 4/2003 |
| EP | 1 304 698 A3 | 4/2003 |
| EP | 1 435 607 A1 | 7/2004 |
| JP | 2-33772 | 2/1990 |
| JP | 5-290383 | 11/1993 |
| JP | 7-93913 | 4/1995 |
| JP | 2001-307424 | 11/2001 |
| WO | WO 00/45381 | 8/2000 |
| WO | WO 02/21518 A1 | 3/2002 |

* cited by examiner

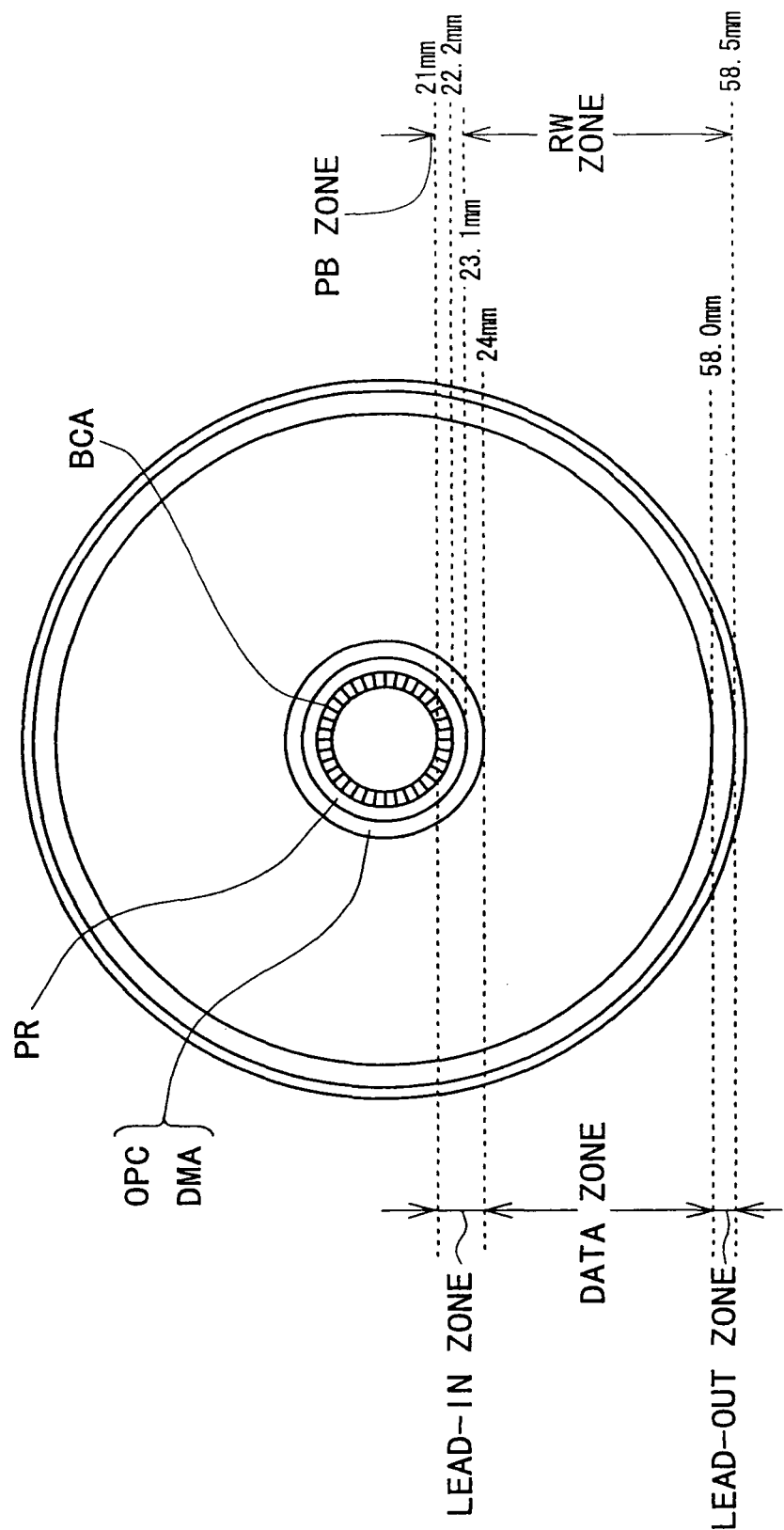

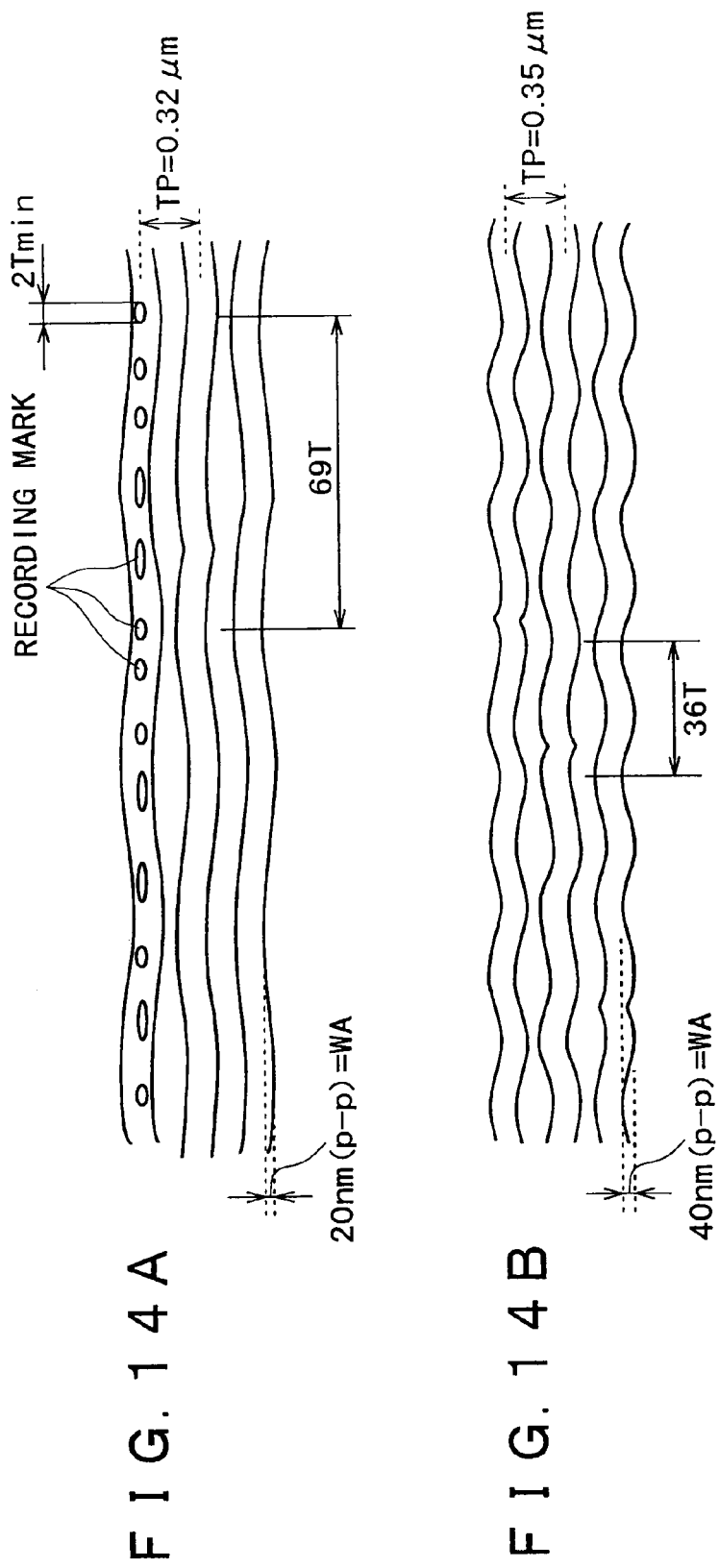

F I G. 18 A
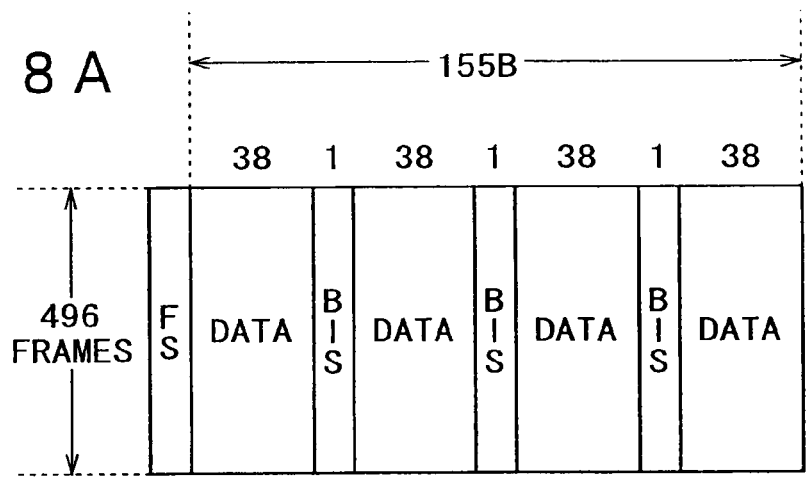
F I G. 18 B
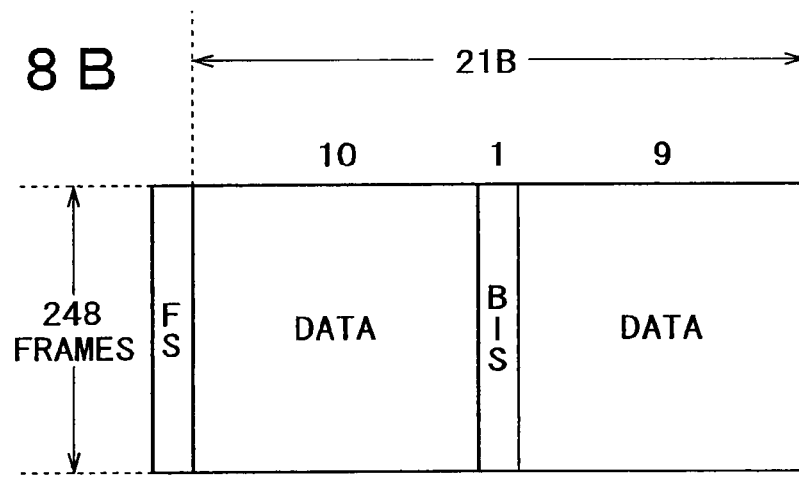

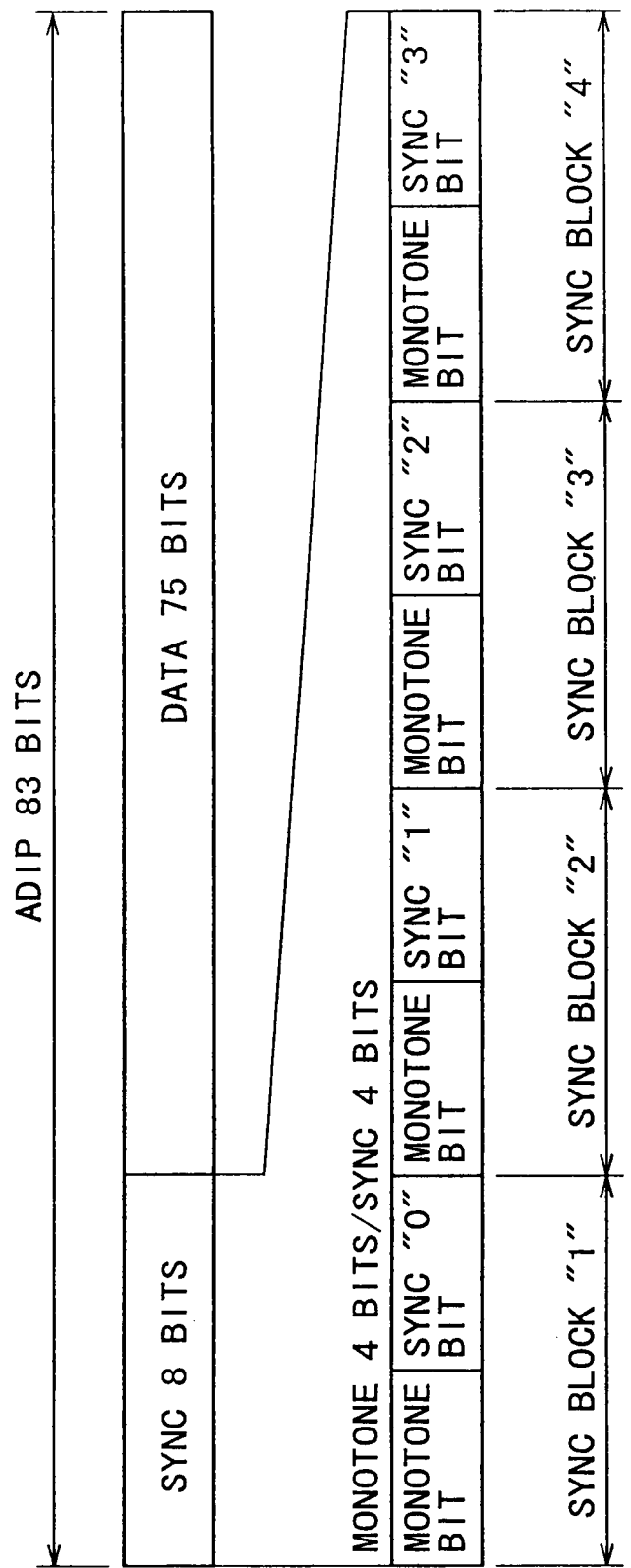

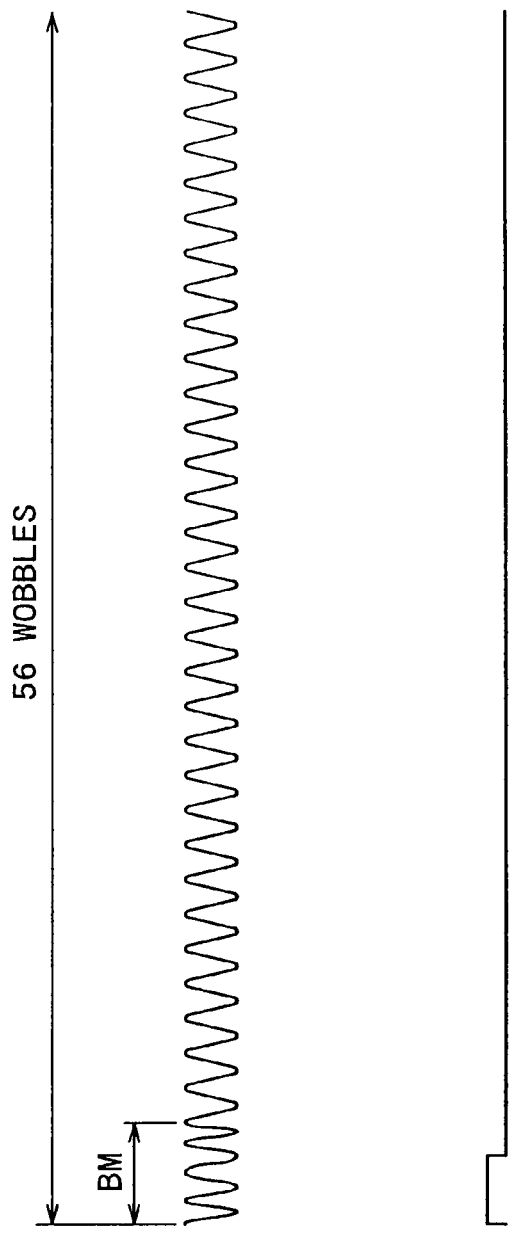

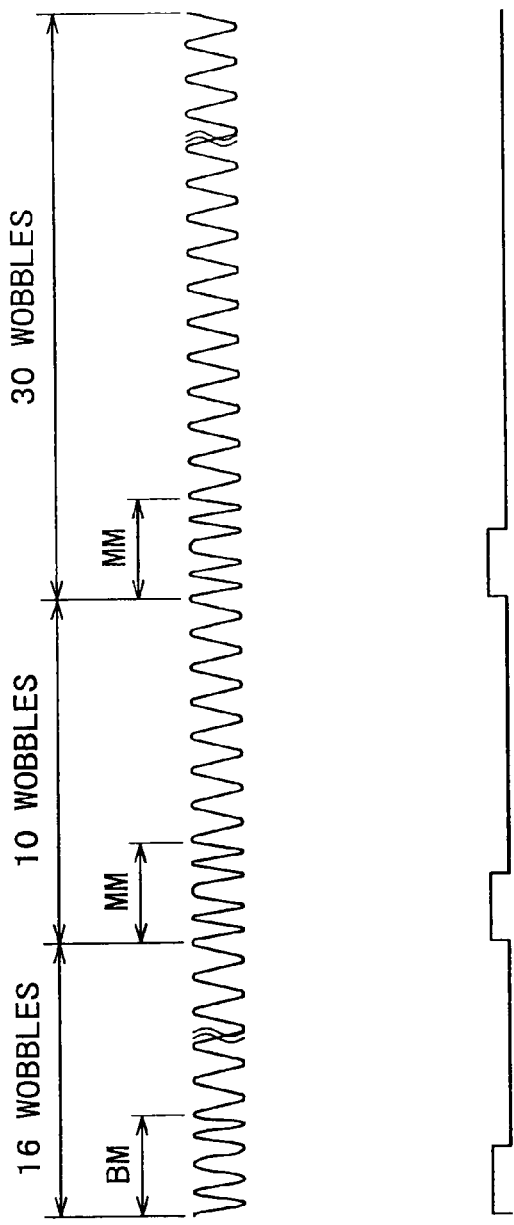

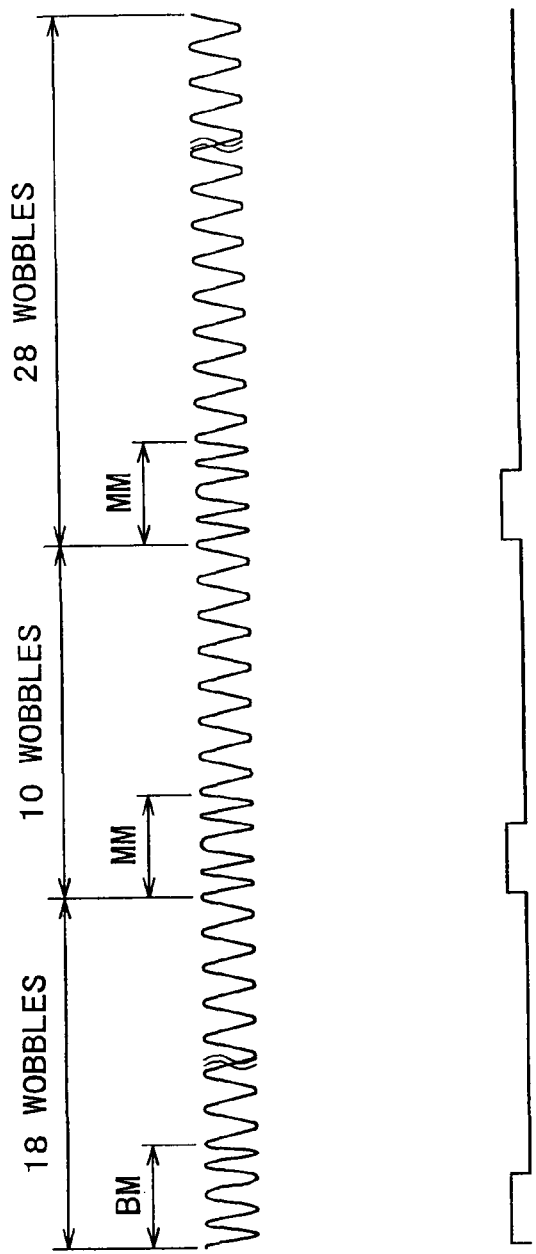

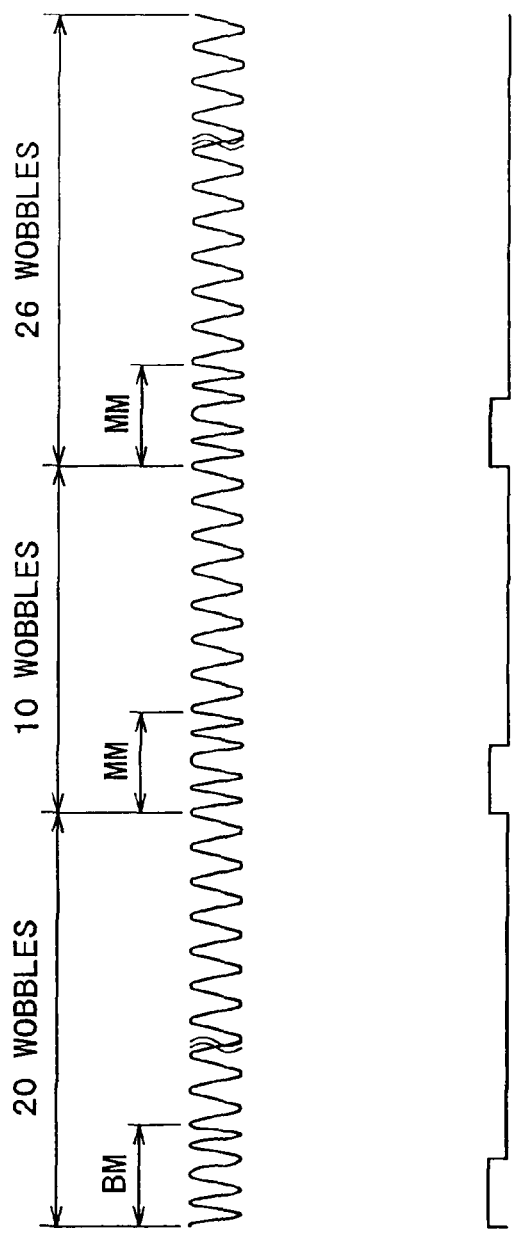

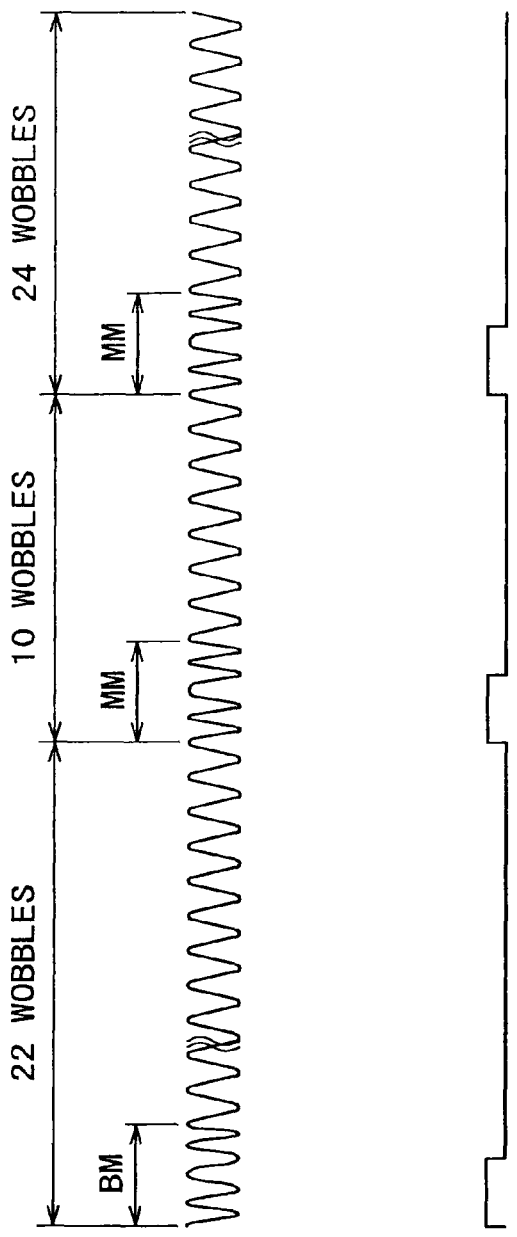

| | Bits |
|---|---|
| LAYER | 3 BITS |
| RUB | 19 BITS |
| ADDRESS NUMBER/RUB | 2 BITS |
| Aux DATA | 12 BITS |
| PARITY | 24 BITS |
| TOTAL | 60 BITS |

TOTALING 15 NIBBLES

| | | | | |
|---|---|---|---|---|
| NIBBLE 0 | LAYER NO. BIT 2 | LAYER NO. BIT 1 | LAYER NO. BIT 0 | |
| NIBBLE 1 | RUB NO. BIT 17 | RUB NO. BIT 16 | RUB NO. BIT 15 | RUB NO. BIT 14 |
| NIBBLE 2 | RUB NO. BIT 13 | RUB NO. BIT 12 | RUB NO. BIT 11 | RUB NO. BIT 10 |
| NIBBLE 3 | RUB NO. BIT 9 | RUB NO. BIT 8 | RUB NO. BIT 7 | RUB NO. BIT 6 |
| NIBBLE 4 | RUB NO. BIT 5 | RUB NO. BIT 4 | RUB NO. BIT 3 | RUB NO. BIT 2 |
| NIBBLE 5 | RUB NO. BIT 1 | RUB NO. BIT 0 | ADDRESS NO. BIT 1 | ADDRESS NO. BIT 0 |
| NIBBLE 6 | RESERVE BIT 11 | RESERVE BIT 10 | RESERVE BIT 9 | RESERVE BIT 8 |
| NIBBLE 7 | RESERVE BIT 7 | RESERVE BIT 6 | RESERVE BIT 5 | RESERVE BIT 4 |
| NIBBLE 8 | RESERVE BIT 3 | RESERVE BIT 2 | RESERVE BIT 1 | RESERVE BIT 0 |
| NIBBLE 9 | PARITY BIT 23 | PARITY BIT 22 | PARITY BIT 21 | PARITY BIT 20 |
| NIBBLE 10 | PARITY BIT 19 | PARITY BIT 18 | PARITY BIT 17 | PARITY BIT 16 |
| NIBBLE 11 | PARITY BIT 15 | PARITY BIT 14 | PARITY BIT 13 | PARITY BIT 12 |
| NIBBLE 12 | PARITY BIT 11 | PARITY BIT 10 | PARITY BIT 9 | PARITY BIT 8 |
| NIBBLE 13 | PARITY BIT 7 | PARITY BIT 6 | PARITY BIT 5 | PARITY BIT 4 |
| NIBBLE 14 | PARITY BIT 3 | PARITY BIT 2 | PARITY BIT 1 | PARITY BIT 0 |

DATA 9 NIBBLES (NIBBLE 0–8)
PARITY 6 NIBBLES (NIBBLE 9–14)

ADIP ADDRESS 6 NIBBLES
Aux DATA 3 NIBBLES
ID-RS ECC 6 NIBBLES

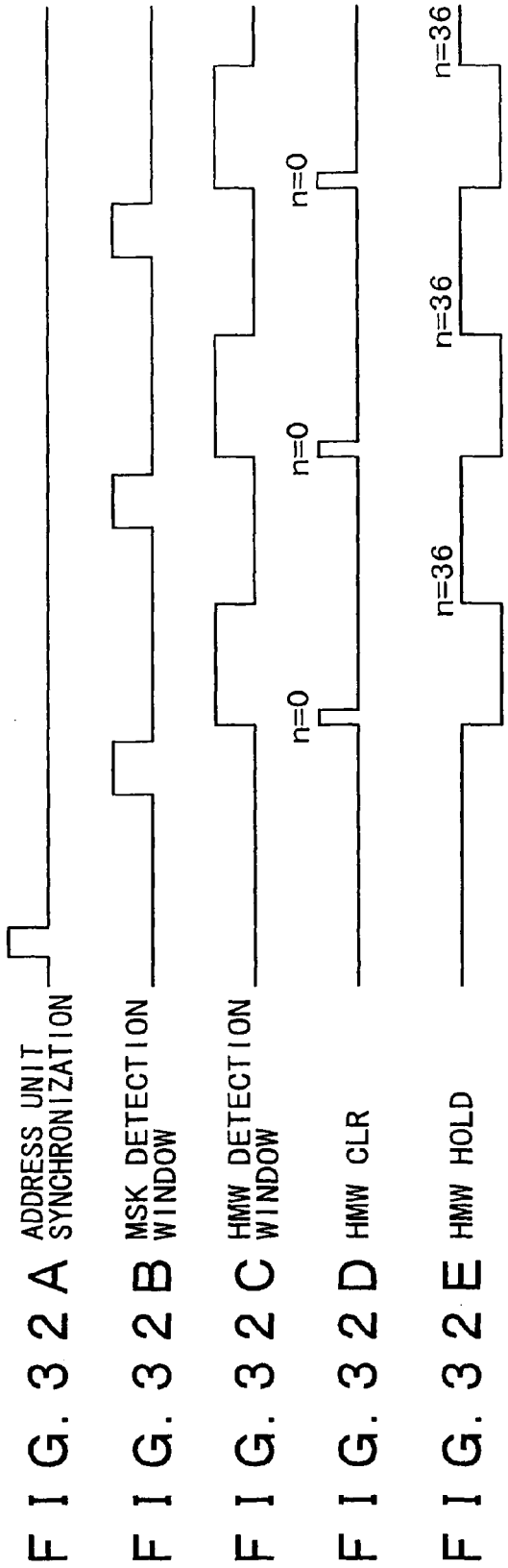

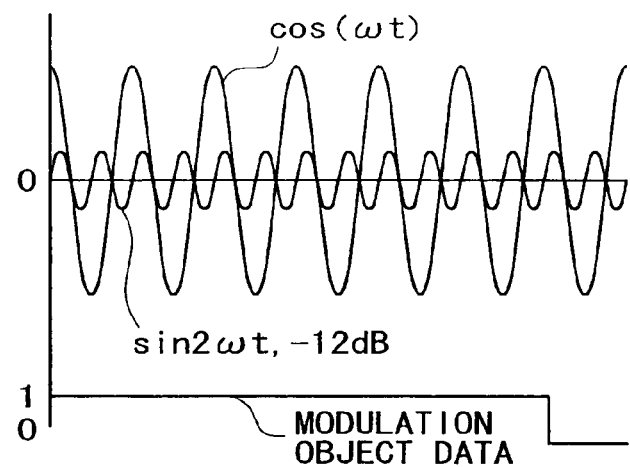
F I G. 3 3 A
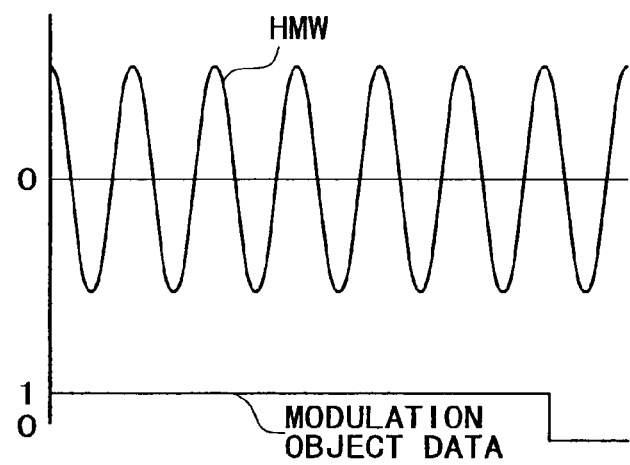
F I G. 3 3 B
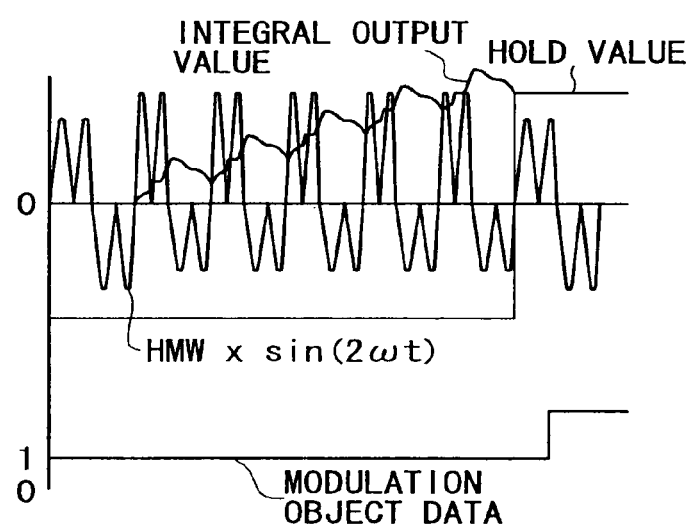
F I G. 3 3 C

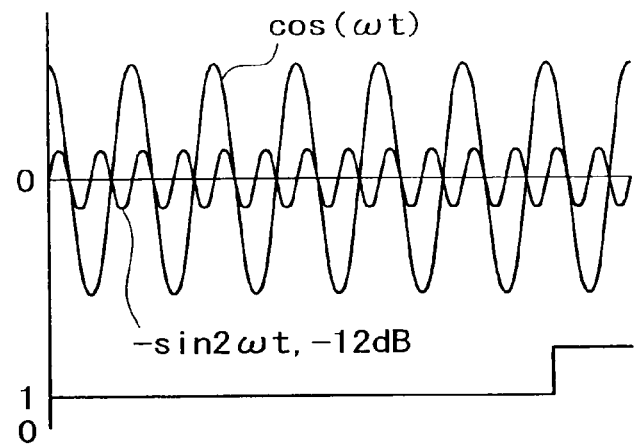
F I G. 3 4 A
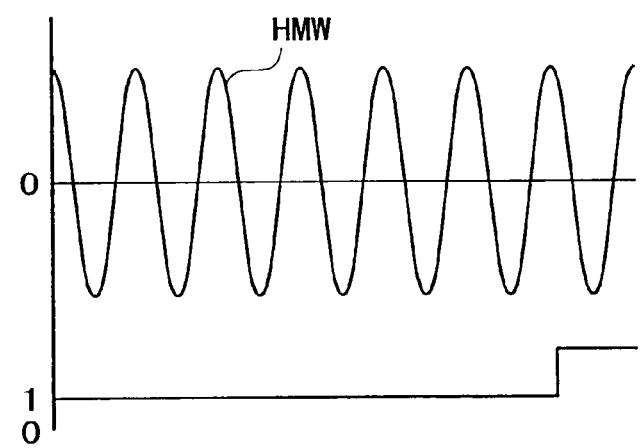
F I G. 3 4 B
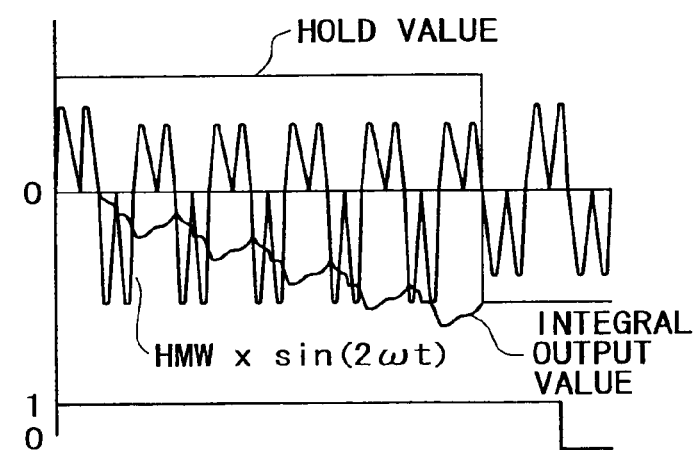
F I G. 3 4 C

FIG. 35

| BYTE NUMBER | CONTENTS | NUMBER OF BYTES |
|---|---|---|
| 0-1 | IDENTIFIER OF DISK INFORMATION = "DI" | 2 |
| 2 | DI FORMAT | 1 |
| 3 | RESERVED | 1 |
| 4 | FRAME NUMBER IN DISK INFORMATION BLOCK | 1 |
| 5 | FRAME NUMBER IN DISK INFORMATION BLOCK | 1 |
| 6 | BYTE NUMBER USED BY PERTAINING FRAME OF DISK INFORMATION BLOCK | 1 |
| 7 | RESERVED | 1 |
| 8-10 | CODE REPRESENTATIVE OF DISK TYPE | 3 |
| 11 | DISK/SIZE FORMAT VERSION | 1 |
| 12 | DISK STRUCTURE | 1 |
| 13 | CHANNEL DENSITY | 1 |
| 14-15 | RESERVED | 2 |
| 16 | PRESENCE/ABSENCE OF BCA | 1 |
| 17 | MAXIMUM TRANSFER RATE OF APPLICATION | 1 |
| 18-23 | RESERVED | 6 |
| 24-31 | LAST ADDRESS OF USER DATA AREA | 8 |
| 32-35 | RECORDING SPEED | 4 |
| 36-39 | MAXIMUM DC REPRODUCTION POWER | 4 |
| 40-43 | MAXIMUM REPRODUCTION POWER IN CASE OF HIGH FREQUENCY MODULATION | 4 |
| 44-47 | RESERVED | 4 |
| 48-55 | RECORDING POWER AT RECORDING SPEED IN nominal RECORDING | 8 |
| 56-63 | RECORDING POWER AT MAXIMUM RECORDING SPEED | 8 |
| 64-71 | RECORDING POWER AT MINIMUM RECORDING SPEED | 8 |
| 72 | RECORDING MULTI-PULSE WIDTH | 1 |
| 73-75 | FIRST RECORDING PULSE WIDTH | 3 |
| 76-78 | FIRST RECORDING PULSE POSITION AT nominal RECORDING SPEED (for 2T, 3T&>4T) | 3 |
| 79-81 | FIRST RECORDING PULSE POSITION AT MAXIMUM RECORDING SPEED (for 2T, 3T&>4T) | 3 |
| 82-84 | FIRST RECORDING PULSE POSITION AT MINIMUM RECORDING SPEED (for 2T, 3T&>4T) | 3 |
| 85-87 | RESERVED | 3 |
| 88 | ERASE MULTI-PLUSE WIDTH | 1 |
| 89-91 | FIRST ERASE PULSE POSITION AT nominal RECORDING SPEED (for 2T, 3T&>4T) | 3 |
| 92-94 | FIRST ERASE PULSE POSITION AT MAXIMUM RECORDING SPEED (for 2T, 3T&>4T) | 3 |
| 95-97 | FIRST ERASE PULSE POSITION AT MINIMUM RECORDING SPEED (for 2T, 3T&>4T) | 3 |
| 98 | FLAG BIT REPRESENTATIVE OF POLARITY OF ERASE PULSE | 1 |
| 99-111 | RESERVED | 13 |

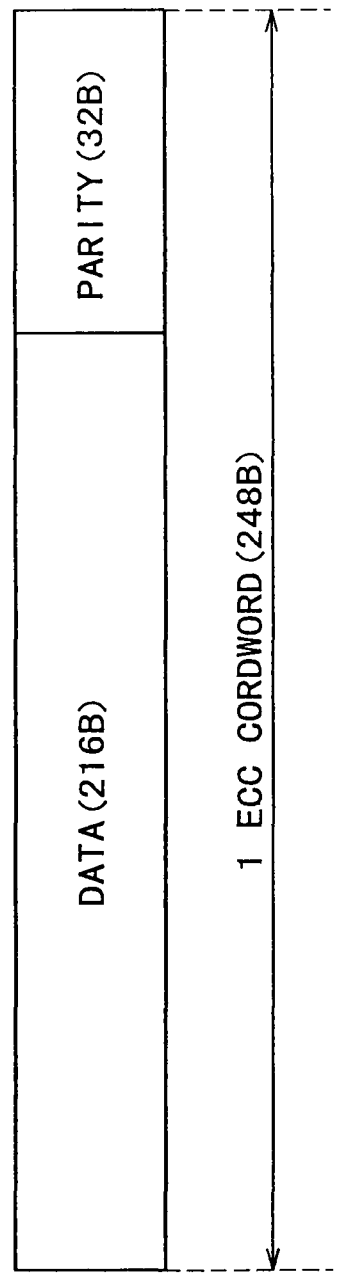
F I G. 3 6

DISK RECORDING MEDIUM, DISK PRODUCTION METHOD, DISK DRIVE APPARATUS

CROSS-REFERENCE TO RELATED APPLICATIONS

The present patent document is a continuation of U.S. application Ser. No. 11/627,184 filed Jan. 25, 2007, which is a continuation of U.S. application Ser. No. 10/486,283 filed on Feb. 9, 2004, and in turn claims priority to JP 2002-170265 filed on Jun. 11, 2002, the entire contents of each of which are hereby incorporated herein by reference.

TECHNICAL FIELD

The present invention relates to a disk recording medium such as an optical disk and a disk production method for producing the disk recording medium as well as a disk drive apparatus for the disk recording medium.

BACKGROUND ART

As a technique for recording and reproducing digital data, a data recording technique is available which uses an optical disk (including a magneto-optical disk) such as, for example, a CD (Compact Disc), an MD (Mini-Disc) and a DVD (Digital Versatile Disc) as a recording medium. The optical disk is a general term for recording media of the type wherein laser light is illuminated upon a disk formed from a thin metal plate protected with plastic and a signal is read from a change in reflected light from the disk.

Optical disks are divided into those of the type which can be used only for reproduction as known as, for example, a CD, a CD-ROM and a DVD-ROM and those of the type on which user data is recordable as known as an MD, a CD-R, a CD-RW, a DVD-R, a DVD-RW, a DVD+RW and a DVD-RAM. For optical disk of the recordable type, a magneto-optical recording method, a phase change recording method, a pigment film change recording method or the like is used to allow recording of data. The pigment film change recording method is also called write-once recording method and allows data recording only once but does not allow re-writing, and therefore, it is suitably used for data storage applications and so forth. Meanwhile, the magneto-optical recording method and the phase change recording method allow rewriting of data and are utilized for various applications beginning with recording of various kinds of contents data such as music, videos, games, application programs and so forth.

Further, a high density optical disk called DVR (Data & Video Recording) disk has been developed in recent years and exhibits a significant increase in capacity.

In order to record data onto a disk which allows recording by the magneto-optical recording method, pigment film change recording method or phase change recording method, guide means for performing tracking of a data track is required. To this end, a groove is formed in advance as a pregroove, and the groove or a land (a location of a trapezoidal cross section positioned between grooves) is used as a data track.

Also it is necessary to record address information in order to allow data to be recorded at a predetermined position on a data track. Such address information is sometimes recorded by wobbling a groove.

In particular, while a track onto which data is to be recorded is formed in advance, for example, as a pregroove, side walls of the pregroove are wobbled in accordance with address information.

Where side walls of a pregroove are wobbled in this manner, upon recording or upon reproduction, an address can be read from the wobbling information obtained as reflected light information. Thus, even if, for example, pit data or the like representative of addresses is not formed on the track in advance, data can be recorded or reproduced at a desired position.

Where address information is added as a wobbling groove in this manner, for example, if address areas are provided discretely on tracks, then it is unnecessary to record addresses, for example, as pit data, and the recording capacity for actual data can be increased by an amount by which the address areas can be eliminated.

It is to be noted that absolute time (address) information represented by such a wobbling groove as described above is called ATIP (Absolute Time In Pregroove) or ADIP (Address In Pregroove).

Incidentally, particularly with a rewritable disk, it is necessary to record, in addition to address information and information (user data) which is recorded and reproduced by a user, attributes of the disk and recording and reproduction powers, pulse information and so forth as numerical values for use for control as additional information in advance on the disk similarly to the address information. For such additional information, a high degree of reliability is required.

The reason why a high degree of reliability is required is that, for example, if attributes or additional information for control is not obtained accurately, then an apparatus on the user side cannot execute such a control operation for establishing optimum recording conditions correctly.

As a method of recording such information on a disk in advance, it is known to form emboss pits on a disk.

However, if it is intended to achieve high density recording and reproduction onto and from an optical disk, the prerecording method by emboss pits is disadvantageous.

In order to achieve high density recording and reproduction onto and from an optical disk, it is necessary to form the groove with a reduced depth. With a disk produced with a stamper such that a groove and emboss pits are formed at a time, it is very difficult to form the groove and the emboss pits with different depths from each other. Therefore, it cannot be avoided to make the depth of the emboss pits equal to the depth of the groove.

However, where the depth of the emboss pits is small, there is a problem that a signal of a good quality cannot be obtained from the emboss pits.

For example, where an optical system including a laser diode of a wavelength of 405 nm and an objective lens of NA=0.85 is used and phase change marks are recorded and reproduced with a track pitch of 0.32 μm and a linear density of 0.12 μm/bit onto and from a disk having a cover (substrate) thickness of 0.1 mm, a capacity of 23 GB (GigaBytes) can be recorded onto and reproduced from an optical disk having a diameter of 12 cm.

In this instance, the phase change marks are recorded onto and reproduced from the groove formed spirally on the disk, and in order to suppress the medium noise to achieve high density, preferably the depth of the groove is set to approximately 20 nm, that is, $\lambda/13$ to $\lambda/12$ with respect to the wavelength $\lambda$.

On the other hand, in order to obtain a signal of a good quality from the emboss pits, preferably the depth of the emboss pits is $\lambda/8$ to $\lambda/4$. After all, a good solution to a common depth to the groove and the emboss pits cannot be obtained.

From such a situation as just described, a method of recording necessary additional information in advance in place of emboss pits is demanded. Besides, it is demanded to record the additional information with a high degree of reliability.

DISCLOSURE OF INVENTION

Taking the situations described above into consideration, it is an object of the present invention to record additional information to be recorded in advance together with address information appropriately and with a high degree of reliability.

In order to attain the object described above, according to the present invention, a disk recording medium is configured such that the disk recording medium has a recording and reproduction region into and from which first data can be recorded and reproduced in accordance with a rewritable or write-once-read-many recording method and from which second data recorded in the form of wobbling of a groove can be reproduced, and that the second data includes address information and additional information and the additional information is coded in accordance with a first error correction method, and the coded additional information and the address information are recorded in a state coded in accordance with a second error correction method.

The first error correction method is same as the error correction method used for the first data.

The additional information is error correction coded such that, to the additional information of a unit of m smaller than a code length n in error correction coding of the first data, m-n dummy data are added so as to have a code length equal to n.

The additional information is recorded at least in a lead-in zone in the recording and reproduction region.

According to the present invention, a disk production method for a disk recording medium having a recording and reproduction region into and from which first data is to be recorded and reproduced in accordance with a rewritable or write-once-read-many recording method is configured such that additional information is coded in accordance with a first error correction method and the coded additional information and address information are coded in accordance with a second error correction method, and a groove wobbled based on the second data is formed spirally to form the recording and reproduction region.

The first error correction method is same as the error correction method used for the first data.

The additional information is error correction coded such that, to the additional information of a unit of m smaller than a code length n in error correction coding of the first data, m-n dummy data are added so as to have a code length equal to n.

The additional information is recorded at least in a lead-in zone in the recording and reproduction region.

According to the present invention, a disk drive apparatus which performs recording or reproduction onto or from the disk recording medium described above is configured such that the disk drive apparatus includes readout means for reading out the second data from the wobbled groove of the disk recording medium, address decoding means for performing error correction decoding in accordance with the second error correction method for the second data read out by the readout means to obtain the address information and the additional information coded in accordance with the first error correction method, and additional information decoding means for performing error correction decoding in accordance with the first error correction method for the additional information coded in accordance with the first error correction method and obtained by the address decoding means.

The first error correction method is same as the error correction method used for the first data, and the additional information decoding means further performs error correction decoding and error correction coding for the first data.

The additional information decoding means adds, to the additional information of a unit of m smaller than a code length n in error correction coding of the first data, m-n dummy data to perform error correction decoding for the data having a code length equal to n.

The additional information is obtained from the second data read out from a lead-in zone in the recording and reproduction region by the readout means.

In particular, according to the present invention, when the additional information is recorded in advance onto a rewritable or write-once-read-many disk of a large capacity, the additional information is recorded by wobbling a groove together with address information. Further, the additional information is coded in accordance with the first error correction method, and the coded additional information and the address information are coded in accordance with the second error correction method to obtain second data. Then, the groove is wobbled with the second data. Consequently, the additional information can be recorded in the form of a wobbling groove together with the address information. Further, the additional information is error correction coded dually in accordance with the first and second error correction methods.

BRIEF DESCRIPTION OF DRAWINGS

FIG. 13 is a schematic view showing a disk layout of the embodiment;

FIGS. 14A and 14B are schematic views illustrating wobbling in a PB zone and an RW zone of the embodiment;

FIGS. 18A and 18B are diagrammatic views illustrating a frame structure of phase change marks and prerecorded information of the embodiment;

FIG. 20 is a diagrammatic view illustrating a sync part of an address unit of the embodiment;

FIGS. 21A and 21B are diagrammatic views illustrating monotone bits in the sync part of the embodiment and modulation object data;

FIGS. 22A and 22B are diagrammatic views illustrating a first sync bit in the sync part of the embodiment and modulation object data;

FIGS. 23A and 23B are diagrammatic views illustrating a second sync bit in the sync part of the embodiment and modulation object data;

FIGS. 24A and 24B are diagrammatic views illustrating a third sync bit in the sync part of the embodiment and modulation object data;

FIGS. 25A and 25B are diagrammatic views illustrating a fourth sync bit in the sync part of the embodiment and modulation object data;

FIG. 29 is a view illustrating an address format of the embodiment;

FIG. 30 is a view illustrating address information contents by ADIP bits of the embodiment;

FIGS. 32A to 32E are diagrams illustrating control timings of the address demodulation circuit of the embodiment;

FIGS. 33A to 33C are waveform diagrams of signals when HMW demodulation is performed by the address demodulation circuit of the embodiment;

FIGS. 34A to 34C are waveform diagrams of different signals when HMW demodulation is performed by the address demodulation circuit of the embodiment;

FIG. 35 is a view illustrating disk information of the embodiment;

FIG. 36 is a diagrammatic view illustrating an ECC format for main data of the embodiment;

BEST MODE FOR CARRYING OUT THE INVENTION

Figure 1:
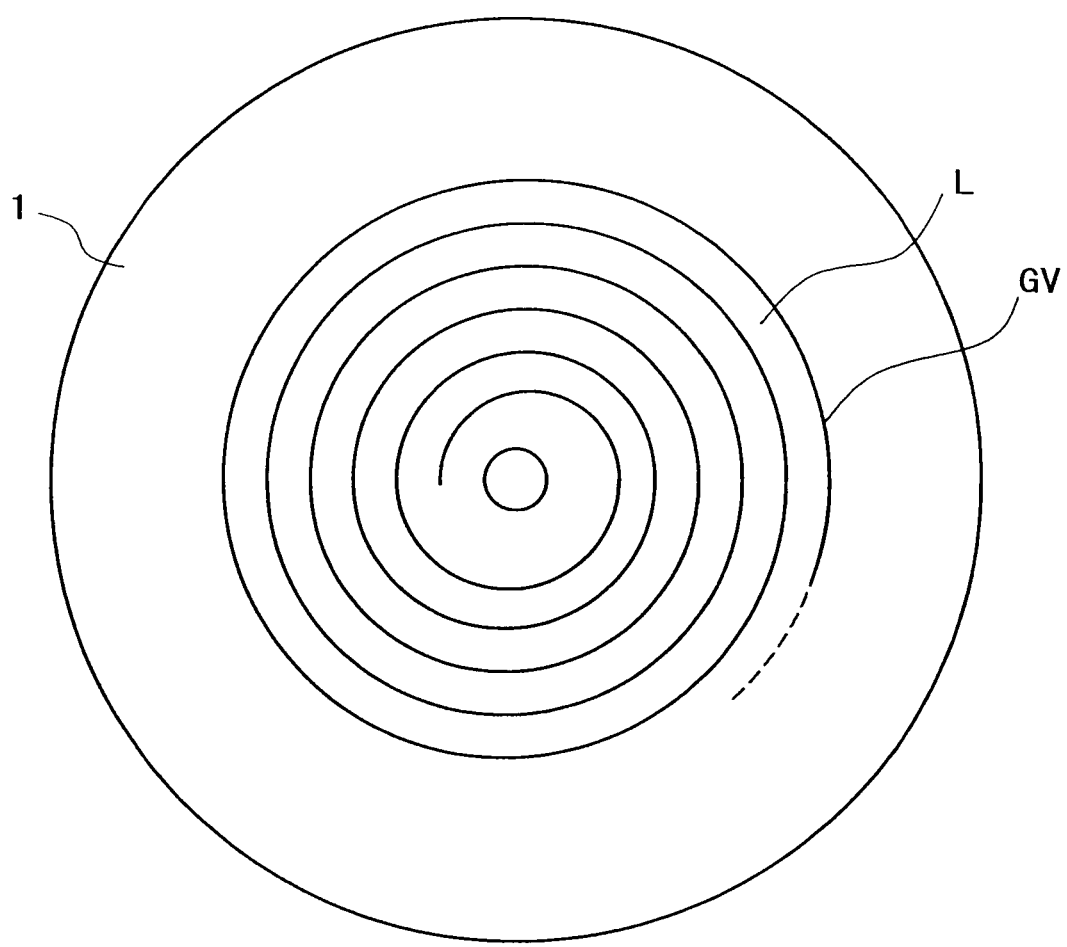
FIG. 1 is a schematic view illustrating a groove of a disk of an embodiment of the present invention.

In the following, an optical disk as an embodiment of the present invention is described, and a disk drive apparatus (recording and reproduction apparatus) which performs recording and reproduction onto and from the optical disk and a mastering apparatus used for production of the optical disk are described. The description is given in the following order.
1. Wobbling System of the Disk
   1-1. General Description of the Wobbling System
   1-2. MSK Modulation
   1-3. HMW Modulation
   1-4. Summary
2. Application to a DVR
   2-1. Physical Characteristics of a DVR Disk
   2-2. ECC Format of the Data
   2-3. Address Format
   2-3-1. Relationship Between Recording and Reproduction data and Addresses
   2-3-2. Sync Part
   2-3-3. Data Part
   2-3-4. Contents of the Address Information
   2-4. Address Demodulation Circuit
3. ECC Format of the Disk Information
4. Disk Drive Apparatus
5. Disk Production Method
1. Wobbling System of the Disk
   1-1. General Description of the Wobbling System An optical disk 1 of an embodiment of the present invention has a groove GV serving as recording tracks formed thereon as shown in FIG. 1. The groove GV is formed spirally from the inner circumference side to the outer circumference side. Therefore, if a cross section of the optical disk 1 in a radial direction is taken, then a convex land L and the concave groove GV are formed alternately as seen in FIG. 2.

Figure 2:
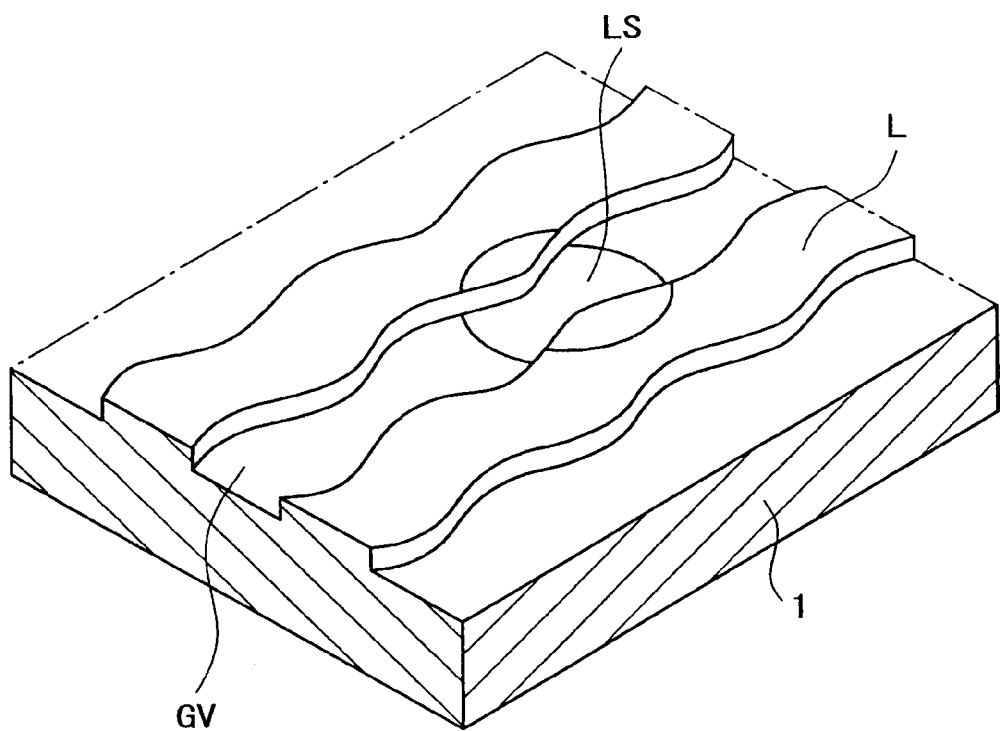
FIG. 2 is a schematic view illustrating wobbling of the groove of the disk of the embodiment.

The groove GV of the optical disk 1 is formed in a wobbled state with respect to a tangential direction as seen in FIG. 2. The wobbling of the groove GV has a shape corresponding to a wobble signal. Therefore, an optical disk drive can reproduce the wobble signal by detecting the opposite edge positions of the groove GV from reflected light of a laser spot LS illuminated upon the groove GV and extracting variation components of the opposite edge positions with respect to a disk radius direction when the laser spot LS moves along a recording track.

The wobble signal includes modulated address information (a physical address and other additional information and so forth) of the recording track at the recording position. Therefore, an optical disk drive can perform address control and so forth upon recording or reproduction of data by demodulating the address information and so forth from the wobble signal.

It is to be noted that, while the embodiment of the present invention described below is directed to an optical disk to which groove recording is applied, the present invention can be applied not only to such an optical disk of the groove recording type but also to an optical disk to which land recording wherein data is recorded on a land is applied. Further, the present invention can be applied also to an optical disk of the land and groove recording type wherein data is recorded on both of a groove and a land.

Here, in the optical disk 1 of the present embodiment, two modulation methods are used to modulate address information on the wobble signal. One of them is an MSK (Minimum Shift Keying) modulation method. The other is a method wherein an even-numbered order harmonic signal is added to a carrier signal of a sine wave and the polarity of the harmonic signal is changed in accordance with the sign of modulation object data to modulate the modulation object data. In the following, the modulation method wherein an even-numbered order harmonic signal is added to a carrier signal of a sign wave and the polarity of the harmonic signal is varied in accordance with the sign of modulation object data to modulate the modulation object data is referred to as HMW (Harmonic Wave) modulation.

Figure 3:
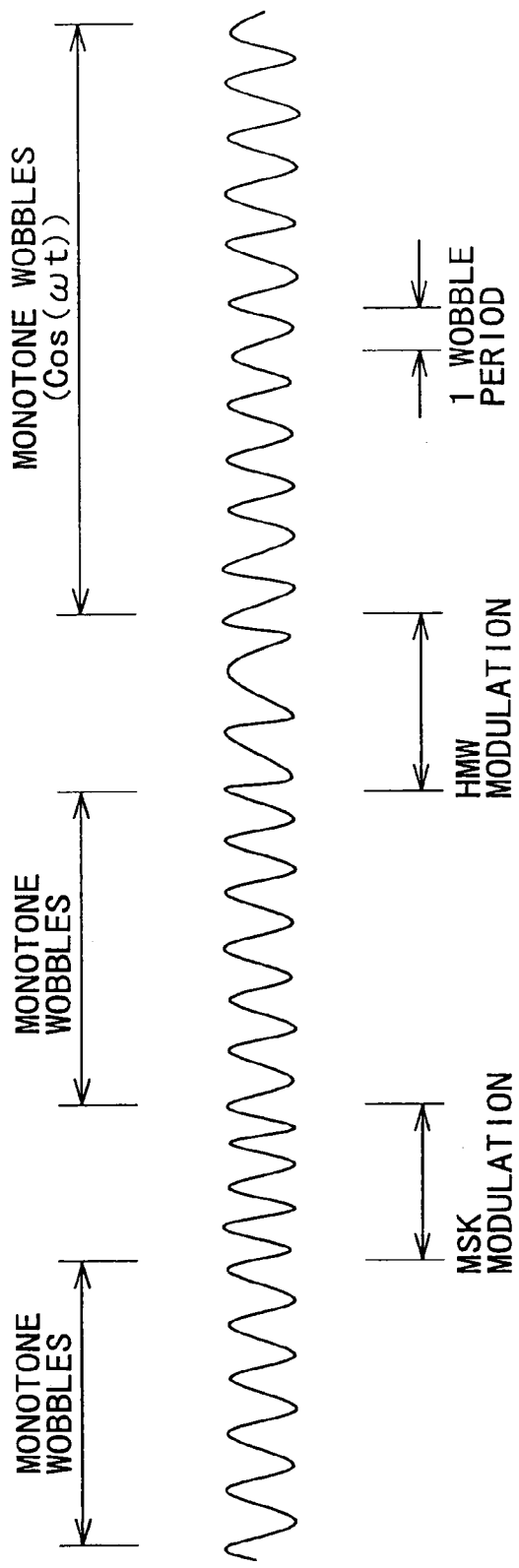
FIG. 3 is a schematic view illustrating a wobble signal to which MSK modulation and HMW modulation of the embodiment are applied.

In the optical disk 1 of the present embodiment, a block in which a reference carrier signal waveform of a sine wave of a predetermined frequency appears continuously for a predetermined period is formed as shown in FIG. 3. In the block, a wobble signal is generated which includes an MSK modulation part in which MSK modulated address information is inserted and an HMW modulation part in which HMW modulated address information is inserted. In other words, MSK modulated address information and HMW modulated address information are inserted at different positions in the block. Further, one of two carrier signals each in the form of a sine wave used for the MSK modulation and a carrier signal for the HMW modulation are used as a reference carrier signal described hereinabove. Further, the MSK modulation part and the HMW modulation part are disposed at different positions in the block, and a reference carrier signal for more than one period is disposed between the MSK part and the HMW part.

It is to be noted that a portion in which data is not modulated and only a frequency component of a reference carrier signal appears is hereinafter referred to as monotone wobbles. Further, in the following description, the sine wave signal used as a reference carrier signal is $Cos(\omega t)$. Furthermore, one period of the reference carrier signal is referred to as one wobble period. Further, the frequency of the reference carrier signal is fixed from the inner circumference to the outer circumference of the optical disk 1 and is defined in accordance with a relationship with the linear velocity when a laser spot moves along the recording track.

1-2. MSK Modulation

In the following, the modulation methods of the MSK modulation and the HMW modulation are described in more detail. Here, the modulation method of address information for which the MSK modulation method is used is described first.

The MSK modulation is a kind of FSK (Frequency Shift Keying) modulation having a continuous phase in which the modulation index is 0.5. The FSK modulation is a method of modulating codes of "0" and "1" of modulation object data in a corresponding relationship to two carrier signals of a frequency f1 and another frequency f2. In particular, the FSK modulation is a method wherein, if the modulation object data is "0", then a sine waveform of the frequency f1 is outputted, but if the modulation object data is "1", then another sine wave of the frequency f1 is outputted. Further, in the case of the FSK modulation wherein the phases continue, the phases of two carrier signals continue at a changeover timing of the sign of modulation object data.

In the FSK modulation, a modulation index m is defined. The modulation index m is defined by $$m=|f1-f2|T$$

where T is the transmission rate of the modulation object data (time of a 1/smallest code length). The phase-continuous FSK modulation where m is 0.5 is called MSK modulation.

Figure 4:
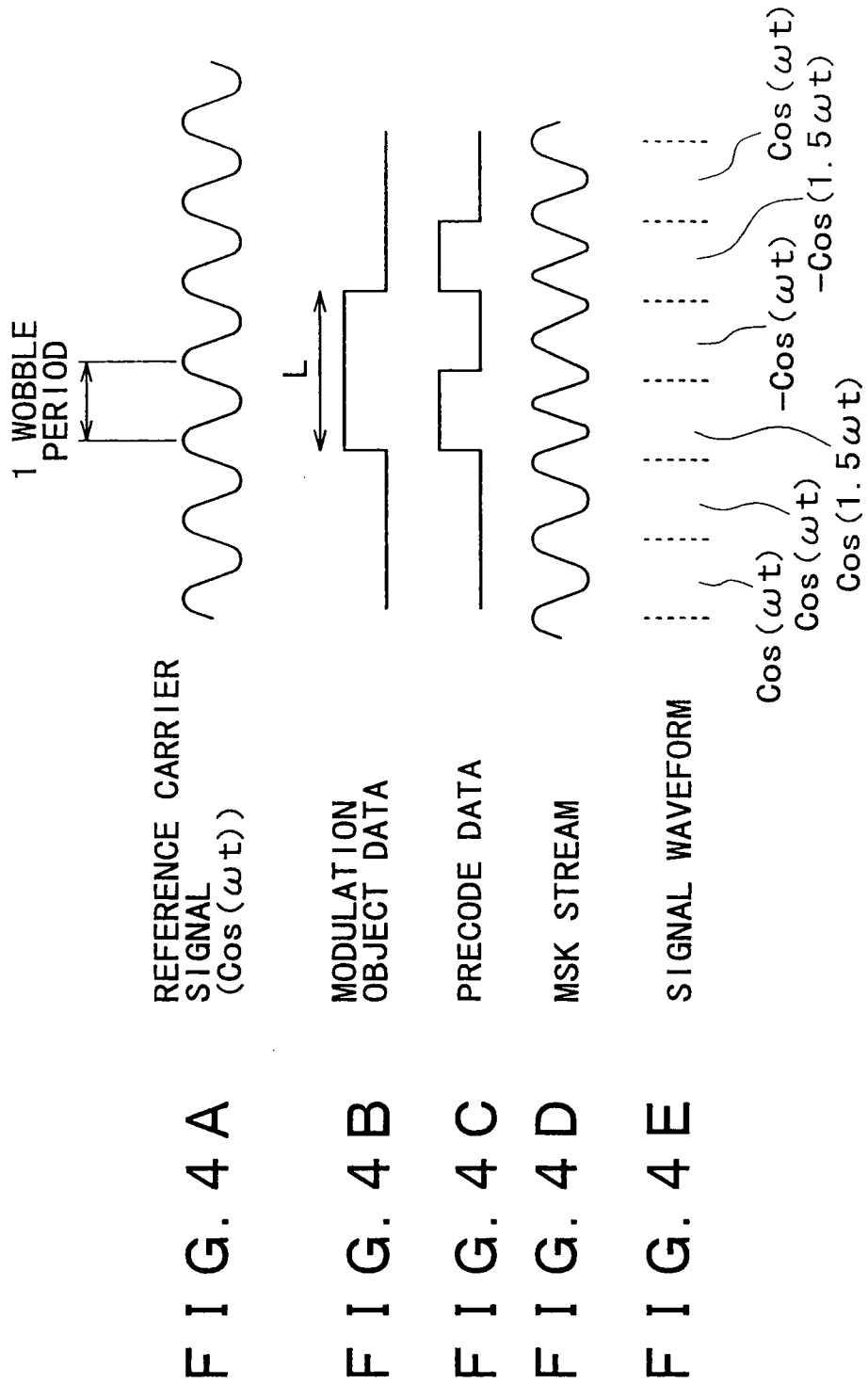
FIGS. 4A to 4E are diagrammatic views illustrating the MSK modulation of the embodiment.

In the optical disk 1, the code length L of modulation object data to be MSK modulated is equal to twice the wobble period as seen in FIGS. 4A and 4B. It is to be noted that the code length L of modulation object data may be any length only if it is equal to or greater than twice the wobble period and equal to an integral number of times the wobble period. Further, one of the two frequencies for use with the MSK modulation is set equal to that of the reference carrier signal while the other is set to 1.5 times the reference carrier frequency. In other words, one of the signal waveforms for use with the MSK modulation is $Cos(\omega t)$ or $-Cos(\omega t)$ while the other is $Cos(1.5 \omega t)$ or $-Cos(1.5 \omega t)$.

In order to insert modulation object data into a wobble signal of the optical disk 1 in accordance with the MSK modulation method, a differential coding process is performed for a data stream of the modulation object data in a clock unit corresponding to the wobble period as seen in FIG. 4C. In particular, the stream of the modulation object data and delayed data obtained by delaying the modulation object data by one period of the reference carrier signal are differentially operated. The data obtained by the differential coding process is referred to as precode data.

Then, such precode data are MSK modulated to generate an MSK stream. The MSK stream has such a signal waveform that, as shown in FIG. 4D, when the precode data is "0", the MSK stream exhibits a waveform ($Cos(\omega t)$) of the frequency equal to that of the reference carrier or an inverted waveform ($-Cos(\omega t)$) of the waveform, but when the precode data is "1", the MSK stream exhibits a waveform ($Cos(1.5 \omega t)$) of a frequency equal to 1.5 times that of the reference carrier or an inverted waveform ($-Cos(1.5 \omega t)$) of the waveform. Accordingly, if the data string of the modulation object data has a pattern of "010" as seen in FIG. 4B, then the signal waveform of the MSK stream has waveforms of $Cos(\omega t)$, $Cos(\omega t)$, $Cos(1.5 \omega t)$, $-Cos(\omega t)$, $-Cos(1.5 \omega t)$ and $Cos(\omega t)$ for each one wobble period as seen in FIG. 4E.

In the optical disk 1, address information is modulated on the wobble signal by converting the wobble signal into such an MSK stream as described above.

Here, where modulation object data is differentially coded and then MSK modulated as described above, synchronous detection of the modulation object data is possible. The reason why synchronous detection is possible in this manner is such as follows.

In differentially coded data (precode data), the bit rises (to "1") at a code changing point of the modulation object data. Since the code length of the modulation object data is equal to or greater than twice the wobble period, the reference carrier signal ($Cos(\omega t)$) or the inverted signal ($-Cos(\omega t)$) of the carrier signal is inserted in the latter half of the code length of the modulation object data without fail. If a bit of the precode data exhibits "1", then a waveform of a frequency equal to 1.5 times that of the reference carrier signal is inserted, and at the code changeover point, the waveforms are connected to each other with the phases thereof adjusted to each other. Accordingly, if the modulation object data is "0", then the reference carrier signal waveform ($Cos(\omega t)$) is exhibited, but if the modulation object data is "1", then the inverted signal waveform ($-Cos(\omega t)$) of it is exhibited. Since the synchronous detection output exhibits a positive value if the phase is same as that of the carrier signal but exhibits a negative value if the phase is reverse to that of the carrier signal, if such an MSK modulated signal as described above is synchronously detected with the reference carrier signal, then the modulation object data can be demodulated.

It is to be noted that, since the MSK modulation adjusts the phase at each code changeover point in modulation, a delay is generated before the level of the synchronous detection signal is inverted. Therefore, when such an MSK modulated signal as described above is to be demodulated, for example, an integration window for the synchronous detection output is delayed by a ½ wobble period so that an accurate detection output may be obtained.

Figure 5:
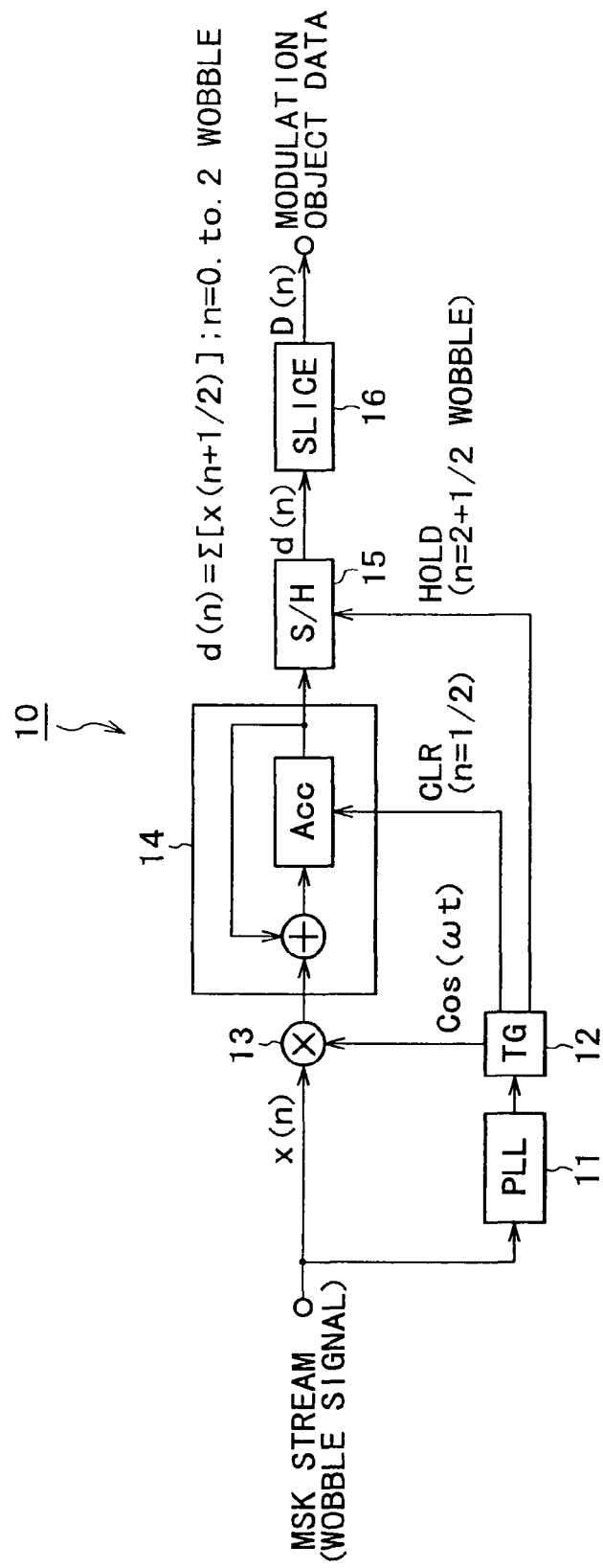
FIG. 5 is a block diagram of an MSK demodulation circuit for demodulating an MSK modulated wobble signal of the embodiment.

FIG. 5 shows an MSK demodulation circuit for demodulating modulation object data from such an MSK stream as described above.

Referring to FIG. 5, the MSK demodulation circuit 10 includes a PLL circuit 11, a timing generator (TG) 12, a multiplier 13, an integrator 14, a sample/hold (SH) circuit 15, and a slice circuit 16.

A wobble signal (MSK modulated stream) is inputted to the PLL circuit 11. The PLL circuit 11 detects edge components from the wobble signal inputted thereto to generate a wobble clock synchronized with the reference carrier signal ($\cos(\omega t)$). The generated wobble clock is supplied to the timing generator 12.

The timing generator 12 generates a reference carrier signal ($\cos(\omega t)$) synchronized with the wobble signal inputted thereto. Further, the timing generator 12 generates a clear signal (CLR) and a hold signal (HOLD) from the wobble clock. The clear signal (CLR) is a signal generated at a timing delayed by a ½ wobble period from a start edge of a data clock of the modulation object data whose minimum code length is equal to twice the wobble period. Meanwhile, the hold signal (HOLD) is a signal generated at a timing delayed by a ½ wobble period from an end edge of the data clock of the modulation object data. The reference carrier signal ($\cos(\omega t)$) generated by the timing generator 12 is supplied to the multiplier 13. The clear signal (CLR) generated by the timing generator 12 is supplied to the integrator 14. The hold signal (HOLD) generated by the timing generator 12 is supplied to the sample/hold circuit 15.

The multiplier 13 multiplies the wobble signal inputted thereto by the reference carrier signal ($\cos(\omega t)$) to perform a synchronous detection process. The synchronously detected output signal is supplied to the integrator 14.

The integrator 14 performs an integration process for the signal synchronously detected by the multiplier 13. It is to be noted that the integrator 14 clears its integrated value to zero at a generation timing of the clear signal (CLR) generated by the timing generator 12.

The sample/hold circuit 15 samples the integrated output value of the integrator 14 at a generation timing of the hold signal (HOLD) generated by the timing generator 12 and holds the sampled value until a next hold signal (HOLD) is generated.

The slice circuit 16 binarizes the value held by the sample/hold circuit 15 using the origin (0) as a threshold value and outputs the binarized value with the sign reversed.

Then, the output signal of the slice circuit 16 makes demodulated modulation object data.

Figure 6:
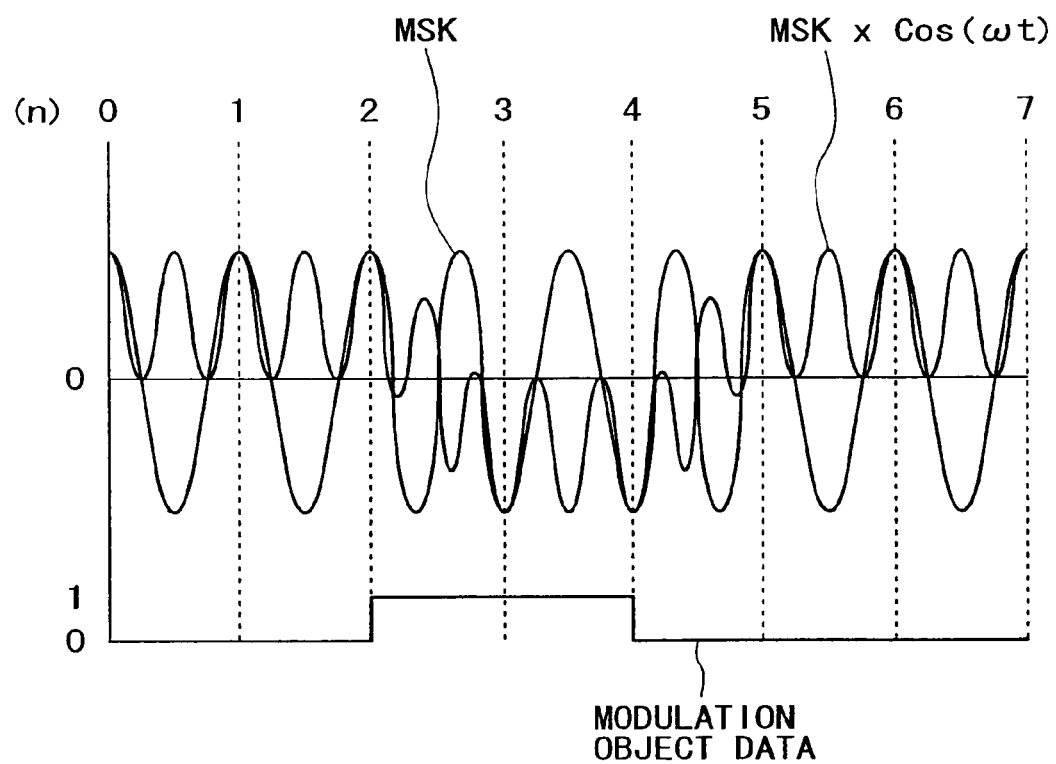
FIG. 6 is a waveform diagram of an inputted wobble signal and a synchronous detection output signal of the embodiment.
Figure 7:
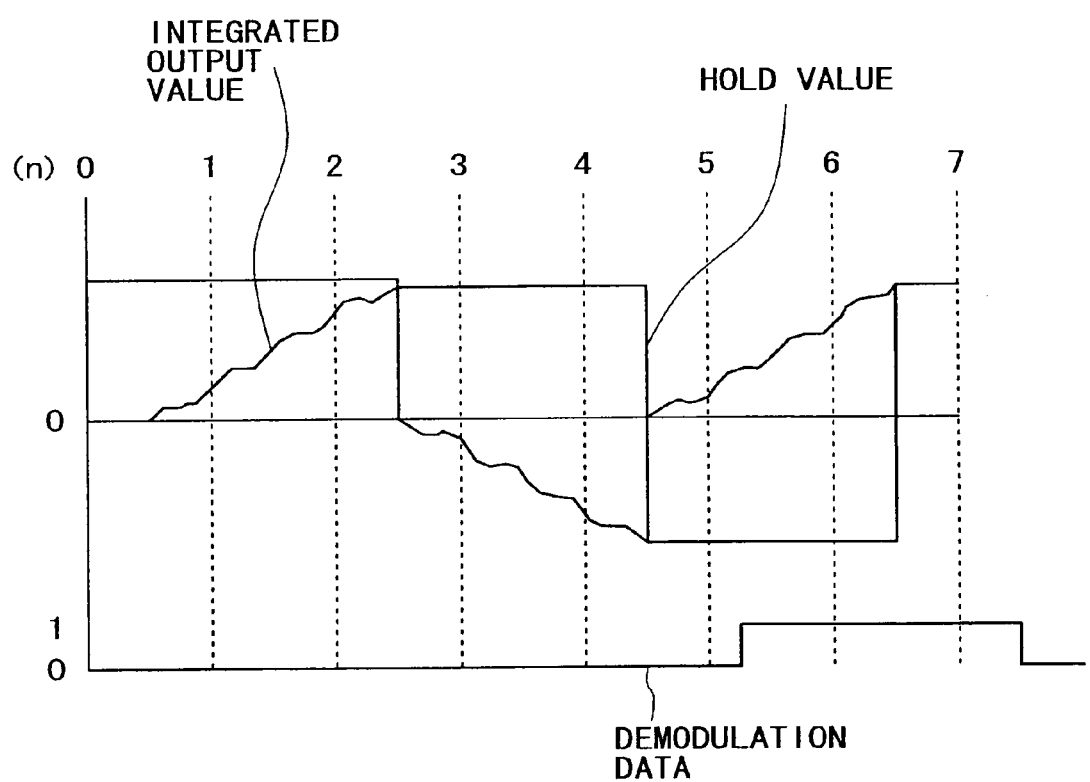
FIG. 7 is a waveform diagram of an integrated output value of a synchronous detection output signal of an MSK stream of the embodiment, a hold value of the integrated output value and MSK demodulated modulation object data.

FIGS. 6 and 7 show a wobble signal (MSK stream) generated by the MSK modulation described above of modulation object data of a data string of "0100" and output signal waveforms from the circuits of the MSK demodulation circuit 10 when the wobble signal is inputted to the MSK demodulation circuit 10, respectively. It is to be noted that the axis of abscissa (n) of FIGS. 6 and 7 indicates the period number of the wobble period. FIG. 6 shows the inputted wobble signal (MSK stream) and the synchronous detection output signal (MSK×$\cos(\omega t)$) of the wobble signal. Meanwhile, FIG. 7 shows the integrated output value of the synchronous detection output signal, the hold value of the integrated output value, and the demodulated modulation object data outputted from the slice circuit 16. It is to be noted that the reason why the demodulated modulation object data outputted from the slice circuit 16 is delayed is a processing delay of the integrator 14.

As described above, where modulation object data is differentially coded and then MSK modulated in such a manner as described above, synchronous detection of the modulation object data is possible.

In the optical disk 1, address information MSK modulated in such a manner as described above is included in the wobble signal. Where address information is MSK modulated and inclined in the wobble signal in this manner, the amount of high frequency components included in the wobble signal is reduced. Accordingly, accurate address detection can be anticipated. Further, since the MSK modulated address information is inserted into monotone wobbles, crosstalk which the address information may apply to adjacent tracks can be reduced, and consequently, the S/N ratio can be improved. Further, in the present optical disk 1, since MSK modulation object data can be synchronously detected and demodulated, demodulation of the wobble signal can be performed accurately and simply.

1-3. HMW Modulation

How, an address information modulation method which uses the HMW modulation is described.

The HMW modulation is a modulation method wherein an even-numbered order harmonic signal is added to a carrier signal of a sign wave and the polarity of the harmonic signal is varied in accordance with the sign of modulation object data to modulate codes.

In the optical disk 1, the carrier signal for the HMW modulation is a signal of the same frequency and the same phase as those of the reference carrier signal ($\cos(\omega t)$) which is the carrier signal for the MSK modulation. As an even-numbered order harmonic signal to be added, $\sin(2\omega t)$ and $-\sin(2\omega t)$ which are second order harmonics of the reference carrier signal ($\cos(\omega t)$) are used, and the amplitude of them is set to an amplitude of $-12$ dB with respect to the amplitude of the reference carrier signal. The minimum code length of modulation object data is set to twice the wobble period (period of the reference carrier signal).

Then, when the code of the modulation object data is "1", $\sin(2\omega t)$ is added to the carrier signal, but when the code of the modulation object data is "0", $-\sin(2\omega t)$ is added to the carrier signal to perform modulation.

Figure 8A:
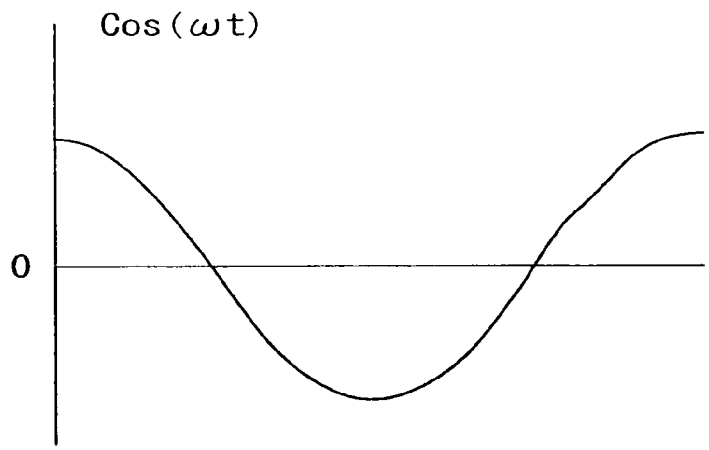
FIGS. 8A to 8C are waveform diagrams illustrating HMW modulation of the embodiment.
Figure 8B:
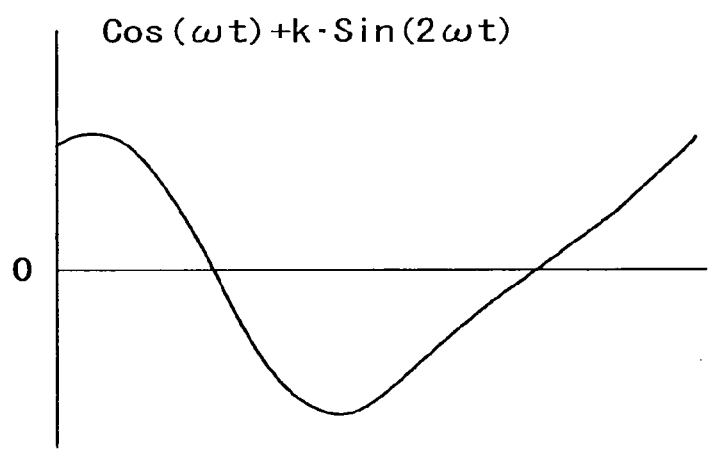
Figure 8C:
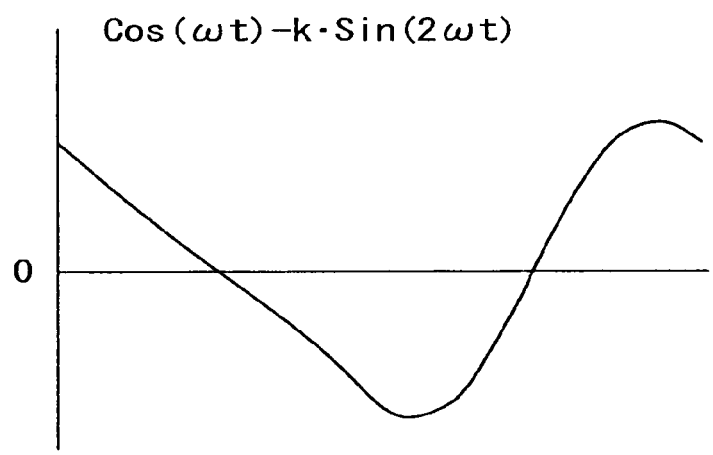

Signal waveforms where the wobble signal is modulated in accordance with such a method as described above are illustrated in FIGS. 8A to 8C. FIG. 8A shows a signal waveform of the reference carrier signal ($\cos(\omega t)$). FIG. 8B shows a signal waveform of the reference carrier signal ($\cos(\omega t)$) to which $\sin(2\omega t)$ is added, that is, a signal waveform when the modulation object data is "1". FIG. 8C shows a signal waveform of the reference carrier signal ($\cos(\omega t)$) to which $-\sin(2\omega t)$ is added, that is, a signal waveform when the modulation object data is "0".

It is to be noted that, while, in the optical disk 1, the harmonic signal to be applied to the carrier signal is a second order harmonic, it is not limited to the second order harmonic, but any signal may be added if it is an even-numbered order harmonic. Further, while, in the optical disk 1, only a second order harmonic is added, a plurality of harmonic signals may be applied simultaneously such that both of a second order harmonic and a fourth order harmonic are added simultaneously.

Here, where only positive and negative even-numbered order harmonic signals are added to the reference carrier signal in this manner, from the characteristic of the generated waveform, it is possible to synchronously detect the generated waveform with the harmonic signals and integrates the synchronous detection output for a period of time of the code length of the modulation object data to demodulate the modulation object data.

Figure 9:
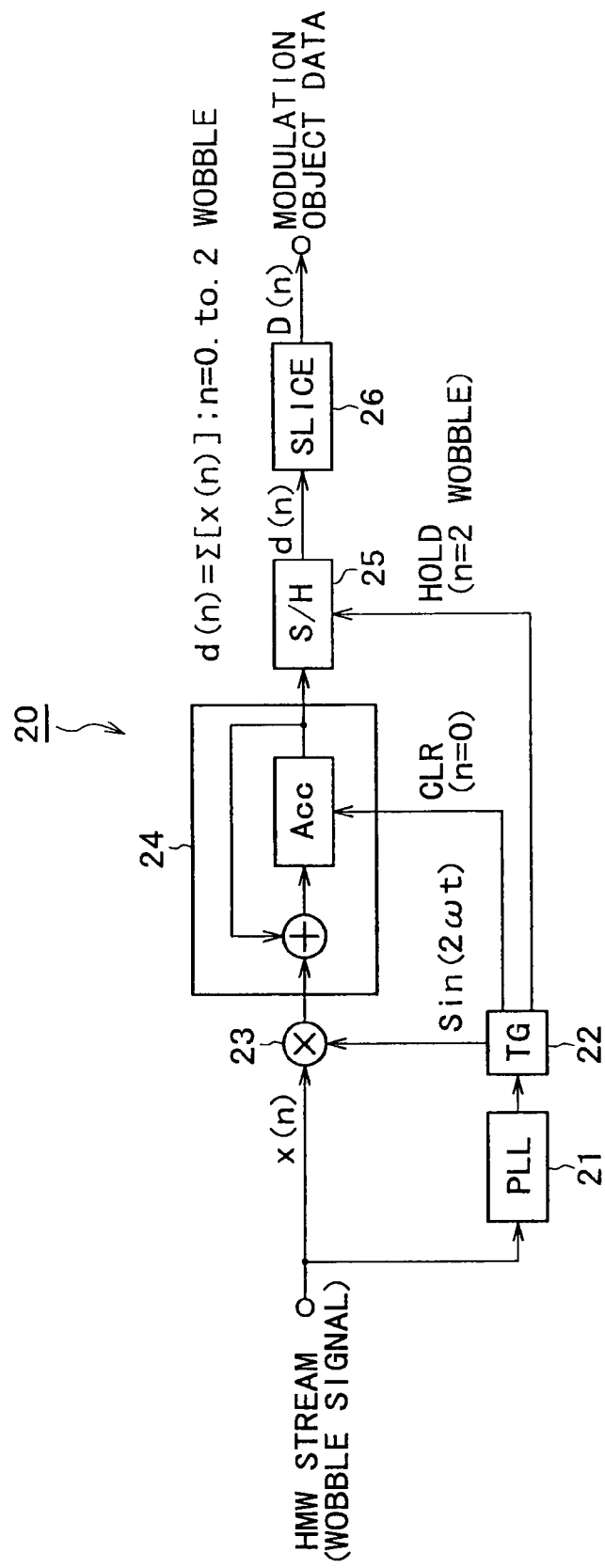
FIG. 9 is a block diagram of an HMW demodulation circuit for demodulating an HMW modulated wobble signal of the embodiment.

FIG. 9 shows an HMW demodulation circuit for demodulating modulation object data from a wobble signal HMW modulated in such a manner as described above.

Referring to FIG. 9, the HMW demodulation circuit 20 includes a PLL circuit 21, a timing generator (TG) 22, a multiplier 23, an integrator 24, a sample/hold (SH) circuit 25 and a slice circuit 26.

A wobble signal (HMW modulated stream) is inputted to the PLL circuit 21. The PLL circuit 21 detects edge components from the wobble signal inputted thereto to generate a wobble clock synchronized with the reference carrier signal ($Cos(\omega t)$). The generated wobble clock is supplied to the timing generator 22.

The timing generator 22 generates a second order harmonic signal ($Sin(2(\omega t))$) synchronized with the wobble signal inputted thereto. Further, the timing generator 22 generates a clear signal (CLR) and a hold signal (HOLD) from the wobble clock. The clear signal (CLR) is a signal generated at a timing of a start edge of a data clock of the modulation object data whose minimum code length is equal to twice the wobble period. Meanwhile, the hold signal (HOLD) is a signal generated at a timing of an end edge of the data clock of the modulation object data. The second order harmonic signal ($Sin(2 \omega t)$) generated by the timing generator 22 is supplied to the multiplier 23. The clear signal (CLR) generated by the timing generator 22 is supplied to the integrator 24. The hold signal (HOLD) generated by the timing generator 22 is supplied to the sample/hold circuit 25.

The multiplier 23 multiplies the wobble signal inputted thereto by the second order harmonic signal ($Sin(2 \omega t)$) to perform a synchronous detection process. The synchronously detected output signal is supplied to the integrator 24.

The integrator 24 performs an integration process for the signal synchronously detected by the multiplier 23. It is to be noted that the integrator 24 clears its integrated value to zero at a generation timing of the clear signal (CLR) generated by the timing generator 22.

The sample/hold circuit 25 samples the integrated output value of the integrator 24 at a generation timing of the hold signal (HOLD) generated by the timing generator 22 and holds the sampled value until a next hold signal (HOLD) is generated.

The slice circuit 26 binarizes the value held by the sample/hold circuit 25 using the origin (0) as a threshold value and outputs the sign of the binarized value.

Then, the output signal of the slice circuit 26 makes demodulated modulation object data.

Figure 10:
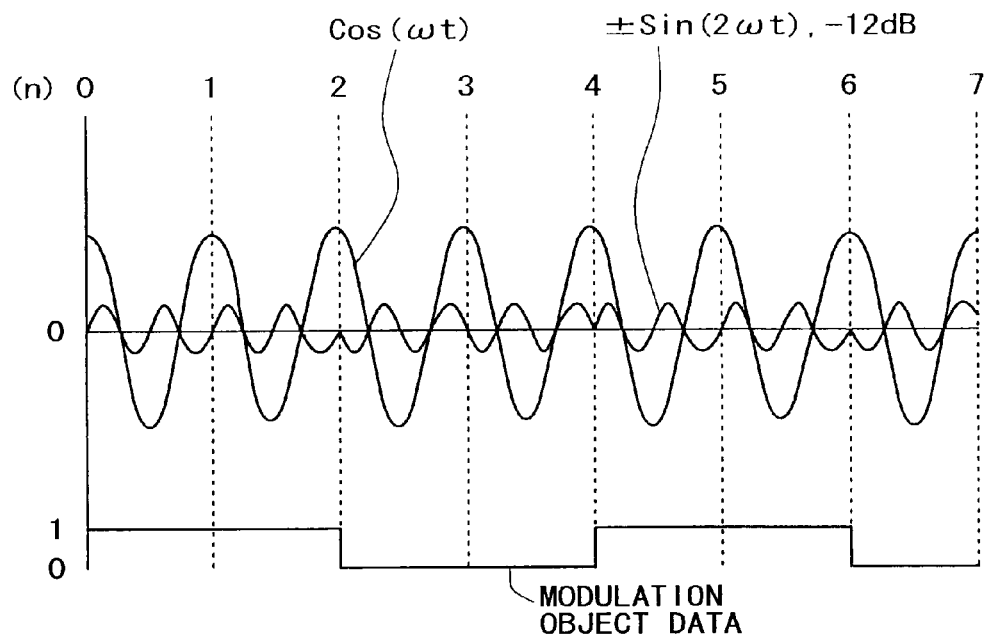
FIG. 10 is a waveform diagram of a reference carrier signal of the embodiment, modulation object data and a second order harmonic signal waveform generated in response to the modulation object data.
Figure 11:
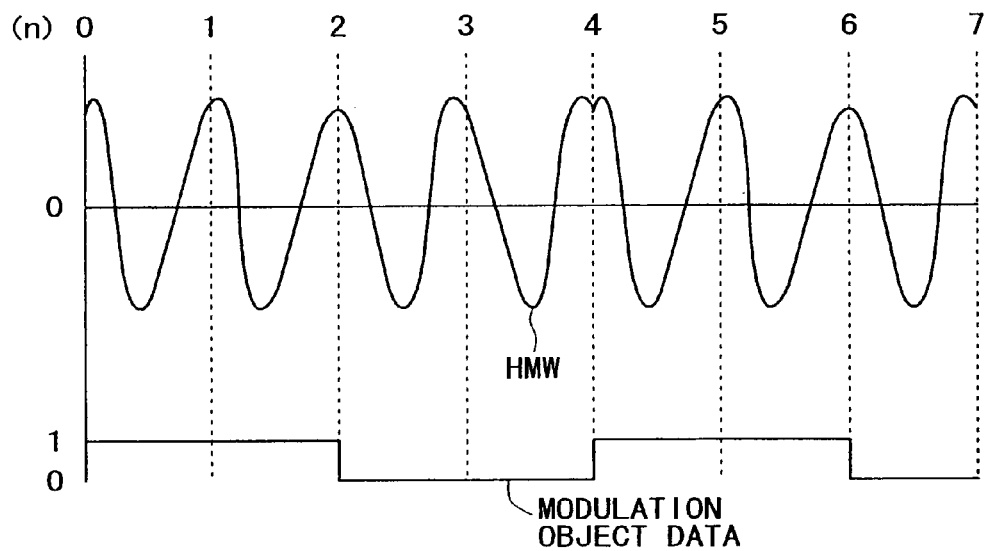
FIG. 11 is a waveform diagram of a generated HMW stream of the embodiment.
Figure 12A:
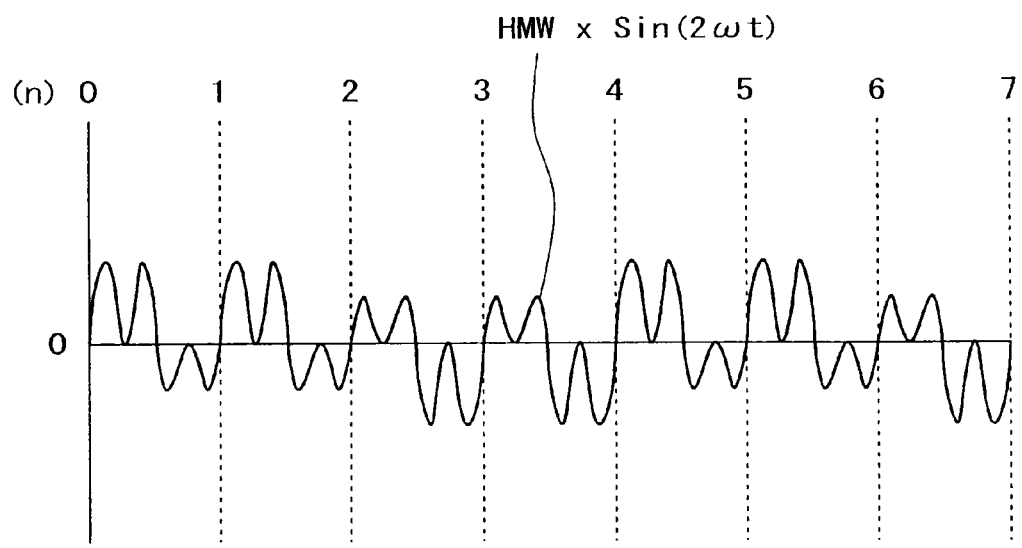
FIGS. 12A and 12B are waveform diagrams of a synchronous detection output signal of an HMW stream of the embodiment, an integrated output value of the synchronous detection output signal, a hold value of the integrated output value and HMW demodulated modulation object data.
Figure 12B:
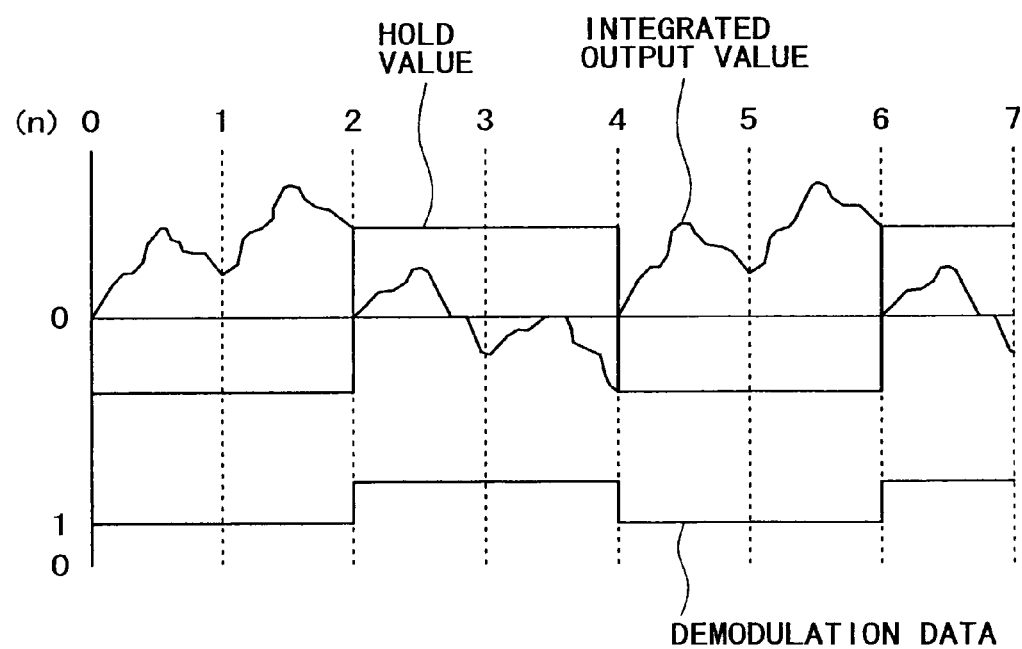

FIGS. 10, 11 and 12A to 12B show signal waveforms used for the HMW modulation described above of modulation object data of a data string of "1010", a wobble signal generated by the HMW modulation and output signal waveforms from the circuits of the HMW demodulation circuit 20 when the wobble signal is inputted to the HMW demodulation circuit 20, respectively. It is to be noted that the axis of abscissa (n) of FIGS. 10 to 12B indicates the period number of the wobble period. FIG. 10 shows the reference charier signal ($Cos(\omega t)$), the modulation object data of the data string of "1010", and the second order harmonic signal ($\pm Sin(2 \omega t)$, $-12$ dB) generated in response to the modulation object data. FIG. 11 shows the generated wobble signal (HMW stream). FIG. 12A shows the synchronous detection output signal (HMW×$Sin(2 (\omega t))$) of the wobble signal. FIG. 12B shows the integrated output value of the synchronous detection output signal, the hold value of the integrated output value, and the demodulated modulation object data outputted from the slice circuit 26. It is to be noted that the reason why the demodulated modulation object data outputted from the slice circuit 26 is delayed is a processing delay of the integrator 14.

As described above, where modulation object data is differentially coded and then HMW modulated in such a manner as described above, synchronous detection of the modulation object data is possible.

In the optical disk 1, address information HMW modulated in such a manner as described above is included in the wobble signal. Where address information is HMW modulated and inclined in the wobble signal in this manner, frequency components can be restricted and the amount of high frequency components included in the wobble signal can be reduced. Consequently, the S/N ratio of the demodulation output of the wobble signal can be improved, and accurate address detection can be anticipated. Further, also the modulation circuit can be formed from a carrier signal generation circuit, a generation circuit for a harmonic of the carrier signal and an addition circuit for output signals of the two generation circuits, and is simplified significantly. Further, since high frequency components of the wobble signal are reduced, also mastering upon formation of optical disks is facilitated.

Furthermore, since HMW modulated address information is inserted into monotone wobbles, the crosstalk to be applied to adjacent tracks can be reduced, and consequently, the S/N ratio can be improved. Further, in the present optical disk 1, since HMW modulated data can be synchronously detected and demodulated, demodulation of the wobble signal can be performed accurately and simply.

1-4. Summary

As described above, in the optical disk 1 of the present embodiment, an MSK modulation method and an HMW modulation method are adopted as a modulation method for address information on a wobble signal. Further, in the optical disk 1, a sine wave signal ($Cos(\omega t)$) of an equal frequency is used for both of one of frequencies used for the MSK modulation method and a carrier frequency used for the HMW modulation. Furthermore, monotone wobbles in which only the carrier signal ($Cos(\omega t)$) on which no data is modulated is included is provided between the modulation signals in the wobble signal.

In the optical disk 1 of the present embodiment having such a configuration as described above, since the signal of the frequency used for the MSK modulation and the harmonic signal used for the HMW modulation are in a relationship wherein they do not interfere with each other, detection of each of the signals is not influenced by modulation components of the other signal. Therefore, the address information recorded in accordance with the two modulation methods can be detected with certainty. Accordingly, the accuracy in control of the track position and so forth upon recording and/or reproduction of the optical disk can be improved.

Further, if the address information recorded in the MSK modulation and the address information recorded in the HMW modulation have the same data contents, then the address information can be detected with a higher degree of certainty.

Further, since one of frequencies used in the MSK modulation method and the carrier frequency used in the HMW modulation are set to a sine wave signal ($Cos(\omega t)$) of the same frequency and besides the MSK modulation and the HMW modulation are performed at different portions in the wobble signal, upon modulation, for example, a harmonic signal may be added to the wobble signal after it is MSK modulated at the position of wobbles to be HMW modulated. Thus, the two modulations can be performed very simply. Further, where the MSK modulation and the HMW modulation are performed at different portions of a wobble signal and at least a monotone wobble for one period is included between the two portions, a disk can be produced with a higher degree of accuracy, and demodulation of an address can be performed with certainty.

2. Application to a DVR 2-1. Physical Characteristics of a DVR Disk

Now, an application of the address format to a high density optical disk called DVR (Data & Video Recording) is described.

First, an example of physical parameters of a DVR disk to which the present address format is applied is described. It is to be noted that the physical parameters are an example, and it is possible to apply a wobble format described below to another optical disk of different physical characteristics.

An optical disk to be formed as a DVR disk of the present example is an optical disk onto which data is recorded in accordance with a phase change method, and as the disk size, the diameter is 120 mm. Further, the disk thickness is 1.2 mm. In other words, from the parameters given, the outer shape of the optical disk is similar to that of a disk of the CD (Compact Disc) type or a disk of the DVD (Digital Versatile Disc) type.

The laser wavelength for recording/reproduction is 405 nm, and a blue laser is used. The NA of the optical system is 0.85.

The track pitch of tracks on which phase change marks are recorded is 0.32 μm, and the linear density is 0.12 μm. A data block of 64 KB is used as a recording/reproduction unit, and the format efficiency is approximately 82%. Thus, the disk of the diameter of 12 cm achieves a user data capacity of 23.3 Gbytes.

As described above, the groove recording method is used for the data recording.

FIG. 13 shows a layout (regional configuration) of the entire disk.

As regions on the disk, a lead-in zone, a data zone and a lead-out zone are disposed from the inner circumference side.

Further, from a point of view of a regional configuration regarding recording and reproduction, the inner circumference side of the lead-in zone is a PB zone (region only for reproduction), and the region from the outer circumference side of the lead-in zone to the lead-out zone is an RW (region for recording and reproduction).

The lead-in zone is positioned on the inner side from a radius of 24 mm. The range from 21 to 22.2 mm in radius is a BCA (Burst Cutting Area). The BCA has a unique ID unique to the disk recording medium recorded in a recording method of burning out the recording layer. In short, recording marks are formed in a concentrically juxtaposed relationship to form bar code-like recorded data.

The range from 22.2 to 23.1 mm in radius is a prerecorded data zone.

In the prerecorded data zone, disk information such as recording and reproduction power conditions, information for use for copy protection and other necessary information (prerecorded information) is recorded in advance by wobbling of the groove spirally formed on the disk.

The kinds of information mentioned are information only for reproduction, and the BCA and the prerecorded data zone make the PB zone (region only for reproduction) described hereinabove.

While the prerecorded data zone includes, for example, copy protection information as the prerecorded information therein, the copy protection information is used, for example, to perform the following.

In an optical disk system according to the present embodiment, registered drive apparatus makers and disk makers can carry out the business, and a mediakey or a drivekey representing such registration is provided.

If hacking occurs, then the drivekey or mediakey is recorded as copy protection information. A medium or a drive having the mediakey or the drivekey can be disabled from recording and reproduction based on the information.

In the lead-in zone, a test write area OPC and a defect management area DMA are provided within the range from 23.1 to 24 mm in radius.

The test write area OPC is used for test writing upon setting of recording and/or reproduction conditions of phase change marks such as laser powers upon recording/reproduction.

The defect management area DMA is provided to record and reproduce information for managing defect information on the disk thereon and therefrom.

The range from 24.0 to 58.0 mm in radius is set as the data zone. The data zone is a region into and from which user data are actually recorded and reproduced as phase change marks.

The range from 58.0 to 58.5 mm in radius is set as the lead-out zone. The lead-out zone includes a defect management area similar to that in the lead-in zone and is further used as a buffer area for allowing an overrun upon seeking.

The range from 23.1 mm in diameter, that is, the test write area, to the lead-out zone is the RW zone (recording and reproduction region) into and from which phase change marks are recorded and reproduced.

FIGS. 14A and 14B show a manner of the tracks in the RW zone and the PB zone, respectively. FIG. 14A shows wobbling of the groove in the RW zone while FIG. 14B shows wobbling of the groove in the prerecorded zone of the PB zone.

In the RW zone, address information (ADIP) is formed in advance by wobbling the groove formed spirally on the disk in order to allow tracking.

Into and from the groove on which the address information is formed, information is recorded and reproduced as phase change marks.

As shown in FIG. 14A, the groove in the RW zone, that is, the groove tracks on which the ADIP address information is formed, have a track pitch TP=0.32 μm.

On the tracks, recording marks each in the form of a phase change mark are recorded. The phase change marks are recorded in a linear density of 0.12 μm/bit, 0.08 μm/ch bit in accordance with the RLL (1, 7) PP modulation method (RLL; Run Length Limited, PP: Parity Preserve/Prohibit rmtr (repeated minimum transition runlength)) or a like method.

Where a 1 ch bit is 1 T, the mark length ranges from 2 T to 8 T, and the smallest mark length is 2 T.

The address information is recorded in a wobbling period of 69 T and a wobbling amplitude WA of approximately 20 nm(p-p).

The address information and the phase change marks are recorded such that the wavelength bands thereof do not overlap with each other so that they may not have an influence on detection thereof.

The CNR (carrier noise ratio) of the wobbling of the address information is 30 dB after recording where the band width is 30 KHz, and the address error rate is lower than $1 \times 10^{-3}$ including the influence of a stepping movement (a skew of the disk, defocusing, a disturbance and so forth).

Meanwhile, the tracks formed from the groove in the PB zone of FIG. 14B have a greater track pitch and a greater wobbling amplitude than the tracks formed from the groove in the RW zone of FIG. 14A.

In particular, the track pitch TP is 0.35 μm, and the wobbling period is 36 T and the wobbling amplitude WA is approximately 40 nm(p-p). The fact that the wobbling period is 36 T signifies that the recording linear density of prerecorded information is higher than the recording linear density of the ADIP information. Further, since the shortest phase change mark is 2 T, the recording linear density of the prerecorded information is lower than the recording linear density of the phase change marks.

No phase change mark is recorded onto the tracks in the PB zone.

The wobbling waveform is formed in a sine waveform in the RW zone, but may be recorded in a sine waveform or a rectangular waveform in the PB zone.

It is known that, if the phase change marks have a signal quality of a CNR of approximately 50 dB where the band width is 30 KHZ, then by recording and reproducing data with ECCs (error correction codes) added thereto, a symbol error rate lower than $1 \times 10^{-16}$ after error correction can be achieved. Therefore, the phase change marks can be used for recording and reproduction of data.

The CNR of the wobbles regarding the ADIP address information is 35 dB in a non-recorded state of phase change marks where the band width is 30 KHz.

Such a degree of signal quality as just described is sufficient for the address information if interpolation protection based on continuity discrimination is performed. However, for the prerecorded information to be recorded in the PB zone, a degree of signal quality higher than the CNR of 50 dB equal to that of the phase change marks should be secured. Therefore, in such a PB zone as shown in FIG. 14B, a groove physically different from the groove in the RW zone is formed.

First, by making the track pitch wider, the crosstalk from adjacent tracks can be suppressed, and by doubling the wobble amplitude, the CNR can be improved by +6 dB.

Furthermore, by using a rectangular wave as the wobble waveform, the CNR can be improved by approximately +2 dB.

The totaling CNR is 43 dB.

The recording bands of the phase change marks and the wobbles in the prerecorded data zone are different from each other and are 18 T (18 T is one half of 36 T) for the wobbles and 2 T for the phase change marks, and in this regard, a CNR of 9.5 dB is obtained.

Accordingly, the CNR of the prerecorded information is equivalent to 52.5 dB, and even if −2 dB is estimated as a crosstalk amount from adjacent tracks, the CNR is equivalent to 50.5 dB. In short, a degree of signal quality substantially equal to that of the phase change marks is obtained, and the wobbling signal can be used appropriately for recording and reproduction of prerecorded information.

Figure 15:
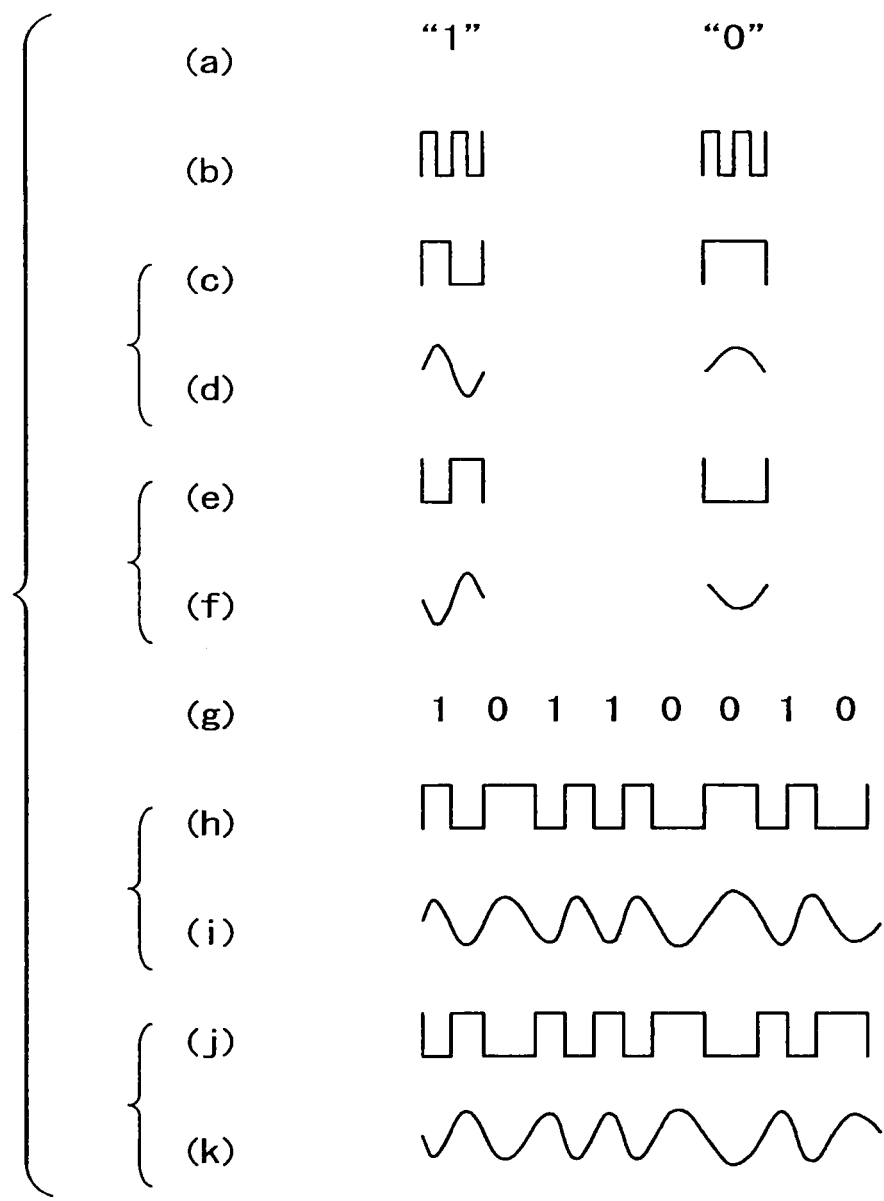
FIG. 15 is a diagrammatic view illustrating a modulation method of prerecorded information of the embodiment.

FIG. 15 illustrates a modulation method of prerecorded information for forming a wobbled groove in the prerecorded data zone.

An FM code is used for the modulation.

Data bits are illustrated in (a) of FIG. 15; channel clocks in (b) of FIG. 15; FM codes in (c) of FIG. 15; and wobble waveforms in (d) of FIG. 15, in a vertically juxtaposed relationship.

1 bit of data is 2 ch (a 2-channel clock), and when the bit information is "1", the FM code is represented in a frequency of one half that of the channel clock.

On the other hand, when the bit information is "0", the FM code is represented in a frequency equal to one half that when the bit information is "1".

As regards the wobble waveform, an FM code may be recorded directly in the form of a rectangular wave, but may otherwise be recorded in the form of a sine wave as seen in (d) of FIG. 15.

It is to be noted that the FM code and the wobble waveform may have such patterns as shown in (e) and (f) of FIG. 15 as the patterns of the opposite polarity to those of (c) and (d) of FIG. 15, respectively.

In such rules for FM code modulation as described above, the FM code waveform and the wobble waveform (sine waveform) where the data bit stream is "10110010" as seen in (g) of FIG. 15 are such as shown in (h) and (i) of FIG. 15, respectively.

It is to be noted that, where the patterns shown in (e) and (f) of FIG. 15 are used, the FM code waveform and the wobble waveform (sine waveform) are such as illustrated in (j) and (k) of FIG. 15.

2-2. ECC Format of the Data

An ECC format for phase change marks and prerecorded information is described with reference to FIGS. 16, 17, 18A and 18B.

Figure 16:
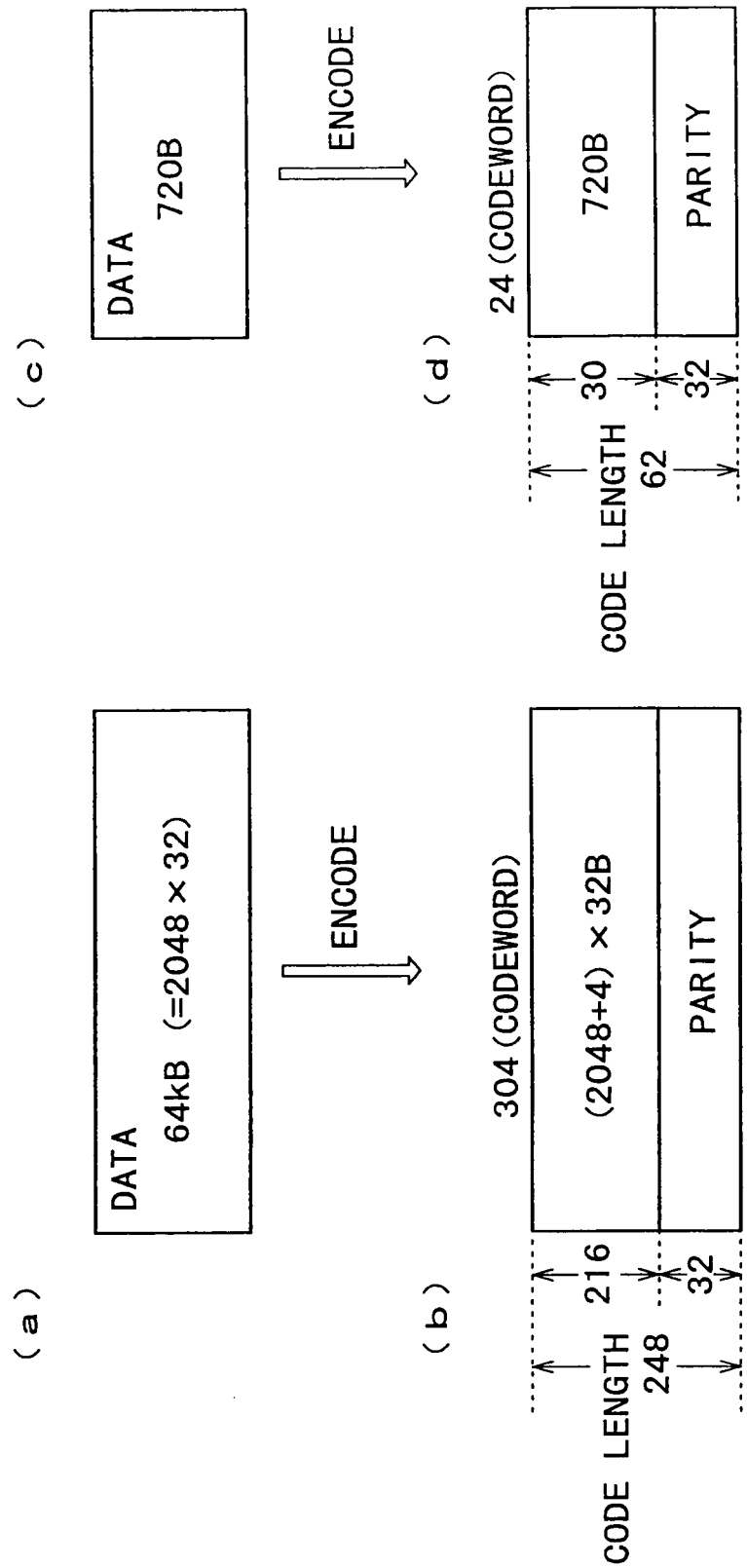
FIG. 16 is a schematic view illustrating an ECC structure of a phase change mark of the embodiment.

First, FIG. 16 shows an ECC format for main data (user data) to be recorded and reproduced in the form of a phase change mark.

As an ECC (Error Correction Code), two codes of an LDC (long distance code) for main data of 64 KB (=2,048 bytes of 1 sector×32 sectors) and a BIS (Burst Indicator Subcode) are available.

Main data of 64 KB illustrated in (a) of FIG. 16 is ECC encoded in such a manner as seen in (b) of FIG. 16. In particular, an EDC (error detection code) of 4 B is added to the main data of 1 sector of 2,048 B, and the LDC is encoded for the 32 sectors. The LDC is an RS(248, 216, 33), that is, an RS (Reed Solomon) code of the code length 248, data 216 and distance 33. 304 codewords are involved.

Meanwhile, for the BIS, data of 720 B shown in (c) of FIG. 16 is ECC encoded as seen in (d) of FIG. 16. In particular, the BIS is an RS(62, 30, 33), that is, an RS (Reed Solomon) code of the code length 62, data 30 and distance 33. 24 codewords are involved.

FIG. 18A shows a frame structure for main data in the RW zone.

The data of the LDC described above and the BIS form the frame structure shown. In particular, one frame has a structure of 155 B which includes data (38 B), a BIS (1 B), data (38 B), a BIS (1 B), data (38 B), a BIS (1 B), data (38 B) disposed in order therein. In short, one frame is formed from data of 38 B×4=152 B and BISs of 1 B each inserted for each 38 B.

A frame sync FS (frame synchronizing signal) is disposed at the top of one frame of 155 B. One block includes 496 frames.

The LDC data are disposed such that even-numbered codewords such as 0th, 2nd, . . . codewords are positioned at even-numbered frames such as 0th, 2nd, frames and odd-numbered codewords such as 1st, 3rd, . . . codewords are positioned at odd-numbered frames such as 1st, 3rd, . . . frames.

For the BIS, a code having a much higher correction capability than the code of the LDC is used, and almost all errors are corrected. In short, the BIS uses a code whose distance is 33 while the code length is 62.

Therefore, a symbol of BIS from within which an error is detected can be used in the following manner.

Upon decoding of an ECC, the BISs are decoded first. If two adjacent ones of the BISs and the frame sync FS in the frame structure of FIG. 18A are in error, the data 38 B sandwiched between them is regarded as burst error data. An error pointer is added to the data 38 B. The LDC uses the error pointer to perform pointer erasure correction.

Consequently, the correction capability can be raised when compared with correction only by the LDC.

The BIS includes address information and so forth. The address is used where address information by a wobbling groove is not available as in the case of a ROM type disk or in a like case.

Figure 17:
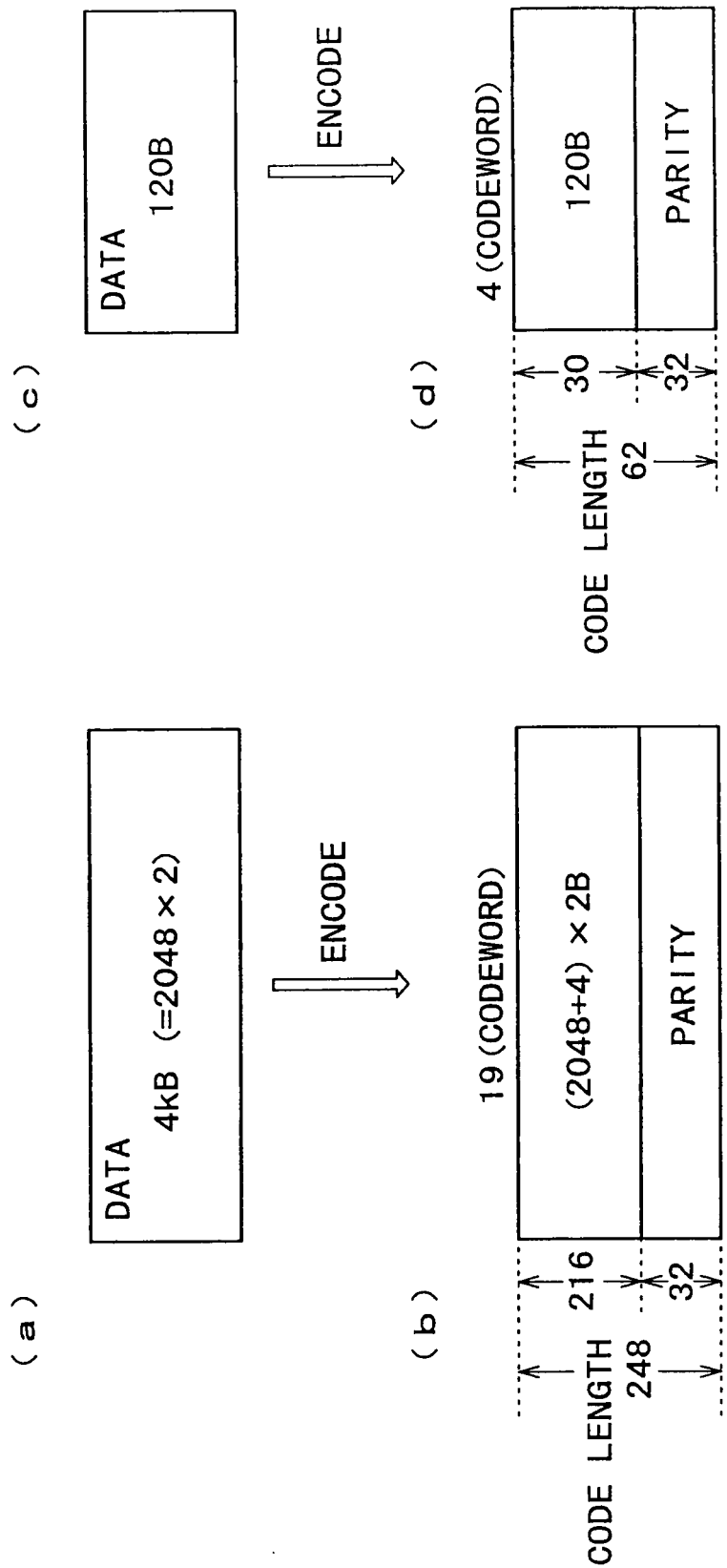
FIG. 17 is a schematic view illustrating an ECC structure of prerecorded information of the embodiment.

An ECC format for the prerecorded information is shown in FIG. 17.

In this instance, for the ECC, two codes are available including an EDC (Long Distance Code) for main data of 4 KB (1 sector 2,048 B×2 sectors) and a BIS (Burst Indicator Subcode).

Data of 4 KB as prerecorded information illustrated in (a) of FIG. 17 is ECC encoded as seen in (b) of FIG. 17. In particular, an EDC (Error Detection Code) of 4 B is added to the main data 1 of one sector of 2,048 B, and the LDC is encoded for the 2 sectors. The LDC is an RS(248, 216, 33), that is, an RS (Reed Solomon) code of the code length 248, data 216 and distance 33. 19 codewords are involved.

Meanwhile, for the BIS, data of 120 B shown in (c) of FIG. 17 is ECC encoded as seen in (d) of FIG. 17. In particular, the BIS is an RS(62, 30, 33), that is, an RS (Reed Solomon) code of the code length 62, data 30 and distance 33. Four codewords are involved.

FIG. 18B shows a frame structure for the prerecorded information in the PB zone.

The data of the LDC described above and the BIS form the frame structure shown. In particular, one frame has a structure of 21 B which includes a frame sync FS (1 B), data (10 B), a BIS (1 B), data (9 B) disposed in order therein. In short, one frame is formed from data of 19 B and BIS of 1 B inserted in the data.

A frame sync FS (frame synchronizing signal) is disposed at the top of one frame. One block includes 248 frames.

Also in this instance, for the BIS, a code having a much higher correction capability than the code of the LDC is used, and almost all errors are corrected. Therefore, a symbol of the BIS from within which an error is detected can be used in the following manner.

Upon decoding of an ECC, the BIS is decoded first. If two adjacent ones of the BISs and the frame sync FS are in error, the data 10 B or 9 B sandwiched between them is regarded as burst error data. An error pointer is added to the data 10 B or 9 B. The LDC uses the error pointer to carry out pointer erasure correction.

Consequently, the correction capability can be raised when compared with correction only by the LDC.

The BIS includes address information and so forth. In the prerecorded data zone, prerecorded information is recorded in the form of a wobbling groove, and accordingly, address information by a wobbling groove is not involved. Therefore, an address included in the BIS is used for accessing.

As can be seen from FIGS. 16 and 17, the data and the prerecorded information in the form of phase change marks adopt the same code and structure for the ECC format.

This signifies that an ECC decoding process for the prerecorded information can be executed by a circuit system which performs an ECC decoding process upon reproduction of data in the form of phase change marks and the disk drive apparatus can improve the efficiency in hardware configuration.

2-3. Address Format 2-3-1. Relationship Between Recording and Reproduction Data and Addresses The unit in recording and reproduction of the DVR disk of the present embodiment is a recording and reproduction cluster of totaling 498 frames formed by adding a link area for a PLL and so forth of one frame to each of the top and the bottom of an ECC block of 156 symbols×496 frames shown in FIGS. 18A to 18B. The recording and reproduction cluster is called RUB (Recording Unit Block).

Figure 19A:
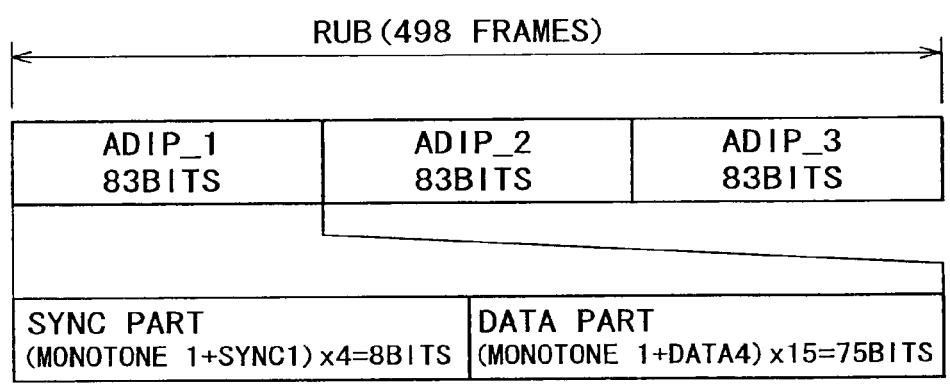
FIGS. 19A and 19B are diagrammatic views illustrating a relationship between a RUB and an address unit of the disk of the embodiment and a bit block which forms an address unit.

In the address format of the disk 1 of the present embodiment, one RUB (498 frames) is managed in three address units (ADIP_1, ADIP_2 and ADIP_3) recorded as wobbles as seen in FIG. 19A. In other words, one RUB is recorded for the three address units.

Figure 19B:
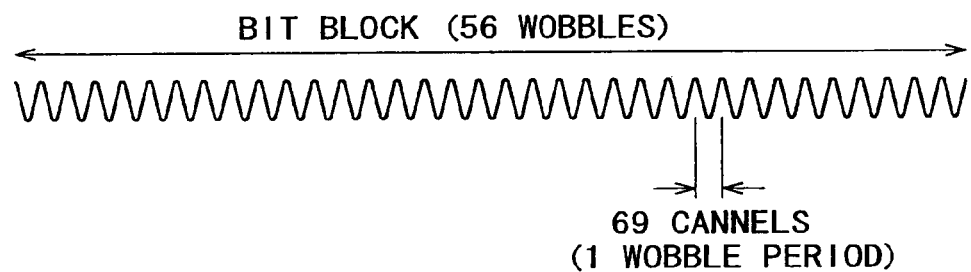

In the address format, one address unit is formed from totaling 83 bits including 8 bits of a sync part and 75 bits of a data part. In the address format, a reference carrier signal for a wobble signal to be recorded on a pregroove is a cosine signal ($\cos(\omega t)$), and 1 bit of the wobble signal is formed from 56 periods of the reference carrier signal as seen in FIG. 19B. Accordingly, the length of one period (1 wobble period) of the reference carrier signal is equal to 69 times the length of one channel of phase changes. The reference carrier signal for 56 periods which forms one bit is hereinafter referred to as bit block.

2-3-2. Sync Part

FIG. 20 shows a bit configuration of the sync part in the address unit. The sync part is a portion for identifying the top of the address unit and is formed from four first to fourth sync blocks (sync block "1", sync block "2", sync block "3" and sync block "4"). Each sync block is formed from two bit blocks including a monotone bit and a sync bit.

In a signal waveform of a monotone bit, as shown in FIG. 21A, the first to third wobbles of the bit block formed from 56 wobbles are formed as a bit synchronization mark BM, and the fourth to fifty sixth wobbles following the bit synchronization mark BM are formed as monotone wobbles (a signal waveform of a reference carrier signal ($\cos(\omega t)$)).

The bit synchronization mark BM is a signal waveform generated by MSK modulating modulation object data of a predetermined code pattern for identifying the top of a bit block. In particular, the bit synchronization mark BM is a signal waveform generated by differentially coding modulation object data of a predetermined code pattern and allocating a frequency in accordance with the sign of the differentially coded data. It is to be noted that the minimum code length L of the modulation object data is equal to twice the wobble period. In the present example, a signal waveform obtained by MSK modulating modulation object data wherein the value for one bit (for two wobble periods) is "1" is recorded as the bit synchronization mark BM. In particular, the bit synchronization mark BM exhibits a signal waveform wherein waveforms of "$\cos(1.5\,\omega t)$, $-\cos(\omega t)$, $-\cos(1.5\,\omega t)$" appear successively in a unit of the wobble period.

Accordingly, the monotone bit can be generated by generating such modulation object data (having a code length corresponding to 2 wobble periods) as "10000 . . . 00" as seen in FIG. 21B and then MSK modulating the modulation object data.

It is to be noted that the bit synchronization mark BM is inserted not only into the monotone bit of the sync part but also to the top of all bit blocks described below. Accordingly, upon recording or reproduction, if the bit synchronization mark BM is detected and used for synchronization, then synchronism of the bit blocks in the wobble signal (that is, synchronism in the period of 56 periods) can be established. Furthermore, the bit synchronization mark BM can be used as a reference for specifying the insertion position of various modulation signals hereinafter described into the bit block.

In the signal waveform of the sync bit of the first sync block (sync "0" bit), as shown in FIG. 22A, the first to third wobbles of a bit block formed from 56 wobbles form a bit synchronization mark BM, and the 17th to 19th wobbles and the 27th to 29th wobbles individually form an MSK modulation mark MM while the remaining waveform of the wobbles are all monotone wobbles.

In the signal waveform of the sync bit of the second sync block (sync "1" bit), as shown in FIG. 23A, the first to third wobbles of a bit block formed from 56 wobbles form a bit synchronization mark BM, and the 19th to 21st wobbles and the 29th to 31st wobbles individually form an MSK modulation mark MM while the remaining waveform of the wobbles are all monotone wobbles.

In the signal waveform of the sync bit of the third sync block (sync "2" bit), as shown in FIG. 24A, the first to third wobbles of a bit block formed from 56 wobbles form a bit synchronization mark BM, and the 21st to 23rd wobbles and the 31st to 33rd wobbles individually an MSK modulation mark MM while the remaining waveform of the wobbles are all monotone wobbles.

In the signal waveform of the sync bit of the fourth sync block (sync "3" bit), as shown in FIG. 25A, the first to third wobbles of a bit block formed from 56 wobbles form a bit synchronization mark BM, and the 23rd to 25th wobbles and the 33rd to 35th wobbles individually form an MSK modulation mark MM while the remaining waveform of the wobbles are all monotone wobbles.

The MSK synchronization mark is a signal waveform generated by MSK modulating modulation object data of a predetermined code pattern similarly to the bit synchronization mark BM. In particular, the MSK synchronization mark is a signal waveform generated by differentially coding modulation object data of a predetermined code pattern and allocating a frequency in response to the code of the differentially coded data. It is to be noted that the minimum code length L of the modulation object data is equal to twice the wobble period. In the present example, a signal waveform obtained by MSK modulating modulation object data wherein the value for one bit (for two wobble periods) is "1" is recorded as the bit synchronization mark BM. In particular, the bit synchronization mark BM exhibits a signal waveform wherein waveforms of "Cos(1.5ωt), −Cos(ωt), −Cos(1.5 (ωt)" appear successively in a unit of the wobble period.

Accordingly, the sync bit of the first sync block (the sync "0" bit) can be generated by generating and MSK modulating such a data stream (having a code length equal to 2 wobble periods) as shown in FIG. 22B. Similarly, the sync bit of the second sync block (the sync "1" bit) can be generated by generating and MSK modulating such a data stream as shown in FIG. 23B. The sync bit of the third sync block (the sync "2" bit) can be generated by generating and MSK modulating such a data stream as shown in FIG. 24B. The sync bit of the first sync block (the sync "3" bit) can be generated by generating and MSK modulating such a data stream as shown in FIG. 25B.

It is to be noted that the insertion pattern of the two MSK modulation marks MM into the bit block is unique from the insertion patterns of the MSK modulation marks MM into the other bit blocks. Therefore, upon recording and reproduction, synchronism of an address unit can be established by MSK demodulating the wobble signal to discriminate the insertion pattern of the MSK modulation marks MM in the bit block and discriminating at least one of the four sync bits, and demodulation and decoding of the data part described below can be performed accordingly.

2-3-3. Data Part

Figure 26:
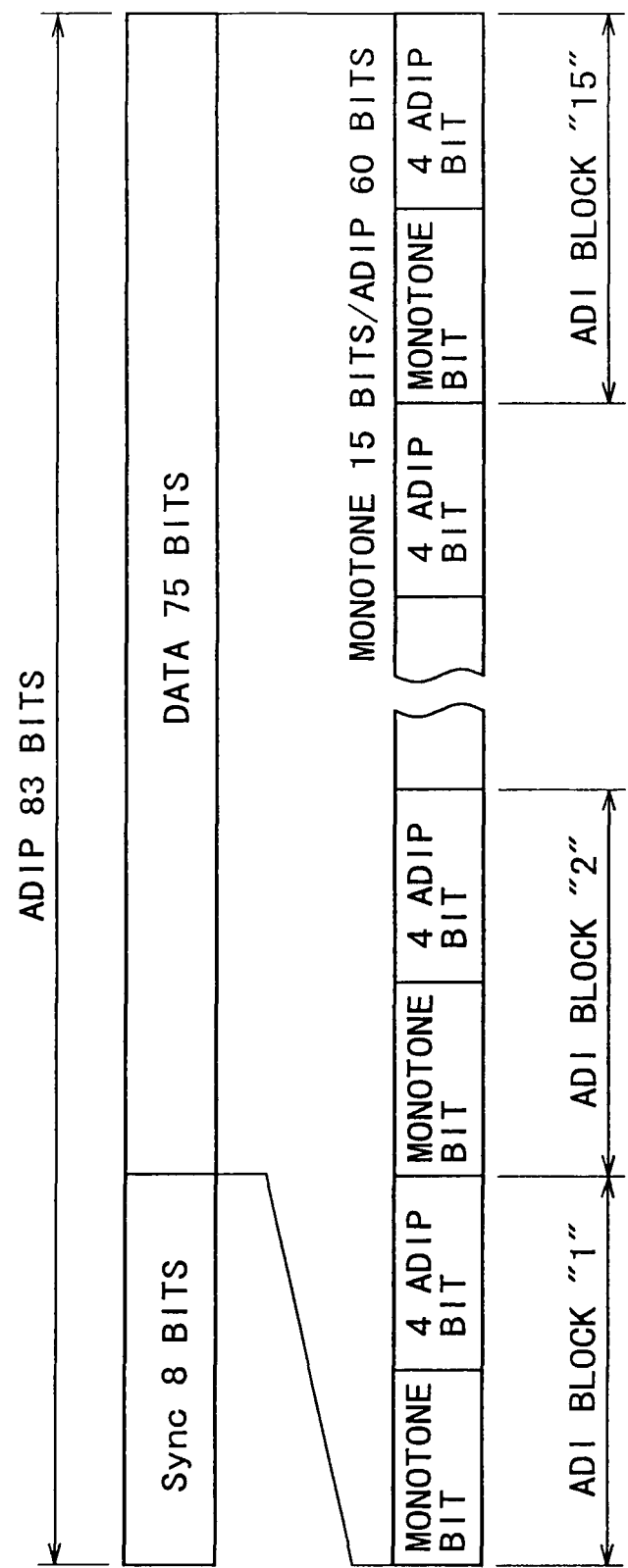
FIG. 26 is a diagrammatic view illustrating a bit configuration of a data part in the address unit of the embodiment.

FIG. 26 shows a bit configuration of the data part in an address unit. The data part is a portion in which actual data of address information is placed and is formed from 15 first to fifteenth ADIP blocks (ADIP block "1" to ADIP block "15"). Each ADIP block includes one monotone bit and four ADIP bits.

The monotone bit has a signal waveform similar to that shown in FIG. 21A. Each of the ADIP bits represents one bit of actual data, and a different signal waveform is exhibited depending upon the contents of the code of the 1 bit.

Figure 27:
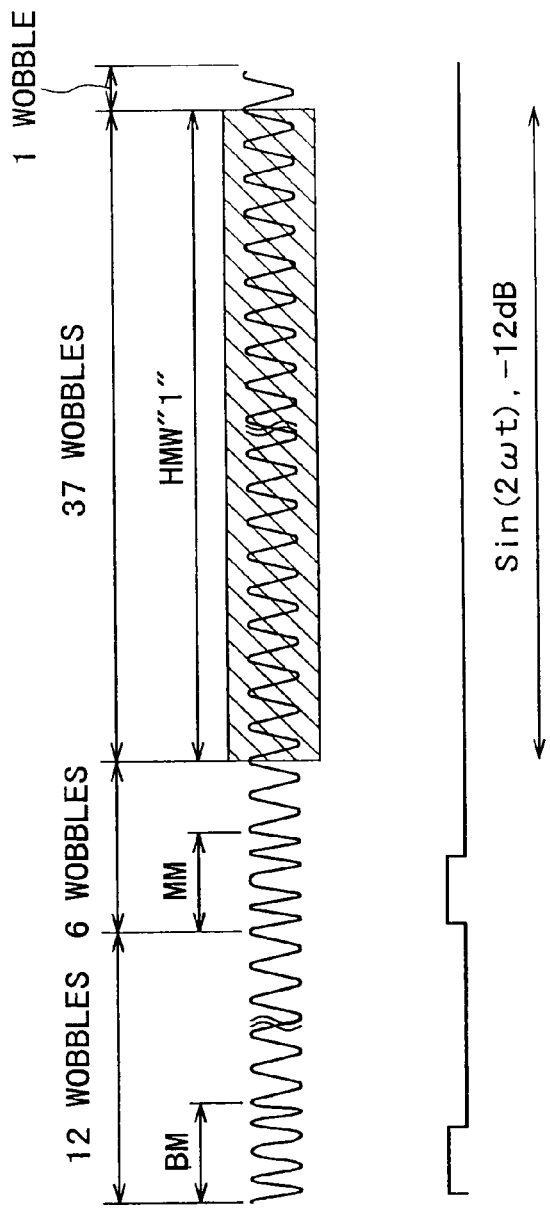
FIGS. 27A to 27C are diagrammatic views illustrating a signal waveform of ADIP bits representative of a bit "1" of the data part of the embodiment and modulation object data.
Figure 28:
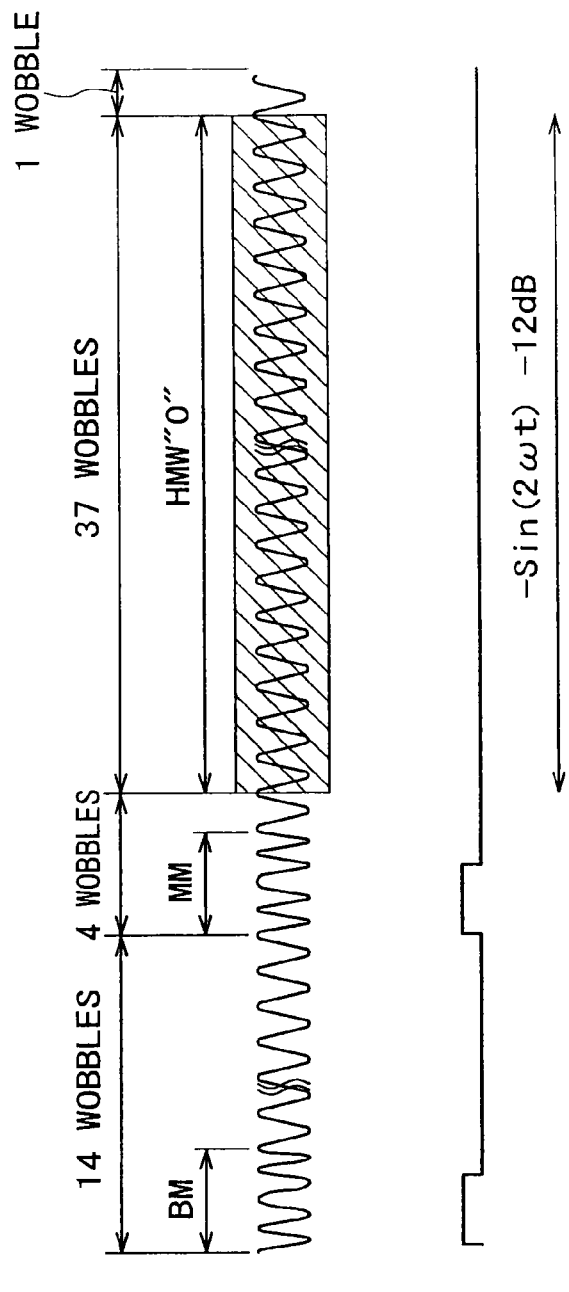
FIGS. 28A to 28C are diagrammatic views illustrating a signal waveform of ADIP bits representative of a bit "0" of the data part of the embodiment and modulation object data.

If the code contents represented by an ADIP bit are "1", then the first to third wobbles of the bit block formed from 56 wobbles form a bit synchronization mark BM and the 13th to 15th wobbles form an MSK modulation mark MM, and the 19th to 55th wobbles form a modulation part of the HMW "1" wherein Sin(2 ωt) is added to the reference carrier signal (Cos(ωt)) while all the remaining wobbles have a waveform of monotone wobbles. In particular, an ADIP bit whose code contents represent "1" can be generated by generating and MSK modulating such a modulation object data (having a code length equal to 2 wobble periods) as "100000100 . . . 00" as seen in FIG. 27B and adding Sin(2 ωt) having an amplitude of −12 dB to the 19th to 55th wobbles of the signal waveform after the MSK modulated as seen in FIG. 27C.

Where the code contents represented by an ADIP bit are "0", the first to third wobbles of the bit block formed from 56 wobbles form a bit synchronization mark BM and the 15th to 17th wobbles form an MSK modulation mark MM, and the 19th to 55th wobbles form a modulation part of the HMW "0" wherein −Sin(2 ωt) is added to the reference carrier signal (Cos(ωt)) while all the remaining wobbles have a waveform of monotone wobbles. In particular, an ADIP bit whose code contents are "0" can be generated by generating and MSK modulating such a modulation object data (having a code length equal to 2 wobble periods) as "100000010 . . . 00" as seen in FIG. 28B and adding −Sin(2 ωt) having an amplitude of −12 dB to the 19th to 55th wobbles of the signal waveform after the MSK modulated as seen in FIG. 28C.

As described above, the bit contents of the ADIP bits are distinguished depending upon the inserted position of the MSK modulation mark MM. In particular, if the MSK modulation mark MM is inserted in the 13th to 15th wobbles, then this represents that the ADIP bit is "1", but if the MSK modulation mark MM is inserted in the 15th to 17th wobbles, then this represents that the ADIP bit is "0". Further, the ADIP bits represent bit contents same as the bit contents represented by the inserted position of the MSK modulation mark MM in HMW modulation. Accordingly, since the ADIP bits represent the same bit contents in the two different modulation methods, decoding of data can be performed with certainty.

Figure 29:
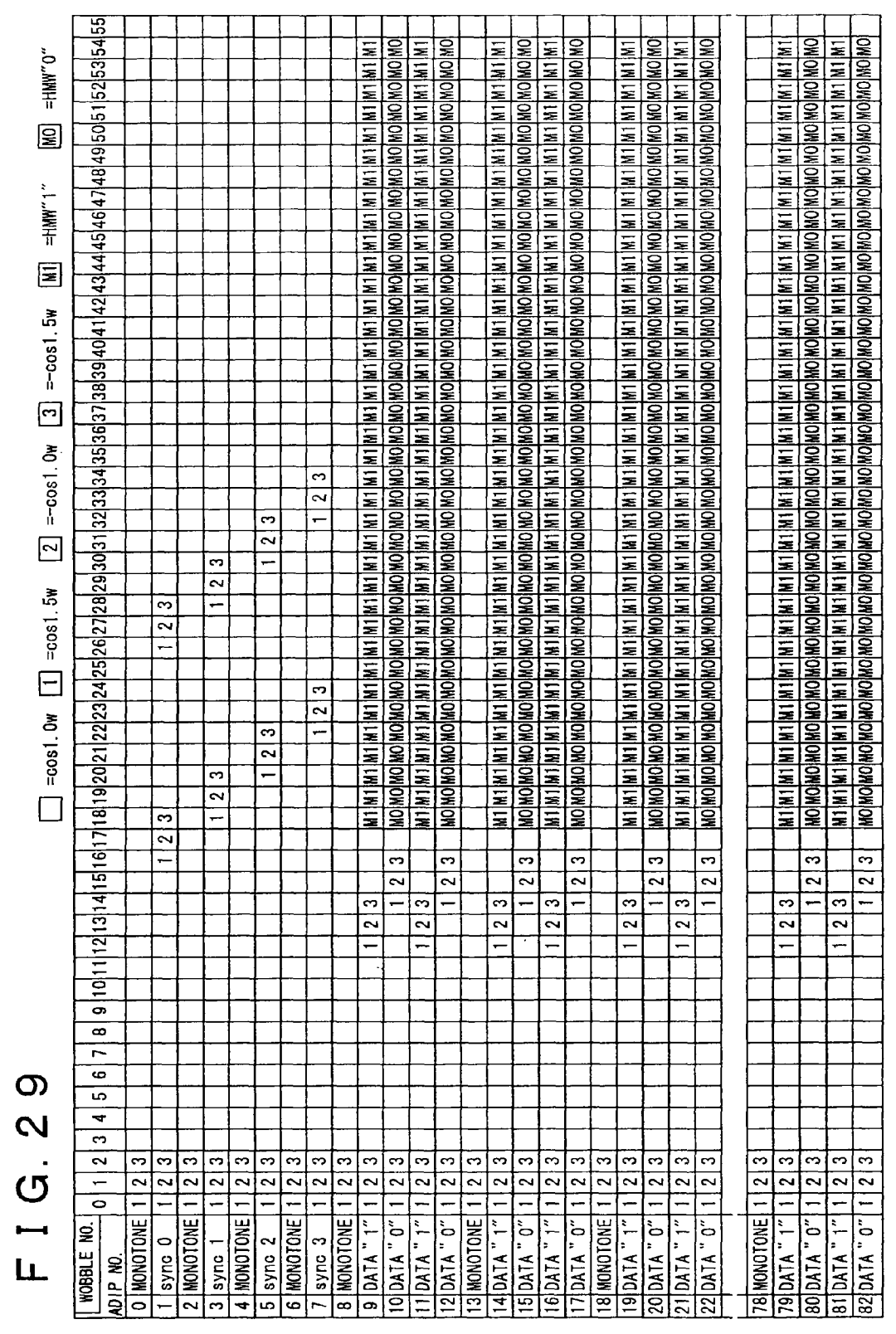

A format of an address unit wherein such a sync part and a data part as described above are represented compositely is shown in FIG. 29.

According to the address format of the disk 1 of the present embodiment, bit synchronization marks BM, MSK modulation marks MM and HMW modulation parts are disposed discretely in one address unit. Then, monotone wobbles for more than at least one wobble period are disposed between adjacent modulation signal parts. Accordingly, no interference occurs between the modulation signals, and the individual signals can be demodulated with certainty.

2-3-4. Contents of the Address Information

The address format of the ADIP information recorded in such a manner as described above is such as illustrated in FIG. 30.

The ADIP address information includes 36 bits, and 24 parity bits are added to them.

The ADIP address information of 36 bits includes 3 bits of a layer number (layer no. bit 0 to layer no. bit 2) for multi-layer recording, 19 bits (RUB no. bit 0 to layer no. bit 18) for a RUB (Recording Unit Block), and 2 bits (address no. bit 0, address no. bit 1) for three address blocks for 1 RUB.

Further, 12 bits are prepared for AUX data such as a disk ID in which recording conditions such as recording and reproduction laser powers are recorded.

The AUX data is used for data recording of disk information hereinafter described.

An ECC unit for the address data is a unit of totaling 60 bits in this manner and is formed from 15 nibbles (1 nibble=4 bits) of Nibble 0 to Nibble 14 as seen in FIG. 30.

The error correction method is the nibble-based Reed Solomon code RS(15, 9, 7) wherein 1 symbol is formed from 4 bits. In short, 15 nibbles are for the code length, 9 nibbles for the data, and 6 nibbles for the parity.

2-4. Address Demodulation Circuit

Now, an address demodulation circuit for demodulating address information from a DVR disk of the address format described above is explained.

Figure 31:
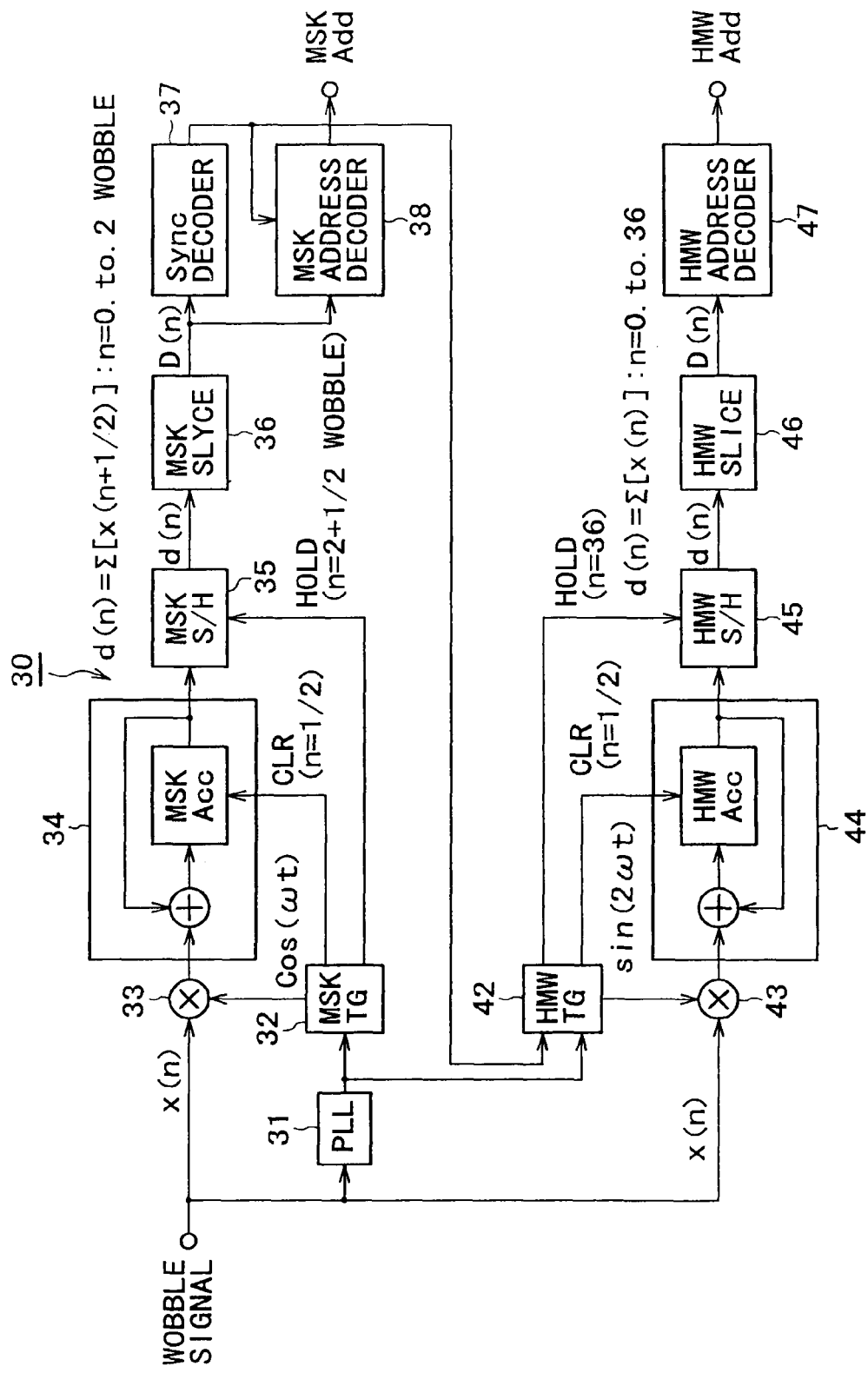
FIG. 31 is a block diagram of an address demodulation circuit of the embodiment.

FIG. 31 is a block diagram showing the address demodulation circuit.

Referring to FIG. 31, the address demodulation circuit 30 includes a PLL circuit 31, an MSK timing generator 32, an MSK multiplier 33, an MSK integrator 34, an MSK sample/hold circuit 35, an MSK slice circuit 36, a Sync decoder 37 and an MSK address decoder 38. The address demodulation circuit 30 further includes an HMW timing generator 42, an HNW multiplier 43, an HMW integrator 44, an HMW sample/hold circuit 45, an HMW slice circuit 46 and an HMW address decoder 47.

A wobble signal reproduced from a DVR disk is inputted to the PLL circuit 31. The PLL circuit 31 detects edge components from the wobble signal inputted thereto to generate a wobble clock synchronized with the reference carrier signal ($\cos(\omega t)$). The generated wobble clock is supplied to the MSK timing generator 32 and the HMW timing generator 42.

The MSK timing generator 32 generates a reference carrier signal ($\cos(\omega t)$) synchronized with the wobble signal inputted thereto. Further, the MSK timing generator 32 generates a clear signal (CLR) and a hold signal (HOLD) from the wobble clock. The clear signal (CLR) is a signal generated at a timing delayed by a ½ wobble period from a start edge of a data clock of the modulation object data whose minimum code length is equal to twice the wobble period. Meanwhile, the hold signal (HOLD) is a signal generated at a timing delayed by a ½ wobble period from an end edge of the data clock of the modulation object data. The reference carrier signal ($\cos(\omega t)$) generated by the MSK timing generator 32 is supplied to the MSK multiplier 33. The clear signal (CLR) generated by the MSK timing generator 32 is supplied to the MSK integrator 34. The hold signal (HOLD) generated by the MSK timing generator 32 is supplied to the MSK sample/hold circuit 35.

The MSK multiplier 33 multiplies the wobble signal inputted thereto by the reference carrier signal ($\cos(\omega t)$) to perform a synchronous detection process. The synchronously detected output signal is supplied to the MSK integrator 34.

The MSK integrator 34 performs an integration process for the signal synchronously detected by the MSK multiplier 33. It is to be noted that the MSK integrator 34 clears its integrated value to zero at a generation timing of the clear signal (CLR) generated by the MSK timing generator 32.

The MSK sample/hold circuit 35 samples the integrated output value of the MSK integrator 34 at a generation timing of the hold signal (HOLD) generated by the MSK timing generator 32 and holds the sampled value until a next hold signal (HOLD) is generated.

The MSK slice circuit 36 binarizes the value held by the MSK sample/hold circuit 35 using the origin (0) as a threshold value and outputs the binarized value with the code reversed.

Then, the output signal of the MSK slice circuit 36 makes a demodulated modulation object data stream.

The Sync decoder 37 detects a sync bit in the sync part from a bit pattern of the demodulation data outputted from the MSK slice circuit 36. The Sync decoder 37 establishes synchronism of the address unit from the detected sync bit. The Sync decoder 37 generates, based on the synchronization timing of the address unit, an MSK detection window representative of the wobble position of MSK modulated data in the ADIP bits of the data part and an HMW detection window representative of the wobble position of HMW modulated data in the ADIP bits of the data part. FIG. 32A illustrates a synchronization position timing of the address unit detected from the sync bit and FIG. 32B illustrates a timing of an MSK detection window while FIG. 32C illustrates a timing of an HMW detection window.

The Sync decoder 37 supplies the MSK detection window to the MSK address decoder 38 and supplies the HMW detection window to the HMW timing generator 42.

The MSK address decoder 38 receives the demodulation stream outputted from the MSK slice circuit 36 as an input thereto, detects the inserted position of the MSK modulation mark MM in an ADIP bit of the demodulated data stream based on the MSK detection window and discriminates code contents represented by the ADIP bit. In particular, if the insertion pattern of the MSK modulation mark of the ADIP bit is such a pattern as shown in FIGS. 27A to 27C, then the code contents of the ADIP bit are discriminated as "1", but if the insertion pattern of the MSK modulation mark of the ADIP bit is such a pattern as shown in FIGS. 28A to 28C, then the code contents of the ADIP bit are discriminated as "0". Then, the MSK address decoder 38 outputs a bit train obtained from a result of the discrimination as MSK address information.

The HMW timing generator 42 generates a second order harmonic signal ($\sin(2\omega t)$) synchronized with the wobble signal inputted thereto from the wobble clock.

Further, the HMW timing generator 42 generates a clear signal (CLR) and a hold signal (HOLD) from the HMW detection window. The clear signal (CLR) is a signal generated at a timing of a start edge of the HMW detection window. Meanwhile, the hold signal (HOLD) is a signal generated at a timing of an end edge of the HMW detection window. The second order harmonic signal ($\sin(2\omega t)$) generated by the HMW timing generator 42 is supplied to the HMW multiplier 43. The clear signal (CLR) generated by the HMW timing generator 42 is supplied to the HMW integrator 44. The hold signal (HOLD) generated by the HMW timing generator 42 is supplied to the HMW sample/hold circuit 45.

The HMW multiplier 43 multiplies the wobble signal inputted thereto by the second order harmonic signal ($\sin(2\omega t)$) to perform a synchronous detection process. The synchronously detected output signal is supplied to the HMW integrator 44.

The HMW integrator 44 performs an integration process for the signal synchronously detected by the HMW multiplier 43. It is to be noted that the HMW integrator 44 clears its integrated value to zero at a generation timing of the clear signal (CLR) generated by the HMW timing generator 42.

The HMW sample/hold circuit 45 samples the integrated output value of the HMW integrator 44 at a generation timing of the hold signal (HOLD) generated by the HMW timing generator 42 and holds the sampled value until a next hold signal (HOLD) is generated. In particular, since the HMW modulated data is for 37 wobbles in one bit block, if the clear signal (HOLD) is generated at n=0 (n indicates the wobble number) as seen in FIG. 32D, then the HMW sample/hold circuit 45 samples the integrated value at n=36 as seen in FIG. 32E.

The HMW slice circuit 46 binarizes the value held by the HMW sample/hold circuit 45 using the origin (0) as a threshold value and outputs the code of the binarized value.

Then, the output signal of the HMW slice circuit 46 makes a demodulated data stream.

The HMW address decoder 47 discriminates code contents represented by each ADIP bit from the demodulated data stream. Then, the HMW address decoder 47 outputs a bit train obtained from a result of the discrimination as HMW address information.

FIGS. 33A to 33C show signal waveforms when an ADIP bit whose code contents are "1" is HMW demodulated by the address demodulation circuit 30. It is to be noted that the axis of abscissa (n) of FIGS. 33A to 33C indicates the period number of the wobble period. FIG. 33A shows the reference carrier signal ($\cos(\omega t)$), the modulation object data whose code contents are "1" and a second order harmonic signal waveform ($\sin(2\omega t)$, −12 dB) formed based on the modulation object data. FIG. 33B shows a generated wobble signal. FIG. 33C shows a synchronous detection output signal (HMW×$\sin(2\omega t)$) of the wobble signal, an integrated output value of the synchronous detection output signal, a hold value of the integrated output value and demodulated modulation object data outputted from the HMW slice circuit 46.

FIGS. 34A to 34C show signal waveforms when an ADIP bit whose code contents are "0" is HMW demodulated by the address demodulation circuit 30. It is to be noted that the axis of abscissa (n) of FIGS. 34A to 34C indicates the period number of the wobble period. FIG. 34A shows the reference carrier signal ($\cos(\omega t)$), the modulation object data whose code contents are "1" and a second order harmonic signal waveform (−$\sin(2\omega t)$, −12 dB) formed based on the modulation object data. FIG. 34B shows a generated wobble signal. FIG. 34C shows a synchronous detection output signal (HMW×$\sin(2\omega t)$) of the wobble signal, an integrated output value of the synchronous detection output signal, a hold value of the integrated output value and demodulated modulation object data outputted from the HMW slice circuit 46.

As described above, the address demodulation circuit 30 can detect synchronization information of an address unit recorded in an MSK modulated form and perform MSK demodulation and HMW demodulation based on the detection timing.

3. ECC Format of the Disk Information

In the disk of the present example, data of disk information is recorded as additional information in the form of a wobbling groove together with absolution address information of ADIP addresses.

In particular, in the address format of an ECC unit for the ADIP information described above with reference to FIG. 30 includes AUX data of 12 bits (reserve bit 0 to reserve bit 12), and the 12 bits are utilized as disk information.

The disk information is formed from, for example, 112 bytes formed by collecting 12 bits of ECC blocks of ADIP information and includes attributes and control information of the disk as hereinafter described.

Contents of disk information recorded on the disk in advance using AUX data (reserve bit 0 to reserve bit 12) in ADIP information are described with reference to FIG. 35.

FIG. 35 illustrates contents of disk information formed from 112 bytes and indicates the contents for each byte position in the 112 bytes. Further, FIG. 35 indicates the byte number (number of bytes) as a data size of each of the contents.

In 2 bytes of the byte numbers 0 and 1, a code "DI" is recorded as an identifier of the disk information (disc information identifier).

In 1 byte of the byte number 2, the version of the format of the disk information is indicated.

In 1 byte of the byte number 4, the frame number in the disk information block is indicated.

In 1 byte of the byte number 5, the number of frames in the disk information block is indicated.

In 1 byte of the byte number 6, the byte number used in the frame of the disk information block is indicated.

In 3 bytes of the byte numbers 8 to 10, a code representative of a disk type such as a rewritable/ROM type is recorded.

In 1 byte of the byte number 11, a disk diameter such as, for example, 120 mm is indicated as a disk size and a format version is indicated.

In 1 byte of the byte number 12, the number of layers of a multi-layer disk is indicated as a disk structure.

In 1 byte of the byte number 13, a channel density, that is, a capacity, is indicated.

In 1 byte of the byte number 16, presence or absence of a BCA is indicated.

In 1 byte of the byte number 17, a maximum transfer rate of an application is indicated.

In 8 bytes of the byte numbers 24 to 31, the last address of the data user are is indicated.

In 4 bytes of the byte numbers 32 to 35, a recording speed is indicated.

In 4 bytes of the byte numbers 36 to 39, a maximum DC reproduction power is indicated.

In 4 bytes of the byte numbers 40 to 43, a maximum reproduction power when high frequency modulation is applied is indicated.

In 8 bytes of the byte numbers 48 to 55, a recording power at a nominal recording speed is indicated.

In 8 bytes of the byte numbers 56 to 63, a recording power at a maximum recording speed is indicated.

In 8 bytes of the byte numbers 64 to 71, a recording power at a minimum recording speed is indicated.

In 1 byte of the byte number 72, a recording multi-pulse width is indicated.

In 3 bytes of the byte numbers 73 to 75, a first recording pulse width is indicated.

In 3 bytes of the byte numbers 76 to 78, a first recording pulse position at the nominal recording speed is indicated.

In 3 bytes of the byte numbers 79 to 81, a first recording pulse position at the maximum recording speed is indicated.

In 3 bytes of the byte numbers 82 to 84, a first recording pulse position at the minimum recording speed is indicated.

In 1 byte of the byte number1 88, an erase multi-pulse width is indicated.

In 3 bytes of the byte numbers 89 to 91, a first erase pulse position at the nominal recording speed is indicated.

In 3 bytes of the byte numbers 92 to 94, a first erase pulse position at the maximum recording speed is indicated.

In 3 bytes of the byte numbers 95 to 97, a first erase pulse position at the minimum recording speed is indicated.

In 1 byte of the byte number 98, a flag bit representative of the polarity of an erase pulse is recorded.

The bytes other than those of the byte numbers given above are all reserved.

Such disk information as described above is recorded at least in the RW zone in the lead-in zone described hereinabove with reference to FIG. 13.

While the inner circumference side of the lead-in zone is formed as a PB zone and has prerecorded data recorded therein, the RW zone into and from which data can be recorded and reproduced in accordance with the phase change recording method is formed next to the PB zone. Recording of absolute addresses (recording in the form of a wobbling groove) as ADIP information is started at the top of the RW zone. Together with the ADIP addresses, the disk information is recorded using the AUX data (reserve bit 0 to reserve bit 12) in the ADIP information.

Since the lead-in zone is a region which is accessed first when the disk is loaded into a disk drive apparatus, where disk information is recorded at least in the lead-in zone, the disk drive apparatus can suitably read in such various kinds of information as described hereinabove with reference to FIG. 35.

It is to be noted that, since the ADIP information is recorded similarly also in the data zone, also it is possible to record the disk information making use of bits as the AUX data into the data zone. In short, the disk information having the configuration described above may be recorded repetitively over the overall area of the RW zone.

For the error correction method for the ADIP information, the nibble based Reed Solomon code RS(15, 9, 7) is described wherein 1 symbol is formed from 4 bits as described hereinabove in connection with the ECC block format of FIG. 30.

For the address information, it is sufficient to use only such an error correction coding method as described above due to the characteristic that the address information is recorded successively on a disk and it does not make a serious problem even if some error occurs therewith.

On the other hand, for the disk information, a higher level error correction method than that for the address information is required because the disk information includes information which makes a reference upon recording and reproduction onto and from the disk 1.

Therefore, in the present example, for the disk information, higher level error correction coding (coding according to a first error correction method) is performed first, and then the disk information is allocated as AUX data (reserve bit 0 to reserve bit 12) to the ADIP format. Accordingly, disk information to be recorded as ADIP data is first subject to coding according to the first error correction method, and then subject to coding according to a second error correction method of the nibble based Reed Solomon code RS(15, 9, 7) so that an ECC block of the ADIP information of 60 bits may be formed. Consequently, dual error correction coding is applied to the disk information.

Furthermore, in the present example, coding similar to error correction coding for user data which is recorded and reproduced in accordance with the phase change recording method is applied to the error correction coding for the disk information so that a higher error correction capability may be obtained.

The error correction coding method for user data (main data) has been described hereinabove with reference to FIG. 16. In particular, for user data of 64 KB, the RS(248, 216, 33), that is, the RS (Reed Solomon) code of the code length 248, data 216 and distance 33, is used for the LDC.

FIG. 36 illustrates an LDC in the form of data of 216 bytes and a parity of 32 bytes as a 1 ECC codeword of 248 bytes.

Figure 37:
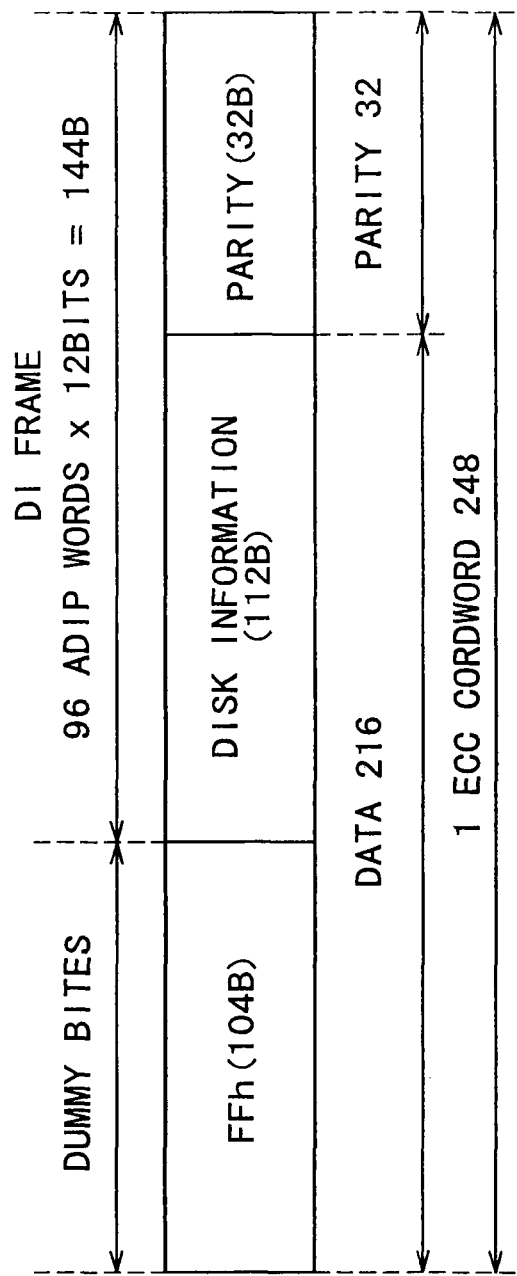
FIG. 37 is a diagrammatic view illustrating an ECC format for disk information of the embodiment.

Also for the disk information, the RS(248, 216, 33), that is, the RS (Reed Solomon) code of the code length 248, data 216 and distance 33, is used similarly for the LDC. FIG. 37 shows the ECC format for the disk information.

The AUX data is formed from 12 bits for 1 ADIP word (the format of FIG. 30), in short, from 1.5 bytes.

A frame (DI frame) of the disk information is formed from 96 ADIPs, that is, from 144 bytes.

The information amount of the disk information of 1 DI frame is 112 bytes as seen in FIG. 35.

To the 112 bytes, 104 bytes of data "FFh (=11111111)" are added as dummy data to obtain data of 216 bytes.

FIG. 37 shows an ECC format wherein a parity of 32 bytes is added to the data of 216 bytes.

In this instance, the data is an RS code of the code length 248, data 216, distance 33 and parity 32.

In short, the ECC format is an ECC format according to the LDC (long distance code) same as that for user data described hereinabove with reference to FIG. 16.

By this, the disk information becomes data having a high level error correction capability similar to that for user data, and consequently, the reliability is augmented.

Further, the disk information is incorporated into ADIP information and formed as data for reproduction only which is recorded in the form of a wobbling groove, and since it is not recorded in the form of emboss pits, it is suitable for a high density disk like the present embodiment.

Further, in a disk drive apparatus, there is no necessity to provide a new circuit system for an error correction process upon reproduction of the disk information. This is because the circuit section for performing an error correction process for user data can be used commonly.

Furthermore, the dummy data need not be recorded on the disk 1. In particular, when an error correction process is performed upon error correction coding or upon reproduction, 104 bytes of the dummy data "FFh" may be added to 1 ECC code.

Therefore, the number of symbols to be recorded on the disk 1 can be reduced and the recording linear density can be increased to raise reliability or the recording capacity can be increased.

4. Disk Drive Apparatus

Now, a disk drive apparatus which can record/reproduce such a disk 1 as described above is explained.

Figure 38:
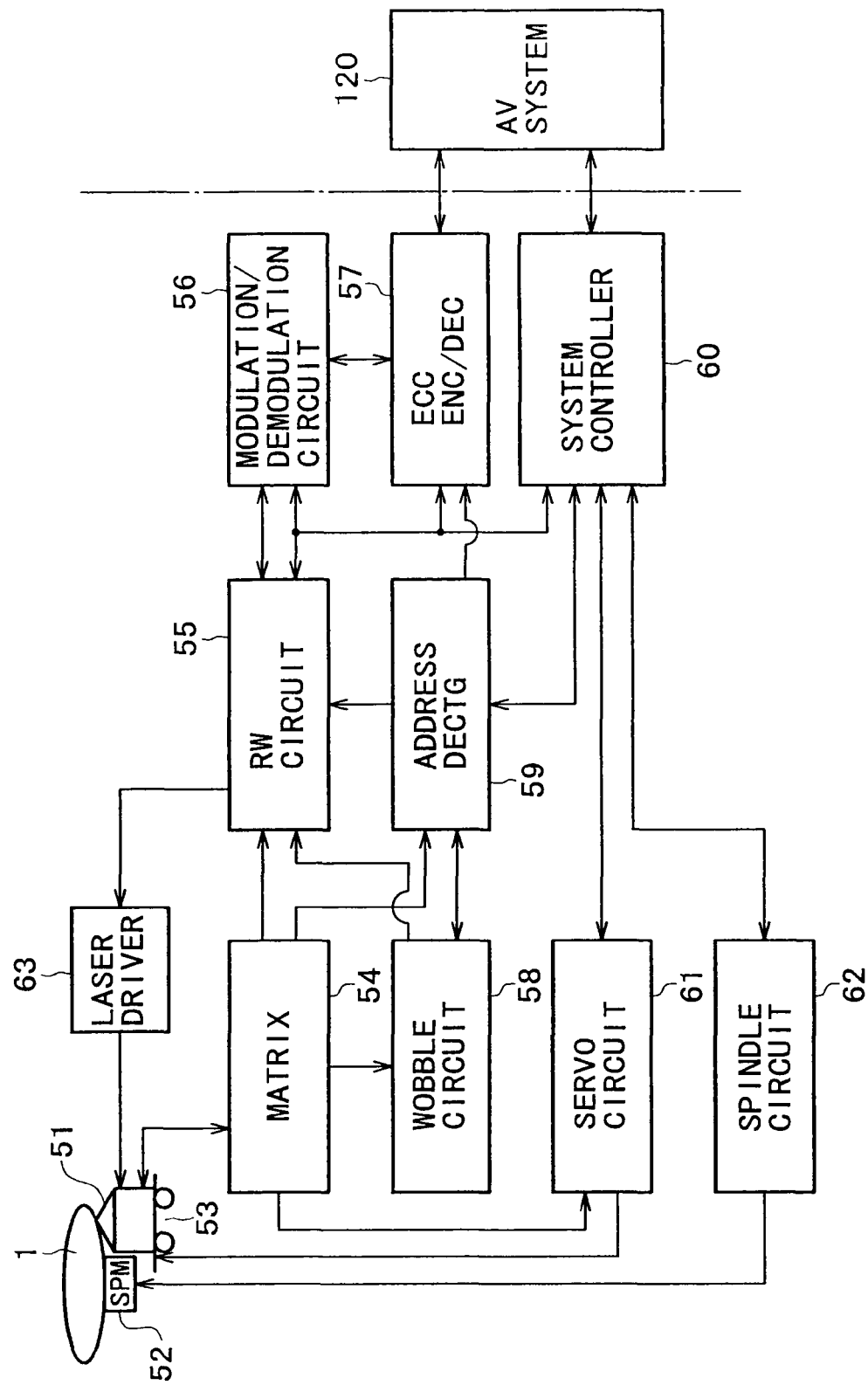
FIG. 38 is a block diagram of a disk drive apparatus of the embodiment.

FIG. 38 shows a configuration of the disk drive apparatus.

The disk 1 is placed onto a turntable not shown and is driven to rotate at a constant linear velocity (CLV) by a spindle motor 52 upon recording/reproduction operation.

Then, ADIP information (address and disk information) embedded as wobbling of groove tracks in the RW zone on the disk 1 is read out by an optical pickup (optical head) 51. Further, prerecorded information embedded as wobbling of groove tracks in the PB zone is read out.

Further, upon recording, user data is recorded as phase change marks on a track in the RW zone by the optical pickup, but upon reproduction, the recorded phase change marks are read out by the optical pickup.

In the optical pickup 51, a laser diode serving as a laser light source, a photodetector for detecting reflected light, an objective lens serving as an output end of the laser light, and an optical system (not shown) for illuminating the laser light upon a disk recording face through the objective lens and introducing the reflected light from the disk recording face to the photodetector are formed.

The laser diode outputs a blue laser beam of a wavelength of 405 nm. The NA by the optical system is 0.85.

In the pickup 51, the objective lens is supported for movement in a tracking direction and a focusing direction by a two-axis mechanism.

Further, the entire pickup 51 is supported for movement in a disk radius direction by a thread mechanism 53.

The laser diode in the pickup 51 is driven with a drive signal (drive current) from a laser driver 63 to emit laser light.

Reflected light information from the disk 1 is detected and converted into an electric signal corresponding to an amount of received light by the photodetector and is supplied as the electric signal to a matrix circuit 54.

The matrix circuit 54 includes a plural number of current to voltage conversion circuits, matrix operation/amplification circuits and so forth corresponding to output current from a plurality of light reception elements of the photodetector. The matrix circuit 54 thus generates necessary signals through a matrix operation process.

For example, the matrix circuit 54 generates a high frequency signal (reproduction data signal) corresponding to reproduction data, a focusing error signal and a tracking error signal for servo control, and so forth.

Furthermore, the matrix circuit 54 generates a push-pull signal as a signal relating to wobbling of a groove, that is, as a signal for detecting wobbling.

The reproduction data signal outputted from the matrix circuit 54 is supplied to a reader/writer circuit 55 while the focusing error signal and the tracking error signal are supplied to a servo circuit 61, and the push-pull signal is supplied to a wobble circuit 58.

The reader/writer circuit 55 performs a binarization process, a reproduction clock production process by a PLL and so forth for the reproduction data signal to reproduce data read out from phase change marks and supplies the generated data to a modulation/demodulation circuit 56.

The modulation/demodulation circuit 56 includes a functioning section as a decoder upon reproduction and another functioning section as an encoder upon recording.

Upon reproduction, the modulation/demodulation circuit 56 performs a demodulation process of a runlength limited code based on a reproduction clock as a decoding processing.

An ECC encoder/decoder 57 performs an ECC encoding process for adding an error correction code upon recording and an ECC decoding process for performing error correction upon reproduction.

Upon reproduction, the ECC encoder/decoder 57 fetches data demodulated by the modulation/demodulation circuit 56 into an internal memory and performs an error detection/correction process, a deinterleaving process and so forth to obtain reproduction data.

The ECC encoding process and the ECC decoding process by the ECC encoder/decoder 57 are processes ready for the ECC format wherein the RS(248, 216, 33), that is, the RS (Reed Solomon) code of the code length 248, data 216 and distance 33, is used.

Data decoded up to reproduction data by the ECC encoder/decoder 57 is read out based on an instruction of a system controller 60 and transferred to an AV (Audio-Visual) system 120.

The push-pull signal outputted as a signal relating to wobbling of the groove from the matrix circuit 54 is processed by the wobble circuit 58. The push-pull signal as ADIP information is MSK demodulated and HMW demodulated into a data stream which represents ADIP addresses by the wobble circuit 58 and is supplied to an address decoder 59.

The address decoder 59 performs decoding of the data supplied thereto to obtain an address value and supplies the address value to the system controller 60.

Further, the address decoder 59 performs a PLL process using the wobble signal supplied thereto from the wobble circuit 58 to generate a clock and supplies the clock as an encoding clock, for example, upon recording to the pertaining sections.

The wobble circuit 58 and the address decoder 59 have, for example, a configuration described hereinabove with reference to FIG. 31.

The address decoder 59 performs an error correction process using the nibble based Reed Solomon code RS(15, 9, 7) corresponding to the ECC format shown in FIG. 30.

The address value supplied to the system controller 60 as described above has undergone the error correction process.

Meanwhile, the disk information recorded using AUX data is extracted 12 bits by 12 bits from 1 ECC block (ADIP word) by the address decoder 59 and supplied to the ECC encoder/decoder 57.

The ECC encoder/decoder 57 adds dummy data of 104 bytes to 144 B of the 96 ADIP words shown in FIGS. 27A to 27C to generate 1 ECC codeword and performs ECC decoding using the RS(248, 216, 33), that is, the RS (Reed Solomon) code of the code length 248, data 216 and distance 33, to obtain error corrected disk information which can be supplied to the system controller 60.

Meanwhile, the push-pull signal outputted as a signal relating to wobbling of the groove from the matrix circuit 54, that is, a push-pull signal as the prerecorded information from the PB zone, undergoes a bandpass filter process by the wobble circuit 58 and is supplied to the reader/writer circuit 55. Then, the push-pull signal is binarized and converted into a data bit stream similarly as in the case of phase change marks, and is then ECC decoded and deinterleaved by the ECC encoder/decoder 57 to extract data of the prerecorded information. The extracted prerecorded information is supplied to the system controller 60.

The system controller 60 can perform various setting processes, a copy protection process and so forth based on the read out prerecorded information.

Upon recording, recording data is transferred from the AV system 120 to the disk drive apparatus. The recording data is sent to and buffered into a memory of the ECC encoder/decoder 57.

In this instance, the ECC encoder/decoder 57 performs addition of error correction codes, interleave and addition of subcodes and so forth as an encoding process of the buffered recording data.

Further, the ECC encoded data is modulated in accordance with the RLL(1-7) PP method by the modulation/demodulation circuit 56 and then supplied to the reader/writer circuit 55.

As an encoding clock which is used as a reference clock for such encoding processes upon recording, the clock generated from the wobble signal as described above is used.

The recording data generated by the encoding process is subject to fine adjustment of an optimum recording power, adjustment of a laser drive pulse waveform and so forth suitable for a characteristic of the recording layer, the spot shape of a laser beam, a recording linear speed and so forth as recording compensation processing by the reader/writer circuit 55. Then, the recording data is sent as a laser drive pulse to the laser driver 63.

The laser driver 63 provides the laser drive pulse supplied thereto to the laser diode in the pickup 51 to drive the laser diode to emit laser light. As a result, a pit (phase change mark) corresponding to the recording data is formed on the disk 1.

It is to be noted that the laser driver 63 includes an APC circuit (Auto Power Control) and controls the laser diode so that the output power of the laser may be fixed independently of the temperature and so forth while monitoring the laser output power based on an output of a laser power monitoring detector provided in the optical pickup 51. Target values for the laser output power upon recording and upon reproduction are provided from the system controller 60, and upon recording and upon reproduction, the thread mechanism 53 controls the laser diode so that the laser output power level may have the target values, respectively.

The servo circuit 61 generates various servo drive signals for focusing, tracking and threading from the focusing error signal and the tracking error signal from the matrix circuit 54 so that servo operations may be executed.

In particular, the servo circuit 61 generates a focusing drive signal and a tracking drive signal based on the focusing error signal and the tracking error signal, respectively, and drives a focusing coil and a tracking coil of the two-axis mechanism in the optical pickup 51 with the focusing drive signal and the tracking drive signal, respectively. Consequently, a tracking servo loop and a focusing serve loop are formed from the pickup 51, matrix circuit 54, servo circuit 61 and two-axis mechanism.

Further, the servo circuit 61 turns off the tracking servo loop in accordance with a track jumping instruction from the system controller 60 and outputs a jumping drive signal so that a track jumping operation may be executed.

Furthermore, the servo circuit 61 generates a thread drive signal based on a thread error signal obtained as a low frequency component of the tracking error signal and access execution control and so forth from the system controller 60 to drive the thread mechanism 53. Though not shown, the thread mechanism 53 includes a mechanism formed from a main shaft for supporting the optical pickup 51, a thread motor, a transmission gear and so forth and drives the thread motor in accordance with the thread drive signal to perform a required sliding movement of the optical pickup 51.

A spindle servo circuit 62 performs control for rotating the spindle motor 52 at a CLV.

The spindle servo circuit 62 acquires the clock generated by a PLL process for the wobble signal as current rotational speed information of the spindle motor 52 and compares the rotational speed information with predetermined CLV reference speed information to generate a spindle error signal.

Upon data reproduction, since the reproduction clock (clock which makes a reference to a decoding process) generated by a PLL in the reader/writer circuit 55, the spindle servo circuit 62 can compare the reproduction clock with predetermined CLV reference speed information to generate a spindle error signal.

Then, the spindle servo circuit 62 outputs a spindle drive signal generated in response to the spindle error signal so as to execute CLV rotation of the spindle servo circuit 62.

Further, the spindle servo circuit 62 generates a spindle drive signal in accordance with a spindle kick/brake control signal from the system controller 60 so as to perform such operations as starting, stopping, acceleration and deceleration of the spindle motor 52.

Such various operations of the servo systems and recording and reproduction system as described above are controlled by the system controller 60 formed from a microcomputer.

The system controller 60 executes various processes in accordance with a command from the AV system 120.

For example, when a writing instruction (write command) is issued from the AV system 120, the system controller 60 causes the pickup 51 to move to an address that is to be written first. Then, the system controller 60 controls the ECC encoder/decoder 57 and the modulation/demodulation circuit 56 to execute an encoding process as described above for data (video data and/or audio data of the various types such as, for example, MPEG2 data and so forth) transferred thereto from the AV system 120. Then, a laser drive pulse is supplied from the reader/writer circuit 55 to the laser driver 63 as described above so that recording is executed.

Further, for example, if a read command for demanding transfer of certain data (MPEG2 video data or the like) recorded on the disk 1 is received from the AV system 120, then seek operation control is performed setting the designated address as an object. In particular, an instruction is issued to the servo circuit 61 first so that the servo circuit 61 executes an accessing operation of the pickup 51 setting an address designated by a seek command as a target.

Thereafter, operation control necessary to transfer data in the designated data section to the AV system 120 is performed. In particular, the system controller 60 first performs readout of data from the disk 1 and controls the reader/writer circuit 55, modulation/demodulation circuit 56 and ECC encoder/decoder 57 to perform decoding/buffering and so forth to transfer the demanded data.

It is to be noted that, upon recording or reproduction of data in the form of phase change marks, the system controller 60 performs control of accessing, recording and reproduction operations using an ADIP address detected by the wobble circuit 58 and address decoder 59.

Further, at a predetermined point of time such as when the disk 1 is loaded, the system controller 60 controls so as to execute readout of a unique ID recorded in the BCA of the disk 1 or of prerecorded information recorded as a wobbling groove in the prerecorded data zone PR.

In this instance, the system controller 60 performs seek operation control toward the BCA or the prerecorded zone PR first. In particular, the system controller 60 issues an instruction to the servo circuit 61 to execute an accessing operation of the pickup 51 to the innermost circumference side of the disk.

Thereafter, the system controller 60 controls the pickup 51 to execute reproduction tracing to obtain a push-pull signal as reflected light information and controls the wobble circuit 58, reader/writer circuit 55 and ECC encoder/decoder 57 to execute a decoding process to obtain reproduction data as BCA information or prerecorded information.

The system controller 60 performs a laser power setting process, a copy protect process and so forth based on the BCA information or the prerecorded information read out in this manner.

It is to be noted that, upon reproduction of prerecorded information, the system controller 60 performs control of an accessing or reproduction operation using address information included in a BIS cluster as the read out prerecorded information.

Further, after prerecorded information is read out, the disk information incorporated in and recorded together with the ADIP information in the section of the RW zone in the lead-in zone can be read out and used for a required process.

Incidentally, while the example of FIG. 38 is a disk drive apparatus connected to the AV system 120, the disk drive apparatus of the present embodiment may be connected, for example, to a personal computer or the like.

Furthermore, the apparatus of the present invention may be used also in a form wherein it is not connected to any other apparatus. In this instance, an operation section or a display section may be provided, or the configuration of an interface section for inputting and outputting data may be different from that of FIG. 38. In short, only it is necessary for the apparatus to perform recording or reproduction in response to an operation of a user and include a terminal section provided for inputting and outputting various data therethrough.

Naturally, various other configurations may be possible, and for example, the apparatus may be configured as an apparatus only for recording or an apparatus only for reproduction.

5. Disk Production Method

Subsequently, a production method of the disk 1 of the present embodiment described above is described.

The production process of a disk can be roughly divided into a mastering process and a disk formation process (replication process). The mastering process is a process until a metal master (stamper) to be used in the disk formation process is completed, and the disk formation process is a process of producing an optical disk of a replica of the stamper in a mass using the stamper.

More particularly, in the mastering process, so-called mastering wherein photo-resist is applied to a polished glass substrate and a pit or a groove is formed on the photosensitive film by exposure to a laser beam is performed.

In the case of the present example, mastering of a groove by wobbling based on prerecorded information is performed at a portion of the disk corresponding to the PB zone on the innermost circumference side, and mastering of a groove by wobbling based on ADIP address information and disk information is performed at a portion corresponding to the RW zone.

The prerecorded information and the disk information to be recorded are prepared in a preparation step called premastering.

Then, after the mastering comes to an end, predetermined processes such as development are performed, and then transfer of the information to the metal surface is performed, for example, by electroforming to generate a stamper necessary to perform replication of the disk.

Thereafter, the stamper is used to transfer the information to a resin substrate, for example, by an injection method or the like, and a reflection film is formed on the resin substrate, whereafter such a process as working of the resin substrate into a required disk form to complete a final product.

Figure 39:
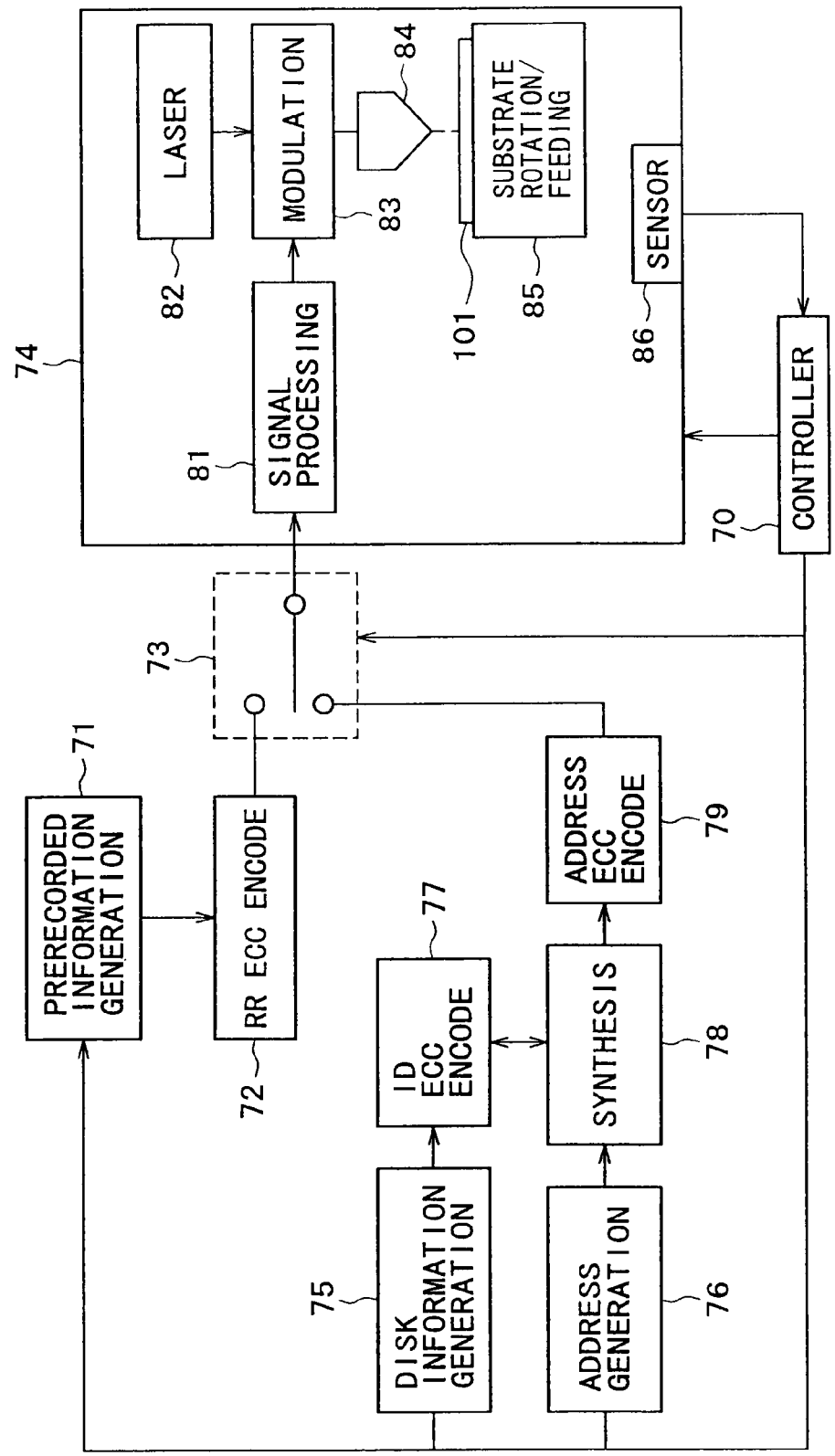
FIG. 39 is a block diagram of a mastering apparatus of the embodiment.

The mastering apparatus includes, for example, as shown in FIG. 39, a prerecorded information generation section 71, a prerecorded ECC encoding section 72, a changeover section 73, a mastering section 74, a disk information generation section 75, an address generation section 76, a disk information ECC encoding section 77, a synthesis section 78, an address ECC encoding section 79 and a controller 70.

The prerecorded information generation section 71 outputs prerecorded information prepared by the premastering step. The outputted prerecorded information is subject to an error correction coding process by the prerecorded ECC encoding section 72. For example, ECC encoding in which the RS(248, 216, 33), that is, the RS (Reed Solomon) code of the code length 248, data 216 and distance 33, is used may be performed similarly as in the case of the disk information.

The disk information generation section 75 generates information of 112 bytes of the contents described hereinabove with reference to FIG. 35. The generated disk information of 112 bytes is subject to addition of dummy data of 104 bytes thereto and ECC encoding by the RS(248, 216, 33) with a parity of 32 bytes, that is, the RS (Reed Solomon) code of the code length 248, data 216 and distance 33 as described hereinabove with reference to FIG. 37 by the disk information ECC encoding section 77.

The address generation section 76 successively outputs values of absolute addresses.

The synthesis section 78 synthesizes address values outputted from the address generation section 76 and the disk information which has been ECC encoded by the disk information ECC encoding section 77. In particular, the synthesis section 78 successively generates data of 9 nibbles (36 bits) of an ADIP word of the format of FIG. 30. In short, the synthesis section 78 incorporates the ECC encoded disk information as AUX data in the ADIP word. It is to be noted that the dummy data part illustrated in FIG. 37 having been added by the disk information ECC encoding section 77 may not be incorporated as AUX data.

Then, the address ECC encoding section 79 performs error correction coding using the nibble based Reed Solomon code RS(15, 9, 7) to form an ECC block of the format illustrated in FIG. 30.

The mastering section 74 includes an optical section (82, 83, 84) for illuminating a laser beam upon a glass substrate 101 having photo-resist applied thereto to perform mastering, a substrate rotation/feeding section 85 for driving the glass substrate 101 to rotate and slidably feeding the glass substrate 101, and a signal processing section 81 for converting input data into recording data and supplying the recording data to the optical section. The mastering section 74 further includes a sensor 86 for discriminating from the position of the substrate rotation/feeding section 85 in which one of the PB zone and the RW zone the mastering position is.

The optical section described above includes a laser light source 82 formed from, for example, a He—Cd laser, a modulation section 83 for modulating light emitted from the laser light source 82 based on recording data, and a mastering head part 84 for condensing and illuminating the modified beam from the modulation section 83 upon the photo-resist face of the glass substrate 101.

The modulation section 83 includes an acousto-optic type optical modulator (AOM) for turning on/off the light emitted from the laser light source 82, and an acousto-optic type optical deflector (AOD) for deflecting the light emitted from the laser light source 82 in accordance with a wobble production signal.

The substrate rotation/feeding section 85 includes a rotary motor for driving the glass substrate 101 to rotate, a detector (FG) for detecting the speed of rotation of the rotary motor, a slide motor for slidably moving the glass substrate 101 in a radial direction, and a servo controller for controlling the rotational speeds of the rotary motor and the slide motor, tracking of the mastering head part 84 and so forth.

The signal processing section 81 performs a modulation signal production process of performing predetermined operation processes, for example, for prerecorded information supplied thereto through the changeover section 73 and ADIP information including disk information and address information to form a modulation signal.

The signal processing section 81 performs also a driving process for driving the optical modulator and the optical deflector of the modulation section 83 in accordance with the modulation signal.

In the mastering section 74, upon mastering, the substrate rotation/feeding section 85 drives the glass substrate 101 to rotate at a constant linear velocity and slidably move the glass substrate 101 while the glass substrate 101 remains rotated so that spiral tracks may be formed in a predetermined track pitch.

Simultaneously, the light emitted from the laser light source 82 is converted into a modulated beam based on the modulation signal from the signal processing section 81 by the modulation section 83 and is illuminated upon the photo-resist face of the glass substrate 101 from the mastering head part 84. As a result, the photo-resist is sensitized based on the data or groove.

The controller 70 controls execution of operation of the mastering section 74 upon such mastering and controls the prerecorded information generation section 71, disk information generation section 75, address generation section 76 and changeover section 73 while supervising the signal from the sensor 86.

Upon starting of mastering, the controller 70 controls the substrate rotation/feeding section 85 to set the slidably moved position of the substrate rotation/feeding section 85 to its initial position so that the mastering head part 84 may start illumination of the laser beam upon the mastering section 74 from the innermost circumference side. Then, the controller 70 controls so as to start CLV rotational driving of the glass substrate 101 and slidable feeding of the glass substrate 101 for forming a groove of a track pitch of 0.35 μm.

In this state, the controller 70 controls the prerecorded information generation section 71 to output prerecorded information so that the prerecorded information may be supplied to the signal processing section 81 through the changeover section 73. Further, the controller 70 controls the laser light source 82 to start outputting of a laser beam, and the modulation section 83 modulates the laser beam in accordance with a modulation signal from the signal processing section 81, that is, an FM code modulation signal of the prerecorded information, to execute groove mastering on the glass substrate 101.

Consequently, mastering of such a groove as described hereinabove with reference to FIG. 14B is performed in a region corresponding to the PB zone.

Thereafter, when the controller 70 detects from the signal of the sensor 86 that the mastering operation has proceeded to a position corresponding to the terminal end of the PB zone, it changes over the changeover section 73 to the address ECC encoding section 79 side and instructs the address generation section 76 to successively output an address value. Further, the controller 70 instructs the disk information generation section 75 to generate disk information.

Further, the controller 70 controls the substrate rotation/feeding section 85 to lower the sliding feeding speed so that a groove having a track pitch of 0.32 μm may be formed.

Consequently, ADIP information including the address information and the disk information is supplied from the address ECC encoding section 79 to the signal processing section 81 through the changeover section 73. Then, the laser light from the laser light source 82 is modulated with the modulation signal from the signal processing section 81, that is, based on MSK modulation and HMW modulation, by the modulation section 83, and groove mastering of the glass substrate 101 is executed with the modulated laser light.

Consequently, mastering of such a groove as described hereinabove with reference to FIG. 14A is performed for a region corresponding to the RW zone.

The controller 70 ends the mastering operation if it detects from a signal of the sensor 86 that the mastering operation reaches the terminal end of the lead-out zone.

Through such operations as described above, light exposure parts corresponding to the wobbling groove as the PB zone and the RW zone are formed on the glass substrate 101.

Thereafter, development, electroforming and so forth are performed to generate a stamper, and the disk 1 described hereinabove is produced using the stamper.

The produced disk 1 is a disk wherein the ADIP information including the disk information is recorded in the form of a wobbling groove in the RW zone as described hereinabove.

While the disk of the embodiment and the disk drive apparatus and the disk production method for the disk have been described above, the present invention is not limited to them, but various modifications can be made within the scope of the present invention.

While, in the example described above, user data is recorded as phase change marks, the recording method for user data may be any rewritable or write-once-read-many method. For example, the present invention can be applied also to a disk or a disk drive apparatus ready for a recording method such as, for example, a photo-electric recording method or a pigment changing method.

As can be recognized from the foregoing description, the disk recording medium of the present invention or a disk recording medium produced by the disk production method of the present invention is configured such that the disk recording medium has a recording and reproduction region into and from which first data can be recorded and reproduced in accordance with a rewritable or write-once-read-many recording method and from which second data recorded in the form of wobbling of a groove can be reproduced, and that the second data includes address information and additional information and the additional information is coded in accordance with a first error correction method, and the coded additional information and the address information are recorded in a state coded in accordance with a second error correction method.

Thus, since additional information such as properties of the disk is recorded in the form of a wobbling groove together with address information and recording in the form of emboss pits is not used, good recording of the additional information can be executed for a high density disk. Further, since the additional information is error correction coded dually in accordance with the first and second error correction methods, the reliability thereof as information is very high.

Further, since the first error correction method used for the additional information is same as that used for the first data which is principal data, an error correction code adopted for principal data and having a very high correction capability can be used as the first error correction method, and the reliability of the additional information can be improved. Furthermore, in the disk drive apparatus, an error correction encoding/decoding section ready for the first error correction method can be used so to function as an error correction decoding section (additional information decoding means) for the additional information and further as an error correction encoding/decoding section for the first data to be recorded and reproduced. In other fords, the hardware for performing the error correction/coding processes can be used commonly, and simplification in configuration and reduction in cost can be anticipated.

Further, since the additional information to be recorded on the disk recording medium adds, to the additional information of a unit of m smaller than a code length n in error correction coding of the first data, m-n dummy data to perform error correction coding for the data having a code length equal to n, an error correction method similar to that used for the first data can be used for the additional information. Further, since the dummy data is added upon error correction coding and error correction decoding, the number of symbols to be recorded onto the disk recording medium can be reduced. Consequently, the recording linear density can be increased and the reliability can be raised. Further, the capacity for recording can be increased.

From the foregoing, the present invention can achieve a significant effect that it is preferable for a disk recording medium of a large capacity and also the performance in recording and reproduction operation of a disk drive apparatus can be improved.

The invention claimed is:

1. A disk recording medium comprising:
a recording and reproduction region into and from which first data can be recorded and reproduced in accordance with a rewritable or write-once-read-many recording method, the first data coded in accordance with a first error correction code, and from which second data recorded in the form of wobbling of a groove can be reproduced,
wherein the second data includes additional information and dummy data, and the additional information is coded in accordance with the first error correction method, and the coded additional information with the added dummy data are recorded in a state coded in accordance with a second error correction method, and
wherein the additional information with the added dummy data is error correction coded such that, to the additional information of a unit of m smaller than a code length n in error correction coding of the first data, m-n of the dummy data are added so as to have a code length equal to n.

2. A disk recording medium comprising:
a recording and reproduction region into and from which first data can be recorded and reproduced in accordance with a rewritable or write-once-read-many recording method, the first data coded in accordance with a first error correction code, and from which second data recorded in the form of wobbling of a groove can be reproduced,
wherein the second data includes additional information and dummy data, and the additional information is coded in accordance with the first error correction method, and the coded additional information with the added dummy data are recorded in a state coded in accordance with a second error correction method,
wherein the additional information is recorded at least in a lead-in zone in the recording and reproduction region, and
wherein the additional information with the added dummy data is error correction coded such that, to the additional information of a unit of m smaller than a code length n in error correction coding of the first data, m-n of the dummy data are added so as to have a code length equal to n.

3. A disk production method for a disk recording medium having a recording and reproduction region into and from which first data is to be recorded and reproduced in accordance with a rewritable or write-once-read-many recording method, the first data coded in accordance with a first error correction code, said disk production method comprising:
generating second data by coding additional information in accordance with the first error correction method and coding the coded additional information with added dummy data in accordance with a second error correction method; and
forming the recording and reproduction region by spirally forming a groove wobbled based on the second data,
wherein the additional information with the added dummy data is error correction coded such that, to the additional information of a unit of m smaller than a code length n in error correction coding of the first data, m-n of the dummy data are added so as to have a code length equal to n.

4. A disk production method for a disk recording medium having a recording and reproduction region into and from which first data is to be recorded and reproduced in accordance with a rewritable or write-once-read-many recording method, the first data coded in accordance with a first error correction code, said disk production method comprising:
generating second data by coding additional information in accordance with the first error correction method and coding the coded additional information with added dummy data in accordance with a second error correction method; and
forming the recording and reproduction region by spirally forming a groove wobbled based on the second data,
wherein the additional information is recorded at least in a lead-in zone in the recording and reproduction region, and
wherein the additional information with the added dummy data is error correction coded such that, to the additional information of a unit of m smaller than a code length n in error correction coding of the first data, m-n of the dummy data are added so as to have a code length equal to n.

5. A disk drive apparatus which performs recording or reproduction onto or from a disk recording medium which has a recording and reproduction region into and from which first data can be recorded and reproduced in accordance with a rewritable or write-once-read-many recording method, the first data coded in accordance with a first error correction code, and from which second data recorded in the form of wobbling of a groove can be reproduced, the second data including address information and dummy data, the additional information being coded in accordance with the first error correction method, the coded additional information with the dummy data being recorded in a state coded in accordance with a second error correction method, said disk drive apparatus comprising:
readout means for reading out the second data from the wobbled groove of the disk recording medium;
decoding means for performing error correction decoding in accordance with the second error correction method for the second data read out by said readout means to obtain the additional information coded in accordance with the first error correction method; and
additional information decoding means for performing error correction decoding in accordance with the first error correction method for the additional information coded in accordance with the first error correction method and obtained by said decoding means,
wherein the first error correction method is same as the error correction method used for the first data, and said additional information decoding means further performs error correction decoding and error correction coding for the first data, and
wherein the additional information with the added dummy data is error correction coded such that, to the additional information of a unit of m smaller than a code length n in error correction coding of the first data, m-n of the dummy data are added so as to have a code length equal to n.

6. A disk drive apparatus which performs recording or reproduction onto or from a disk recording medium which has a recording and reproduction region into and from which first data can be recorded and reproduced in accordance with a rewritable or write-once-read-many recording method, the first data coded in accordance with a first error correction code, and from which second data recorded in the form of wobbling of a groove can be reproduced, the second data including address information and dummy data, the additional information being coded in accordance with the first error correction method, the coded additional information with the dummy data being recorded in a state coded in accordance with a second error correction method, said disk drive apparatus comprising:

> readout means for reading out the second data from the wobbled groove of the disk recording medium;
>
> decoding means for performing error correction decoding in accordance with the second error correction method for the second data read out by said readout means to obtain the additional information coded in accordance with the first error correction method; and
>
> additional information decoding means for performing error correction decoding in accordance with the first error correction method for the additional information coded in accordance with the first error correction method and obtained by said decoding means,
>
> wherein the additional information is obtained from the second data read out from a lead-in zone in the recording and reproduction region by said readout means, and
>
> wherein the additional information with the added dummy data is error correction coded such that, to the additional information of a unit of m smaller than a code length n in error correction coding of the first data, m-n of the dummy data are added so as to have a code length equal to n.

* * * * *